United States Patent
Tang et al.

(10) Patent No.: US 12,136,636 B2
(45) Date of Patent: *Nov. 5, 2024

(54) IMAGE SENSOR, CAMERA ASSEMBLY AND MOBILE TERMINAL

(71) Applicant: GUANGDONG OPPO MOBILE TELECOMMUNICATIONS CORP., LTD., Dongguan (CN)

(72) Inventors: Cheng Tang, Dongguan (CN); Gong Zhang, Dongguan (CN); Xin Yang, Dongguan (CN); Rui Xu, Dongguan (CN); Wentao Wang, Dongguan (CN); He Lan, Dongguan (CN); Jianbo Sun, Dongguan (CN); Xiaotao Li, Dongguan (CN); Haiyu Zhang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 29 days.

This patent is subject to a terminal disclaimer.

(21) Appl. No.: 17/696,774

(22) Filed: Mar. 16, 2022

(65) Prior Publication Data

US 2022/0336508 A1  Oct. 20, 2022

Related U.S. Application Data

(63) Continuation of application No. PCT/CN2019/109518, filed on Sep. 30, 2019.

(51) Int. Cl.
*H01L 27/146* (2006.01)
*H04N 25/13* (2023.01)
*H04N 25/133* (2023.01)

(52) U.S. Cl.
CPC .. *H01L 27/14621* (2013.01); *H01L 27/14627* (2013.01); *H04N 25/133* (2023.01); *H04N 25/135* (2023.01)

(58) Field of Classification Search
CPC ......... H01L 27/14621; H01L 27/14627; H01L 27/14629; H01L 27/1462; H04N 25/133;
(Continued)

(56) References Cited

U.S. PATENT DOCUMENTS 6,714,243 B1 * 3/2004 Mathur ............. H01L 27/14645
                                                    348/E9.01
8,866,944 B2 * 10/2014 Tu ........................ H04N 23/843
                                                    348/278
(Continued)

FOREIGN PATENT DOCUMENTS

CN         1574377 A     2/2005
CN       101068313 A    11/2007
(Continued)

OTHER PUBLICATIONS

International Search Report and the Written Opinion Dated Jun. 30, 2020 From the International Searching Authority Re. Application No. PCT/CN2019/109518.
(Continued)

*Primary Examiner* — Chiawei Chen
(74) *Attorney, Agent, or Firm* — Quarles & Brady LLP

(57) ABSTRACT

An image sensor (10), a camera assembly (40) and a mobile terminal (90) are disclosed. The image sensor (10) comprises panchromatic pixels and color pixels. The color pixels have the spectral response narrower than that of the panchromatic pixels, and the panchromatic pixels have the full-well capacity greater than that of the color pixels.

13 Claims, 30 Drawing Sheets

(58) Field of Classification Search
CPC .. H04N 25/135; H04N 23/667; H04N 25/534; H04N 25/585
See application file for complete search history.

(56) References Cited

U.S. PATENT DOCUMENTS

| | | | |
|---|---|---|---|
| 8,994,870 B2 * | 3/2015 | Imamura | G01C 11/00 348/340 |
| 9,219,893 B2 * | 12/2015 | Tu | H04N 23/843 |
| 2003/0168679 A1 | 9/2003 | Nakai | |
| 2007/0024879 A1 | 2/2007 | Hamilton, Jr. et al. | |
| 2007/0076269 A1 * | 4/2007 | Kido | H04N 25/534 348/E5.079 |
| 2008/0128598 A1 | 6/2008 | Kanai et al. | |
| 2009/0021629 A1 * | 1/2009 | Yamada | H01L 27/14687 348/E5.025 |
| 2009/0295973 A1 | 12/2009 | Oshikubo et al. | |
| 2010/0265370 A1 | 10/2010 | Kumar et al. | |
| 2011/0063467 A1 | 3/2011 | Tanaka | |
| 2011/0102651 A1 | 5/2011 | Tay | |
| 2011/0242350 A1 | 10/2011 | Sawayama | |
| 2011/0285886 A1 | 11/2011 | Kato et al. | |
| 2012/0200728 A1 | 8/2012 | Kobayashi | |
| 2012/0307104 A1 * | 12/2012 | Kanai | H01L 27/14627 348/E9.002 |
| 2014/0063300 A1 | 3/2014 | Lin et al. | |
| 2014/0084135 A1 * | 3/2014 | Chen | H04N 5/222 250/208.1 |
| 2015/0041939 A1 | 2/2015 | Kim | |
| 2015/0054997 A1 * | 2/2015 | Hynecek | H04N 25/134 257/292 |
| 2015/0350582 A1 * | 12/2015 | Korobov | H04N 25/75 348/302 |
| 2016/0071896 A1 | 3/2016 | Kawabata et al. | |
| 2016/0086990 A1 | 3/2016 | Liu et al. | |
| 2016/0198131 A1 | 7/2016 | Wang et al. | |
| 2016/0276394 A1 | 9/2016 | Chou | |
| 2018/0006078 A1 * | 1/2018 | Fereyre | H01L 27/14643 |
| 2018/0269245 A1 | 9/2018 | Mlinar | |
| 2018/0269249 A1 * | 9/2018 | Tsai | H01L 27/1461 |
| 2018/0367745 A1 | 12/2018 | Sugiyama | |
| 2019/0041559 A1 | 2/2019 | Higashitani et al. | |
| 2021/0074758 A1 | 3/2021 | Takahashi et al. | |
| 2021/0235027 A1 | 7/2021 | Meynants | |
| 2022/0130882 A1 | 4/2022 | Tang et al. | |
| 2022/0139974 A1 | 5/2022 | Tang et al. | |
| 2022/0139981 A1 | 5/2022 | Tang et al. | |
| 2022/0336508 A1 | 10/2022 | Tang et al. | |

FOREIGN PATENT DOCUMENTS

| | | |
|---|---|---|
| CN | 101233762 A | 7/2008 |
| CN | 101233763 A | 7/2008 |
| CN | 101753863 A | 6/2010 |
| CN | 102593138 A | 7/2012 |
| CN | 103137638 A | 6/2013 |
| CN | 103403869 A | 11/2013 |
| CN | 104135633 A | 11/2014 |
| CN | 105027558 A | 11/2015 |
| CN | 105990384 A | 10/2016 |
| CN | 107706200 A | 2/2018 |
| CN | 108091665 A | 5/2018 |
| CN | 108398847 A | 8/2018 |
| CN | 109003995 A | 12/2018 |
| CN | 109087926 A | 12/2018 |
| CN | 109661727 A | 4/2019 |
| CN | 109728008 A | 5/2019 |
| CN | 209183547 U | 7/2019 |
| CN | 110190075 A | 8/2019 |
| CN | 110649056 A | 1/2020 |
| CN | 110649057 A | 1/2020 |
| EP | 23754482 A2 | 10/2011 |
| JP | 2009081169 A | 4/2009 |
| KR | 20040060508 A | 7/2004 |

OTHER PUBLICATIONS

International Search Report and the Written Opinion Dated Aug. 22, 2022 From the European patent Application No. 19948199.5.
European Search Report Dated Feb. 16, 2023. From the European patent Application No. 19948199.5.
The Examination Report dated Jan. 29, 2024 from European patent application No. 19948199.5.
The Requirement for Restriction/Election dated May 22, 2024 from U.S. Appl. No. 17/575,298.
The Non-Final Rejection dated Jun. 24, 2024 from U.S. Appl. No. 17/573,561.
The supplementary European search report dated Sep. 2, 2022 from European patent application No. 20871224.0.
The Examination report dated Apr. 22, 2024 from European patent application No. 20871224.0.
The Notice of priority examination from Chinese patent application No. 201910941638.8.
The First Office Action dated Oct. 28, 2020 from Chinese patent application No. 201910941638.8.
The Notice of Allowance dated Nov. 25, 2020 from Chinese patent application No. 201910941638.8.
The International Search Report dated Dec. 14, 2020 from the International Searching Authority from Application No. PCT/CN2020/114483.
The supplementary European search report dated Sep. 2, 2022 from European patent application No. 19948034.4.
The Examination report dated May 2, 2024 from European patent application No. 19948034.4.
The International Search Report dated Jun. 30, 2020 from the International Searching Authority from Application No. PCT/CN2019/109516.
The International Search Report dated Jun. 30, 2020 from the International Searching Authority from Application No. PCT/CN2019/109517.
The supplementary European search report dated May 13, 2022 from European patent application No. 19947867.8.
The Examination report dated Jul. 25, 2023 from European patent application No. 19947867.8.
The partial European search report dated Apr. 25, 2022 from European patent application No. 19948034.4.
The Non-Final Rejection dated Aug. 8, 2024 from U.S. Appl. No. 17/572,948.

* cited by examiner

FIG. 29

FIG. 30

IMAGE SENSOR, CAMERA ASSEMBLY AND MOBILE TERMINAL

CROSS REFERENCE

This application is a continuation of International Application No. PCT/CN2019/109518, filed on Sep. 30, 2019.

BACKGROUND OF DISCLOSURE

Field of the Disclosure

The present disclosure relates to the technical field of images, and more specifically, to an image sensor, camera assembly, and mobile terminal.

Description of the Related Art

Mobile terminals such as mobile phones are often equipped with cameras to realize a function of photographing pictures. Image sensors are provided in a camera. In order to realize acquisition of color images, color pixels are usually arranged in the image sensors, and the color pixels are arranged in a Bayer array. In order to improve image quality of the image sensor in a dark environment, white pixels with a sensitivity higher than color pixels are added to the image sensor in the related art.

SUMMARY

The present disclosure provides an image sensor, a camera assembly, and a mobile terminal.

One aspect of the present disclosure provides an image sensor. The image sensor includes panchromatic pixels and color pixels. A spectral response of each of the color pixels is narrower than a spectral response of each of the panchromatic pixels, and a full-well capacity of each of the panchromatic pixels is greater than a full-well capacity of each of the color pixels.

In another aspect, the present disclosure also provides a camera assembly. The camera assembly includes an image sensor. The image sensor includes panchromatic pixels and color pixels. A spectral response of each of the color pixels is narrower than a spectral response of each of the panchromatic pixels, and a full-well capacity of each of the panchromatic pixels is greater than a full-well capacity of each of the color pixels.

In yet another aspect, the present disclosure also provides a mobile terminal. The mobile terminal includes a housing and an image sensor, and the image sensor is installed in the housing. The image sensor includes panchromatic pixels and color pixels. A spectral response of each of the color pixels is narrower than a spectral response of each of the panchromatic pixels, and a full-well capacity of each of the panchromatic pixels is greater than a full-well capacity of each of the color pixels.

Additional aspects and advantages of embodiments of the present disclosure will be set forth partly, and parts will become apparent from the following description, or learned from practice of the present disclosure.

BRIEF DESCRIPTION OF DRAWINGS

The above and/or additional aspects and advantages of the present disclosure will become apparent and readily understood from following description of embodiments in conjunction with the accompanying drawings, in which:

FIG. 29 is a schematic diagram of a pixel arrangement of another minimum duplication unit in an embodiment of the present disclosure;

FIG. 30 is a schematic diagram of a pixel arrangement of another minimum duplication unit in an embodiment of the present disclosure;

DETAILED DESCRIPTION OF EMBODIMENTS

Figure 1:
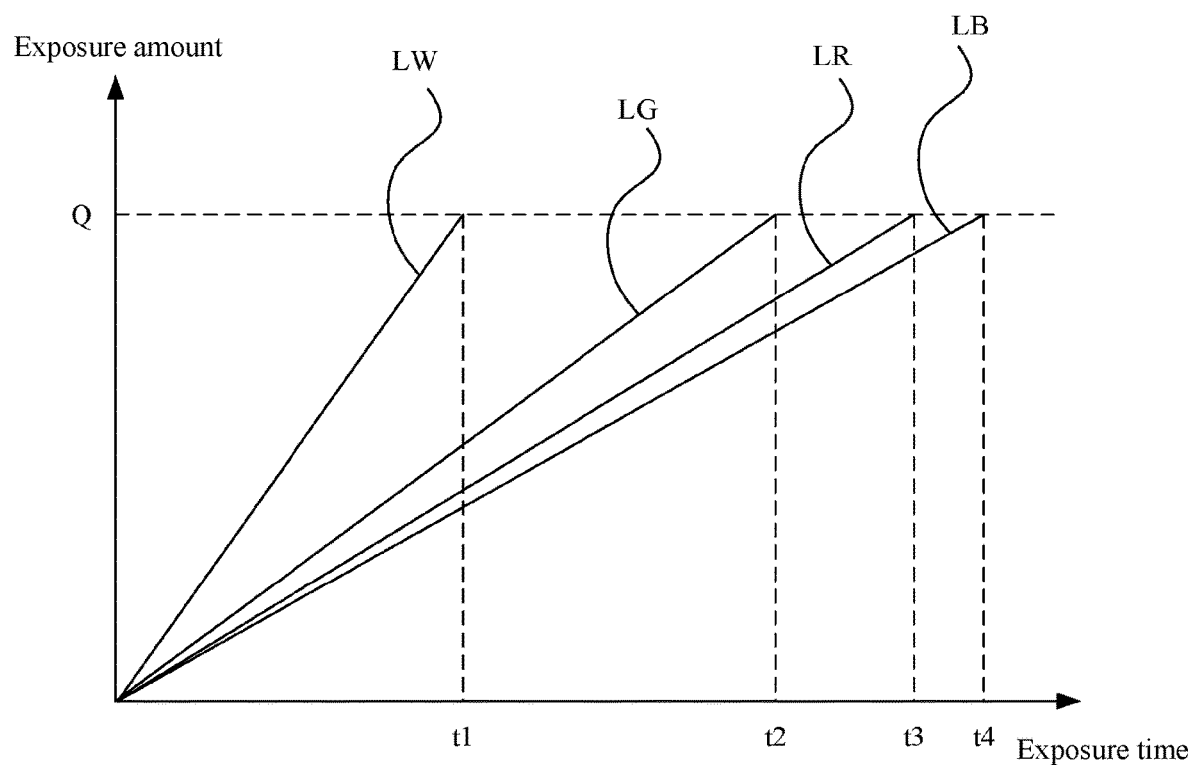
FIG. 1 is a schematic diagram of exposure saturation time for different color channels.

Embodiments of the present disclosure are described in detail below, examples of which are illustrated in the accompanying drawings, wherein the same or similar reference numerals refer to the same or similar elements or elements having the same or similar functions throughout. The embodiments described below with reference to the accompanying drawings are exemplary and are only used to explain the present disclosure, but should not be construed as a limitation on the present disclosure.

Figure 4A:
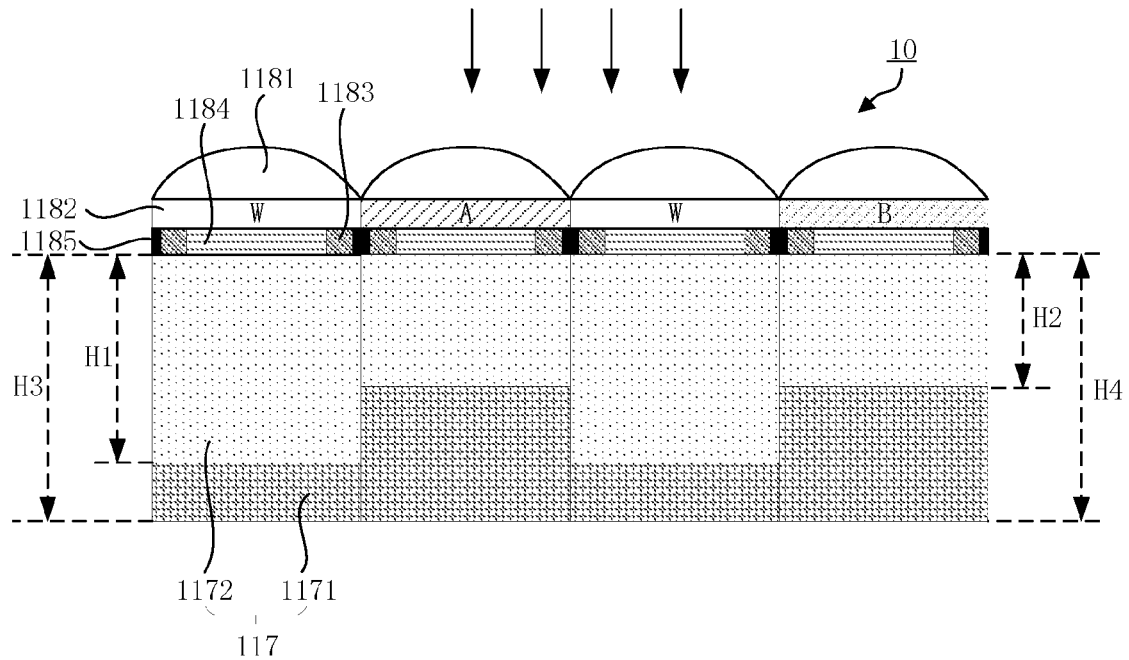
FIG. 4A is a schematic diagram of a partial cross-section of a pixel array in an embodiment of the present disclosure.

Referring to FIG. 4A, the present disclosure provides an image sensor 10. The image sensor 10 includes panchromatic pixels and color pixels. A spectral response of each of the color pixels is narrower than a spectral response of each of the panchromatic pixels, and a full-well capacity of each of the panchromatic pixels is greater than a full-well capacity of each of the color pixels.

Figure 33:
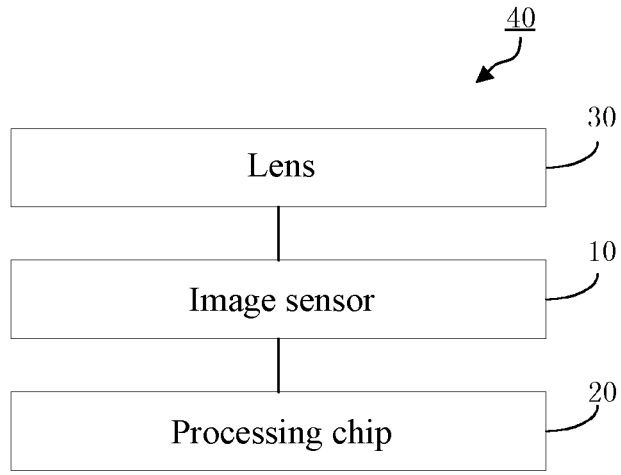
FIG. 33 is a schematic diagram of a camera assembly of an embodiment of the present disclosure.

Referring to FIG. 33, the present disclosure further provides a camera assembly 40. The camera assembly 40 includes an image sensor 10 and a processing chip 20. The image sensor 10 includes panchromatic pixels and color pixels. A spectral response of each of the color pixels is narrower than a spectral response of each of the panchromatic pixels, and a full-well capacity of each of the panchromatic pixels is greater than a full-well capacity of each of the color pixels. The color pixels and the panchromatic pixels form a two-dimensional pixel array. The two-dimensional pixel array includes minimum duplication units, wherein each of the minimum duplication units includes a plurality of sub-units, and each of the plurality of sub-units includes a plurality of monochromatic pixels and a plurality of panchromatic pixels. The image sensor 10 is used to be exposed to acquire a panchromatic raw image and a color raw image. The processing chip 20 is used to: process the color raw image to make all pixels of each of the plurality of sub-units be a monochromatic large pixel corresponding to monochrome in the sub-unit, and output pixel values of the monochromatic large pixels to obtain a color intermediate image; process the panchromatic raw image to obtain a panchromatic intermediate image; process the color intermediate image and/or the panchromatic intermediate image to obtain a target image.

Figure 47:
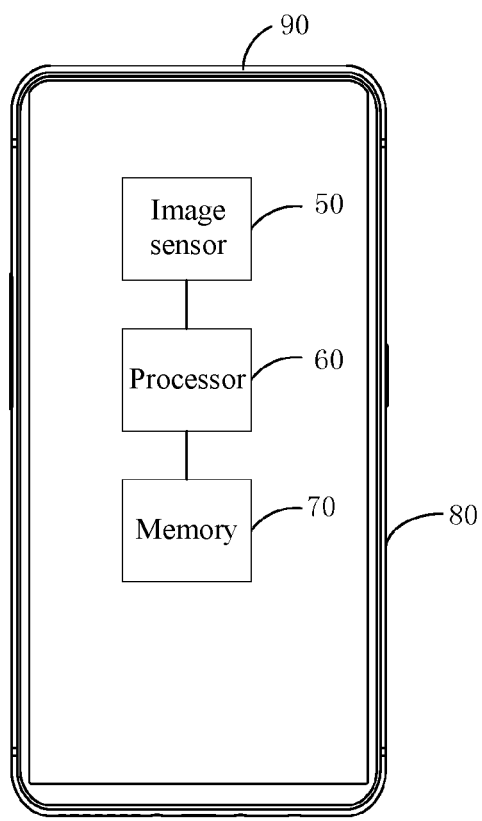
FIG. 47 is a schematic diagram of a mobile terminal of an embodiment of the present disclosure.

Please refer to FIG. 47, the present disclosure also provides a mobile terminal 90. The mobile terminal includes an image sensor 50 and a processor 60. The image sensor 50 includes panchromatic pixels and color pixels. A spectral response of each of the color pixels is narrower than a spectral response of each of the panchromatic pixels, and a full-well capacity of each of the panchromatic pixels is greater than a full-well capacity of each of the color pixels. The color pixels and the panchromatic pixels form a two-dimensional pixel array that includes minimum duplication units, wherein each of the minimum duplication units includes a plurality of sub-units, and each of the plurality of sub-units includes a plurality of monochromatic pixels and a plurality of panchromatic pixels. The image sensor 50 is used to be exposed to acquire a panchromatic raw image and a color raw image. The processor 60 is used to: process the color raw image to make all pixels of each of the plurality of sub-units be a monochromatic large pixel corresponding to monochrome in the sub-unit, and output pixel values of the monochromatic large pixels to obtain a color intermediate image; process the panchromatic raw image to obtain a panchromatic intermediate image; process the color intermediate image and/or the panchromatic intermediate image to obtain a target image.

The embodiments of the present disclosure will be further described with reference to the accompanying drawings as follows.

In a color image sensor, pixels of different colors receive different exposures per unit time, and after some colors are saturated, some colors are not exposed to an ideal state. For example, exposure to 60%-90% of the saturated exposure may have a better signal-to-noise ratio and accuracy, but the embodiments of the present disclosure are not limited to the description.

As shown in FIG. 1, four kinds of pixels, RGBW (red, green, blue, and panchrome), are taken as an example to illustrate. Referring to FIG. 1, in which a horizontal axis represents exposure time, a vertical axis represents an exposure amount, Q is a saturated exposure amount, LW is an exposure curve of the panchromatic pixel W, LG is an exposure curve of the green pixel G, LR is an exposure curve of the red pixel R, and LB is an exposure curve of the blue pixel.

It can be seen from FIG. 1, the exposure curve LW of the panchromatic pixel W has the largest slope. In other words, the panchromatic pixel W can obtain more exposure per unit time and reaches saturation at time t1. The slope of the exposure curve LG of the green pixel G is second, and the green pixel is saturated at time t2. The slope of the exposure curve LR of the red pixel R is third, and the red pixel is saturated at time t3. The exposure curve LB of the blue pixel B has the smallest slope, and the blue pixel is saturated at time t4. At time t1, the panchromatic pixel W has been saturated, and the exposure of the three pixels R, G, and B has not yet reached an ideal state.

In the related art, the exposure times for the four pixels R, G, B, and W are controlled together. For example, pixels in each row have the same exposure time, are connected to the same exposure control line, and are controlled by the same exposure control signal. For example, continue referring to FIG. 1, during a period of 0 to t1, all four kinds of pixels R, G, B, and W can work normally. However, in this period, R, G, and B are exposed in short exposure time to cause less exposure, resulting in low luminance and low signal to noise ratio, and even colors not vivid enough when an image is displayed. During a period of t1 to t4, the pixel in W is overexposed due to saturation and cannot work, and exposure data can no longer truly reflect a target.

Based on the above reasons, one aspect of the present disclosure provides an image sensor. By increasing the full-well capacity of each of the panchromatic pixels, the full-well capacity of each of the panchromatic pixels can be greater than the full-well capacity of each of the color pixels, thereby avoiding the panchromatic pixels from premature saturation. Thus, the exposure of panchromatic pixels W and color pixels (including but not limited to R, G, and B) can be balanced, thereby improving the quality of a photographed image.

It should be noted that the exposure curve in FIG. 1 is only an example, and the slopes and relative relationships of the curves will change according to different pixel response bands. The present disclosure is not limited to the situation shown in FIG. 1. For example, when the wavelength band of a response of the red pixel R is relatively narrow, the slope of the exposure curve of the red pixel R may be lower than the slope of the exposure curve of the blue pixel B.

Next, a basic structure of the image sensor 10 will be described first. Please refer to FIG. 2, which is a schematic diagram of the image sensor 10 in the embodiment of the present disclosure. The image sensor 10 includes a pixel array 11, a vertical driving unit 12, a control unit 13, a column processing unit 14, and a horizontal driving unit 15.

For example, the image sensor 10 may use complementary metal-oxide-semiconductor (CMOS) photosensitive elements or charge-coupled device (CCD) photosensitive elements.

Figure 2:
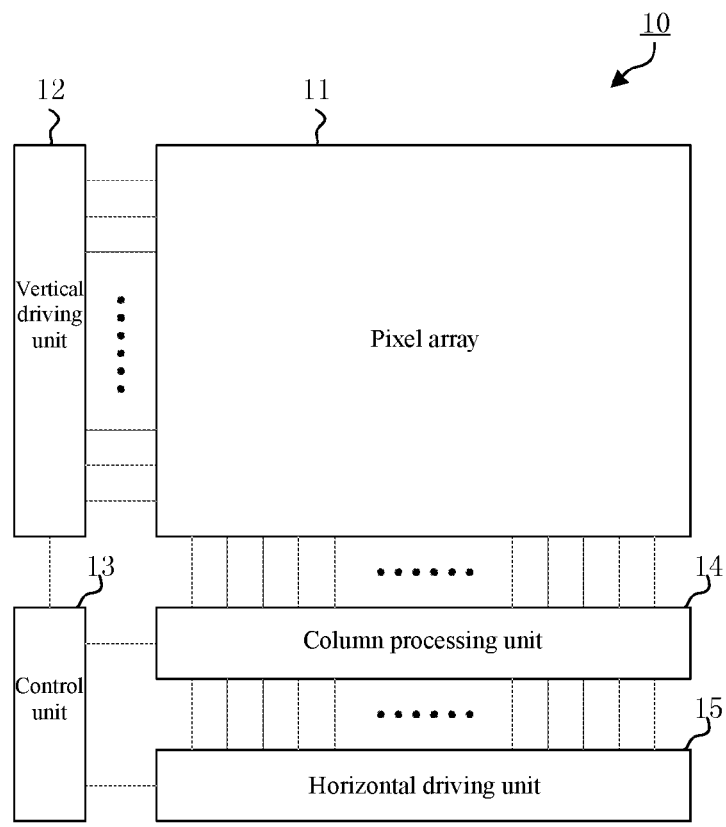
FIG. 2 is a schematic diagram of an image sensor in an embodiment of the present disclosure.
Figure 3:
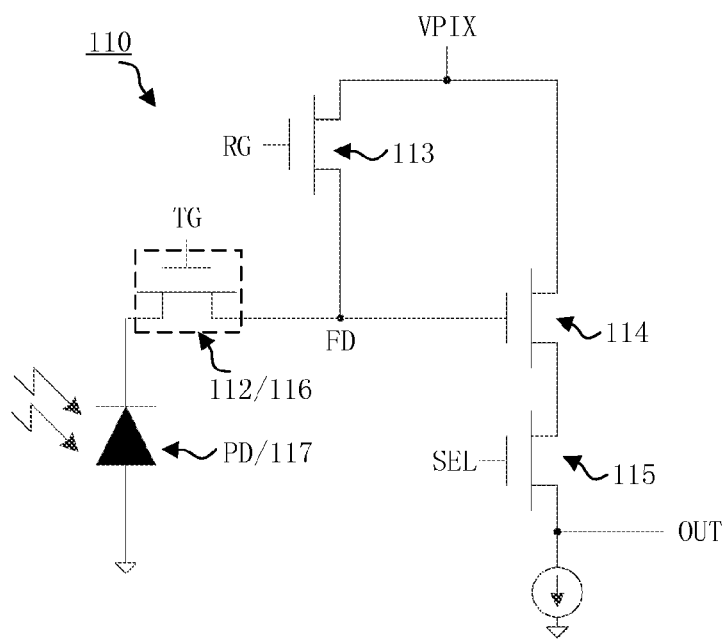
FIG. 3 is a schematic diagram of a pixel circuit in an embodiment of the present disclosure.

For example, the pixel array 11 includes a plurality of pixels (not shown in FIG. 2) two-dimensionally arranged in an array, and each pixel includes a photoelectric conversion element 117 (shown in FIG. 3). Each pixel converts light into electric charge according to intensity of the light incident on it.

For example, the vertical driving unit 12 includes shift registers and an address decoder. The vertical driving unit 12 includes readout-scan and reset-scan functions. The readout-scan function refers to sequentially scanning unit pixels row by row, and reading signals row by row from these unit pixels. For example, a signal outputted by each pixel in a selected-and-scanned row of pixels is transmitted to the column processing unit 14. The reset-scan function is used to reset electric charges, wherein photo charges of the photoelectric conversion element 117 are discarded, so that an accumulation of new photo charges can be started.

For example, signal processing performed by the column processing unit 14 is correlated double sampling (CDS) processing. In the CDS processing, a reset level and a signal level output from each pixel in the selected row of pixels are taken out, and a level difference is calculated. Thus, signals of the pixels in one row are obtained. The column processing unit 14 may have an analog-to-digital (A/D) conversion function for converting an analog pixel signal into a digital format.

For example, the horizontal driving unit 15 includes shift registers and an address decoder. The horizontal driving unit 15 sequentially scans the pixel array 11 column by column. By a selective scanning operation performed by the horizontal driving unit 15, each column of pixels is sequentially processed by the column processing unit 14 and sequentially outputted.

For example, the control unit 13 configures timing signals according to an operation mode and uses various timing signals to control the vertical driving unit 13, the column processing unit 14, and the horizontal driving unit 15 to work cooperatively.

FIG. 3 is a schematic diagram of a pixel circuit 110 in an embodiment of the present disclosure. The pixel circuit 110 in FIG. 3 is applied to each pixel in FIG. 2. A working principle of the pixel circuit 110 will be described below with reference to FIGS. 2 and 3.

As shown in FIG. 3, the pixel circuit 110 includes a photoelectric conversion element 117 (e.g., a photodiode PD), an exposure control circuit 116 (e.g., a transfer transistor 112), a reset circuit (e.g., a reset transistor 113), an amplifying circuit (e.g., an amplification transistor 114), and a selection circuit (e.g., a selection transistor 115). In the embodiment of the present disclosure, the transfer transistor 112, the reset transistor 113, the amplification transistor 114, and the selection transistor 115 are, for example, MOS transistors, but are not limited to the description.

For example, referring to FIGS. 2 and 3, a gate TG of the transfer transistor 112 is connected to the vertical driving unit 12 via an exposure control line (not shown in the figure); a gate RG of the reset transistor 113 is connected to the vertical driving unit 12 via a reset control line (not shown in the figure); a gate SEL of the selection transistor 114 is connected to the vertical driving unit 12 via a selection line (not shown in the figure). The exposure control circuit 116 (e.g., the transfer transistor 112) in each pixel circuit 110 is electrically connected to the photoelectric conversion element 117 for transferring the electric potential accumulated by the photoelectric conversion element 117 after being illuminated. For example, the photoelectric conversion element 117 includes the photodiode PD, wherein an anode of the photodiode PD is, for example, connected to the ground. The photodiode PD converts received light into electric charges. A cathode of the photodiode PD is connected to a floating diffusion unit FD via the exposure control circuit 116 (e.g., the transfer transistor 112). The floating diffusion unit FD is connected to a gate of the amplifier transistor 114 and a source of the reset transistor 113.

For example, the exposure control circuit 116 is the transfer transistor 112, wherein a control terminal TG of the exposure control circuit 116 is the gate of the transfer transistor 112. When a pulse of an active level (e.g., a VPIX level) is transmitted to the gate of the transfer transistor 112 via the exposure control line (not shown in the figure), the transfer transistor 112 is turned on. The transfer transistor 112 transfers charges that are photoelectrically converted by the photodiode PD to the floating diffusion unit FD.

For example, a drain of the reset transistor 113 is connected to a pixel power supply VPIX. The source of the reset transistor 113 is connected to the floating diffusion unit FD. Before charges are transferred from the photodiode PD to the floating diffusion unit FD, a pulse with an effective reset level is transmitted to the gate of the reset transistor 113 via the reset line, and the reset transistor 113 is turned on. The reset transistor 113 resets the floating diffusion unit FD to the pixel power supply VPIX.

For example, the gate of the amplification transistor 114 is connected to the floating diffusion unit FD. A drain of the amplification transistor 114 is connected to the pixel power supply VPIX. After the floating diffusion unit FD is reset by the reset transistor 113, the amplification transistor 114 outputs the reset level through the output terminal OUT via the selection transistor 115. After the charge of the photodiode PD is transferred by the transfer transistor 112, the amplification transistor 114 outputs the signal level through the output terminal OUT via the selection transistor 115.

For example, a drain of the selection transistor 115 is connected to a source of the amplification transistor 114. A source of the selection transistor 115 is connected to the column processing unit 14 in FIG. 2 via the output terminal OUT. When the pulse with the active level is transmitted to the gate of the selection transistor 115 via the selection line, the selection transistor 115 is turned on. The signal output by the amplification transistor 114 is transmitted to the column processing unit 14 via the selection transistor 115.

It should be noted that the pixel structure of the pixel circuit 110 in the embodiment of the present disclosure is not limited to a structure shown in FIG. 3. For example, the pixel circuit 110 may have a tri-transistor pixel structure in which functions of the amplification transistor 114 and the selection transistor 115 are completed by one transistor. For example, the exposure control circuit 116 is not limited to a single transfer transistor 112. Other electronic devices or structures with a control terminal capable of conduction control can be used as the exposure control circuit in the embodiments of the present disclosure. Implementation of the single transfer transistor 112 is simple, low cost, and easy to control.

FIGS. 4A to 13C show various schematic cross-sectional views of some pixels in the pixel array 11 of FIG. 2 taken along a light-receiving direction of the image sensor 10, and schematic diagrams of arrangements of the photoelectric conversion elements 117 (or optical filters 1182) in the pixel array 11. The panchromatic pixels and the color pixels are spaced from each other, wherein the spectral response of each of the color pixels is narrower than the spectral response of each of the panchromatic pixels. Each of the panchromatic pixels and each of the color pixels includes a microlens 1181, an optical filter 1182, an isolation layer 1183, and a photoelectric conversion element 117. In the light-receiving direction of the image sensor 10, the microlens 1181, the optical filter 1182, the isolation layer 1183, and the photoelectric conversion element 117 are arranged in sequence. The photoelectric conversion element 117 can convert the received light into electric charges. Specifically, the photoelectric conversion element 117 includes a substrate 1171 and an n-well layer 1172 formed inside the substrate 1171, wherein the n-well layer 1172 can realize a light-to-charge conversion. The isolation layer 1183 is arranged on a surface of the photoelectric conversion element 117 (specifically, a surface of the substrate 1171). Because the substrate 1171 is not completely flat, it is difficult to directly arrange the optical filter 1182 on the surface of the substrate 1171. The isolation layer 1183 is disposed on one surface of the substrate 1171, wherein a surface of the isolation layer 1183 away from the surface of the substrate 1171 has a higher flatness, which is convenient for the optical filter 1182 to be disposed on that surface. The optical filter 1182 is disposed on the surface of the isolation layer 1183 away from the substrate 1171, and the optical filter 1182 can pass light of a specific wavelength band. The microlens 1181 is disposed on one side of the optical filter 1182 away from the isolation layer 1183, and the microlens 1181 is used for converging light and can guide more incident light to the photoelectric conversion element 117. The full-well capacity of the photoelectric conversion element 117 is related to a volume of the n-well layer of the photoelectric conversion element 117. The larger the volume of the n-well layer 1172 is, the larger the full-well capacity is. In any one of the embodiments shown in FIGS. 4A to 13C, the volume of the n-well layer 1172 of each of the panchromatic pixels is greater than the volume of the n-well layer 1172 of each of the color pixels, so that the full-well capacity of each of the panchromatic pixels is greater than the full-well capacity of each of the color pixels, to increase exposure Q for saturation of each of the panchromatic pixels and increase time for panchromatic pixels to reach saturation, thereby avoiding a problem of premature saturation of each of the panchromatic pixels. Thus, the exposure of each of the panchromatic pixels and the color pixels can be balanced to improve the quality of photographed images.

Figure 4B:
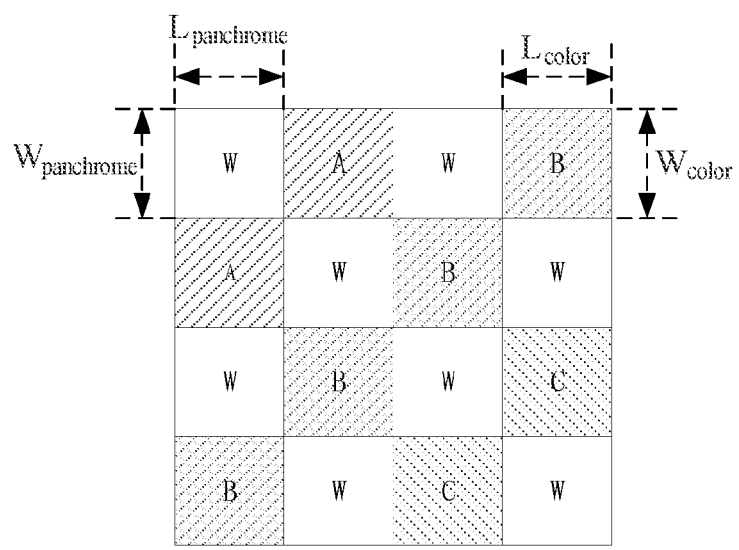
FIG. 4B is a schematic diagram of an arrangement of photoelectric conversion elements (or optical filters) in the pixel array of FIG. 4A.

For example, FIGS. 4A and 4B are respectively a schematic cross-sectional view of the pixel array 11 taken along the light-receiving direction and a schematic diagram of an arrangement of the plurality of photoelectric conversion elements 117 (or a plurality of optical filters 1182) according to an embodiment of the present disclosure. As shown in FIG. 4A, in the light-receiving direction, dimensions of a plurality of cross-sections of the isolation layer 1183 of each pixel (the same pixel) are equal; in the light-receiving direction, dimensions of a plurality of cross-sections of the n-well layer 1172 of each pixel (the same pixel) are equal; a dimension of a cross-section of the n-well layer 1172 of each of the panchromatic pixels is equal to a dimension of a cross-section of the n-well layer 1172 of each of the color pixels; a depth H1 of the n-well layer 1172 of each of the panchromatic pixels is greater than a depth H2 of the n-well layer 1172 of each of the color pixels, so that the volume of the n-well layer 1172 of each of the panchromatic pixels is greater than the volume of the n-well layer 1172 of each of the color pixels, and the panchromatic pixel has a larger full-well capacity than that of each of the color pixels.

It should be noted that the cross-section of the isolation layer 1183 is a section of the isolation layer taken along a direction perpendicular to the light-receiving direction, and the cross-section of the n-well layer 1172 is a section of the n-well layer 1172 taken along a direction perpendicular to the light-receiving direction. The cross-section of the isolation layer 1183 of each pixel corresponds to the shape and dimension of the cross-section of the n-well layer 1172 of the pixel. The cross-section can be polygons such as rectangle, square, parallelogram, rhombus, pentagon, hexagon, and the like, which are not limited to the description here.

In the light-receiving direction, the dimensions of the plurality of cross-sections of the n-well layer 1172 (or the isolation layer 1183) of the same pixel being equal refers to that the plurality of cross-sections have the same area, and corresponding side lengths in the plurality of cross-sections are equal. The dimension of the cross-section of the n-well layer 1172 of each of the panchromatic pixels being equal to the dimension of the cross-section of the n-well layer 1172 of each of the color pixels refers to that an area of the cross-section of the n-well layer 1172 of each of the panchromatic pixels is equal to an area of the cross-section of the n-well layer 1172 of each of the color pixels. Side lengths of a shape formed by the cross-section of the n-well layer 1172 of each of the panchromatic pixels may be equal or unequal to side lengths of a shape formed by the cross-section of the n-well layer 1172 of corresponding one of the color pixels. For example, the cross-sections of the n-well layers 1172 of each of the panchromatic pixels and each of the color pixels shown in FIG. 4B is a rectangle, which includes a length and a width. The area of the cross-section of the n-well layer 1172 of each of the panchromatic pixels is equal to the area of the cross-section of the n-well layer 1172 of each of the color pixels. A length $L_{panchrome}$ of the cross-section of the n-well layer 1172 of each of the panchromatic pixels is equal to a length $L_{color}$ of the cross-section of the n-well layer 1172 of each of the color pixels. A width $W_{panchrome}$ of the cross-section of the n-well layer 1172 of each of the panchromatic pixels is equal to a width $W_{color}$ of the cross-section of the n-well layer 1172 of each of the color pixels. In other examples, $L_{panchrome}$ may not be equal to $L_{color}$, and $W_{panchrome}$ may not be equal to $W_{color}$, as long as the area of the cross-section of the n-well layer 1172 of each of the panchromatic pixels is equal to the area of the cross-section of the n-well layer 1172 of each of the color pixels. Hereinafter, the cross-section of the n-well layer 1172 (or the isolation layer 1183), the dimensions of the plurality of cross-sections of the n-well layer 1172 (or the isolation layer 1183) of each pixel being equal, and the dimension of the cross-section of the n-well layer 1172 of each of the panchromatic pixels being equal to the dimension of the cross-section of the n-well layer 1172 of each of the color pixels, have the same explanations as to the explanations here.

Figure 5A:
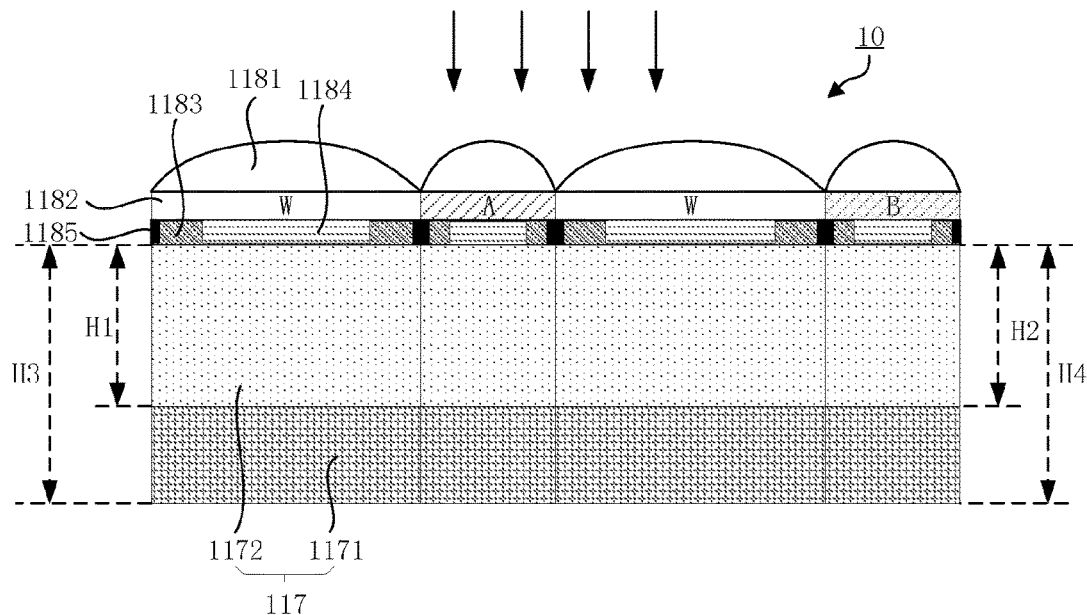
FIG. 5A is a schematic diagram of a partial cross-section of another pixel array in an embodiment of the present disclosure.
Figures 5B, 5C:
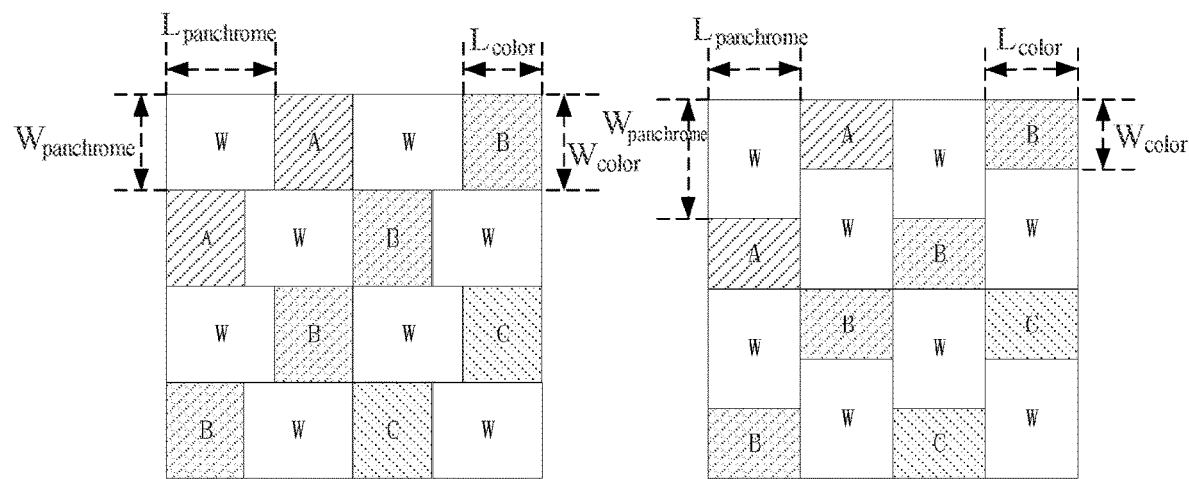
FIG. 5B is a schematic diagram of an arrangement of photoelectric conversion elements (or optical filters) in the pixel array of FIG. 5A.
FIG. 5C is a schematic diagram of another arrangement of photoelectric conversion elements (or optical filters) in the pixel array of FIG. 5A.

For example, FIG. 5A is a schematic cross-sectional view of the pixel array 11 taken along the light-receiving direction according to another embodiment of the present disclosure, and FIGS. 5B and 5C are schematic diagrams of two arrangements to a plurality of photoelectric conversion elements 117 (or a plurality of optical filter elements) in the pixel array 11 of FIG. 5A. As shown in FIG. 5A, in the light-receiving direction, the dimensions of the plurality of cross-sections of the isolation layer 1183 of each pixel (the same pixel) are equal; in the light-receiving direction, the dimensions of the plurality of cross-sections of the n-wells layer 1172 of each pixel (the same pixel) are all equal; the dimension of the cross-section of the n-well layer 1172 of each of the panchromatic pixels is greater than the dimension of the cross-section of the n-well layer 1172 of each of the color pixels; the depth H1 of the cross-section of the n-well layer 1172 of each of the panchromatic pixels is equal to the depth H2 of the cross-section of the n-well layer 1172 of each of the color pixels. In such a way, the volume of the n-well layer 1172 of each of the panchromatic pixels is greater than the volume of the n-well layer 1172 of each of the color pixels, and the panchromatic pixel has a larger full-well capacity than that of each of the color pixels. Certainly, in other embodiments, the depth H1 of the n-well layer 1172 of each of the panchromatic pixels in FIG. 5A may also be greater than the depth H2 of the n-well layer 1172 of each of the color pixels.

It should be noted that the dimension of the cross-section of the n-well layer 1172 of each of the panchromatic pixels being greater than the dimension of the cross-section of the n-well layer 1172 of each of the color pixels refers to that the area of the cross-section of the n-well layer 1172 of each of the panchromatic pixels is greater than the area of the cross-section of the n-well layer 1172 of each of the color pixels, and the side length of the shape formed by the cross-section of the n-well layer of each of the panchromatic pixels may be partially or totally larger than the side length of the shape formed by the cross-section of the n-well layer 1172 of the corresponding one of the color pixels. For example, as shown in FIG. 5B, the length $L_{panchrome}$ of the cross-section of the n-well layer 1172 of each of the panchromatic pixels is greater than the length $L_{color}$ of the cross-section of the n-well layer 1172 of each of the color pixels, and the width $W_{panchrome}$ of the cross-section of the n-well layer 1172 of each of the panchromatic pixels is equal to the width $W_{color}$ of the cross-section of the n-well layer 1172 of each of the color pixels; as shown in FIG. 5C, the length $L_{panchrome}$ of the cross-section of the n-well layer 1172 of each of the panchromatic pixels is equal to the length $L_{color}$ of the cross-section of the n-well layer 1172 of each of the color pixels, and the width $W_{panchrome}$ of the cross-section of the n-well layer 1172 of each of the panchromatic pixels is greater than the width $W_{color}$ of the cross-section of the n-well layer 1172 of each of the color pixels. Hereafter, the dimension of the cross-section of the n-well layer of each of the panchromatic pixels being greater than the dimension of the cross-section of the n-well layer 1172 of each of the color pixels has the same explanation as to the explanation here.

Figure 6A:
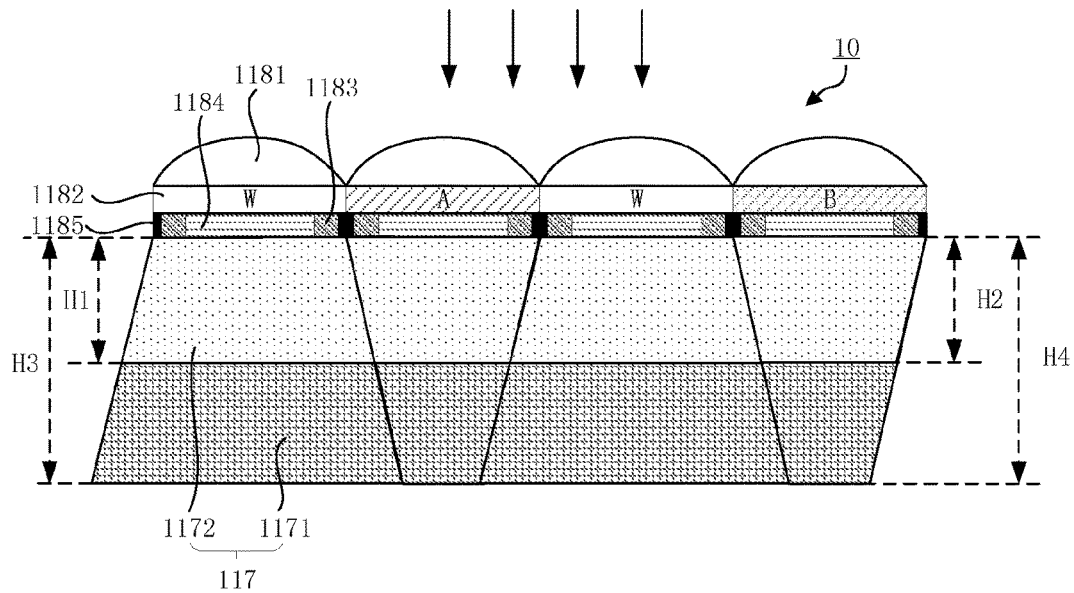
FIG. 6A is a schematic diagram of a partial cross-section of another pixel array in an embodiment of the present disclosure.
Figures 6B, 6C:
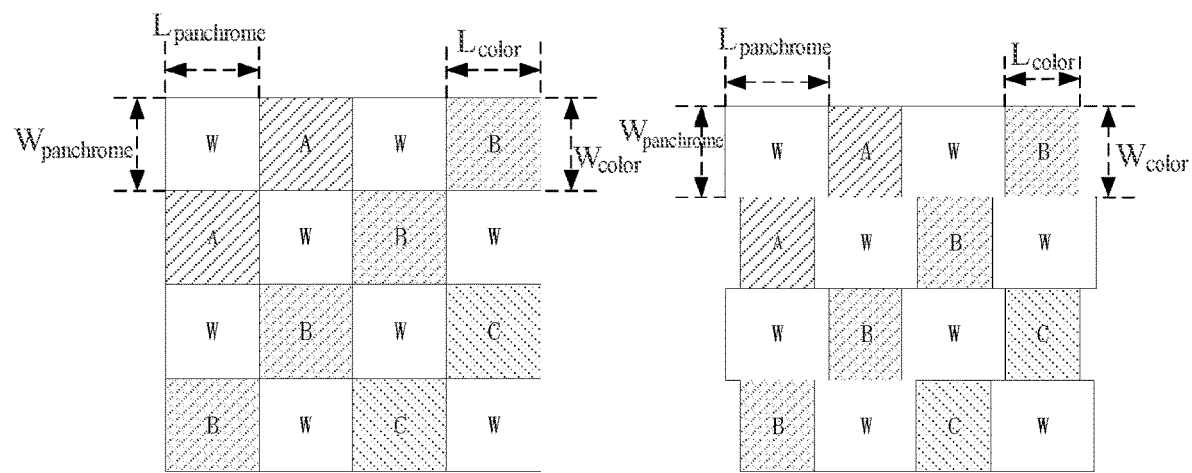
FIG. 6B is a schematic diagram of an arrangement of optical filters in the pixel array of FIG. 6A.
FIG. 6C is a schematic diagram of an arrangement of photoelectric conversion elements in the pixel array of FIG. 6A.

For example, FIGS. 6A to 6C are a schematic cross-sectional view of the pixel array 11 taken along the light-receiving direction, a schematic diagram of an arrangement of a plurality of optical filters 1182, and a schematic diagram of an arrangement of a plurality of photoelectric conversion elements 117, according to another embodiment of the present disclosure, respectively. As shown in FIG. 6A, in the light-receiving direction, dimensions of a plurality of cross-sections of the isolation layer 1183 of each pixel (the same pixel) are equal; in the light-receiving direction, dimensions of cross-sections of the n-well layer 1172 of each panchromatic pixel (the same panchromatic pixel) gradually increase, dimensions of cross-sections of the n-well layer 1172 of each of color pixels (the same color pixel) gradually decrease, and the dimension of the smallest one of the cross-sections of the n-well layer 1172 of each of the panchromatic pixels is equal to the dimension of the largest one of the cross-sections of the n-well layer 1172 of each of the color pixels; the depth H1 of the cross-section of the n-well layer 1172 of each of the panchromatic pixels is equal to the depth H2 of the cross-section of the n-well layer 1172 of each of the color pixels. As shown in FIG. 6B, although the dimension of the cross-section of the optical filter 1182 of each of the panchromatic pixels is equal to the dimension of the cross-section of the optical filter 1182 of each of the color pixels (i.e., the areas and the corresponding side lengths are both equal), as shown in FIG. 6C, in fact, the dimension of the cross-section of the n-well layer 1172 in the photoelectric conversion element 117 of the panchromatic pixel (the cross-section other than the minimum-dimension cross-section) is greater than the dimension of the cross-section of the n-well layer 1172 in the photoelectric conversion element 117 of the color pixel. In such a way, the volume of the n-well layer 1172 of each of the panchromatic pixels is greater than the volume of the n-well layer 1172 of each of the color pixels, and the panchromatic pixel has a larger full-well capacity than that of each of the color pixels.

In other embodiments, the dimension of the smallest cross-section of the n-well layer 1172 of each of the panchromatic pixels in FIG. 6A may also be larger than the dimension of the largest cross-section of the n-well layer of each of the color pixels. The depth H1 of the n-well layer 1172 of each of the panchromatic pixels may also be greater than the depth H2 of the n-well layer 1172 of each of the color pixels.

Figure 7A:
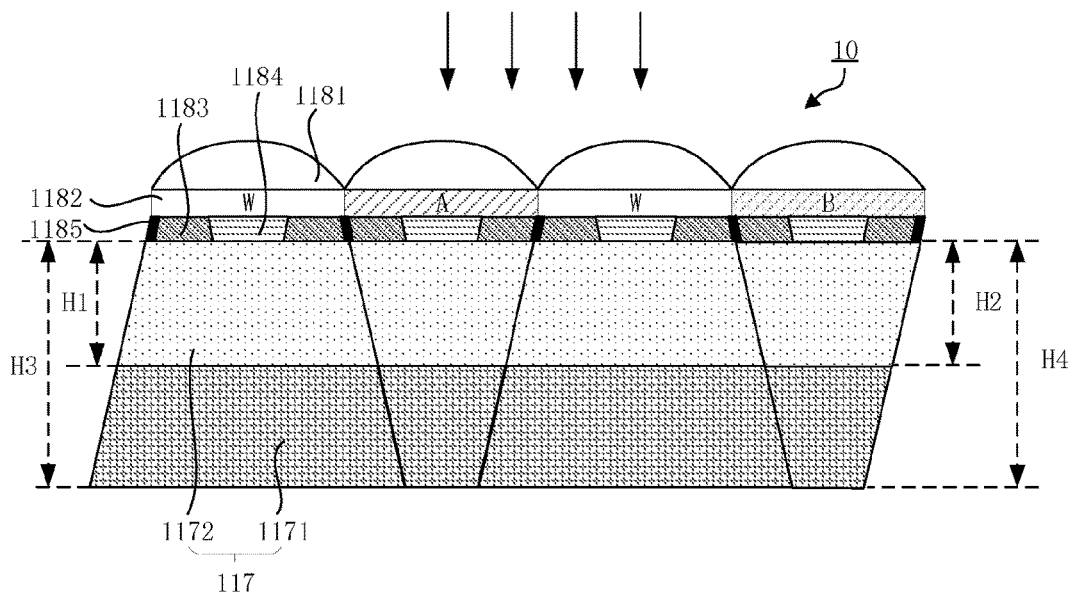
FIG. 7A is a schematic diagram of a partial cross-section of another pixel array in an embodiment of the present disclosure.
Figures 7B, 7C:
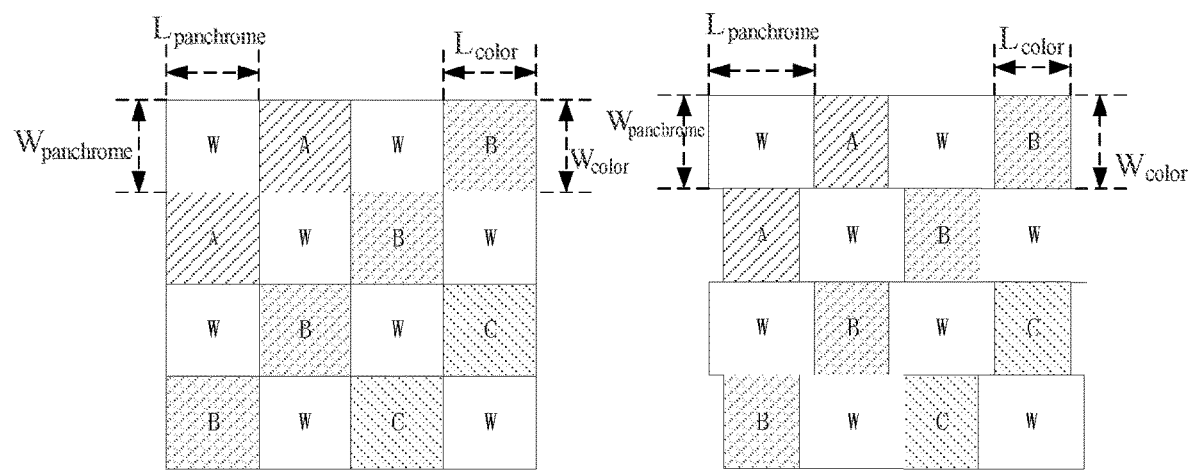
FIG. 7B is a schematic diagram of an arrangement of optical filters in the pixel array of FIG. 7A.
FIG. 7C is a schematic diagram of an arrangement of photoelectric conversion elements in the pixel array of FIG. 7A.

For example, FIGS. 7A to 7C are a schematic cross-sectional view of the pixel array 11 taken along the light-receiving direction, a schematic diagram of an arrangement of a plurality of optical filters 1182, and an arrangement of a plurality of photoelectric conversion elements 117, according to another embodiment of the present disclosure, respectively. As shown in FIG. 7A, in the light-receiving direction, dimensions of a plurality of cross-sections of the isolation layer 1183 of each panchromatic pixel (the same panchromatic pixel) gradually increase, and dimensions of a plurality of cross-sections of the isolation layer 1183 of each color pixel (the same color pixel) gradually decrease; in the light-receiving direction, the dimensions of the cross-sections of the n-well layers 1172 of each panchromatic pixel gradually increase, and the dimension of the smallest one of the cross-sections of the n-well layer 1172 of each of the panchromatic pixels is equal to the dimension of the largest one of the cross-sections of the n-well layer 1172 of each of the color pixels; the depth H1 of the cross-section of the n-well layer 1172 of each of the panchromatic pixels is equal to the depth H2 of the cross-section of the n-well layer 1172 of each of the color pixels. As shown in FIG. 7B, although the dimension of the cross-section of the optical filter 1182 of each of the panchromatic pixels is equal to the dimension of the cross-section of the optical filter 1182 of each of the color pixels (i.e., the areas and the corresponding side lengths are both equal), as shown in FIG. 7C, in fact, the dimension of the cross-section of the n-well layer 1172 in the photoelectric conversion element 117 of the panchromatic pixel (the cross-section other than the minimum-dimension cross-section) is greater than the dimension of the cross-section of the n-well layer 1172 in the photoelectric conversion element 117 of the color pixel. In such a way, the volume of the n-well layer 1172 of each of the panchromatic pixels is greater than the volume of the n-well layer 1172 of each of the color pixels, and the panchromatic pixel has a larger full-well capacity than that of each of the color pixels.

In other embodiments, the dimension of the smallest one of the cross-sections of the n-well layer 1172 of each of the panchromatic pixels in FIG. 7A may also be larger than the dimension of the largest one of the cross-sections of the n-well layer of each of the color pixels, and the depth H1 of the layer 1172 of each of the panchromatic pixels may also be greater than the depth H2 of the n-well layer 1172 of each of the color pixels.

Figure 8A:
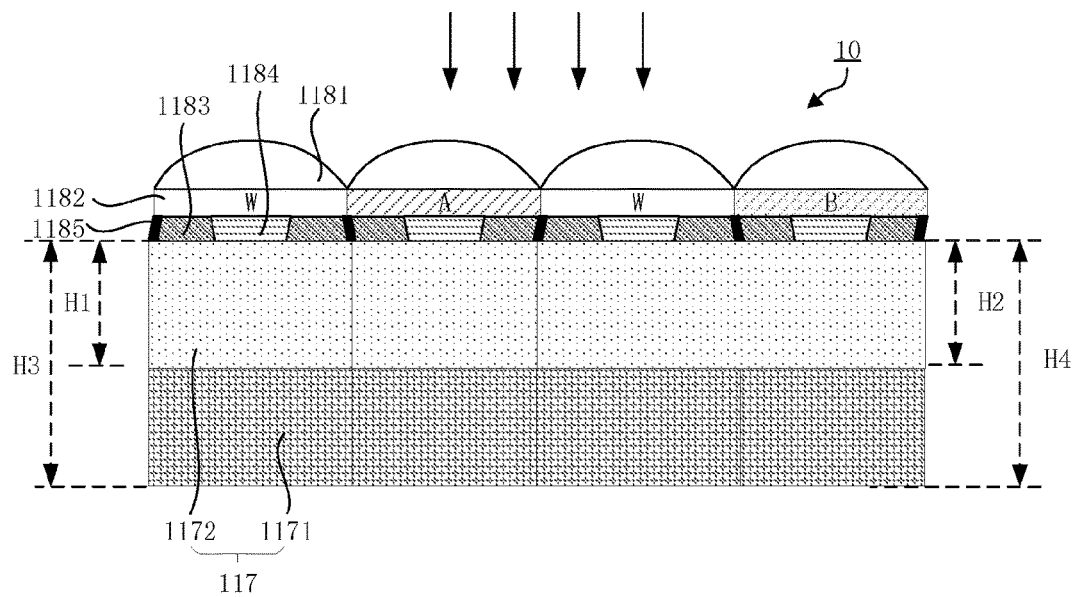
FIG. 8A is a schematic diagram of a partial cross-section of another pixel array in an embodiment of the present disclosure.
Figures 8B, 8C:
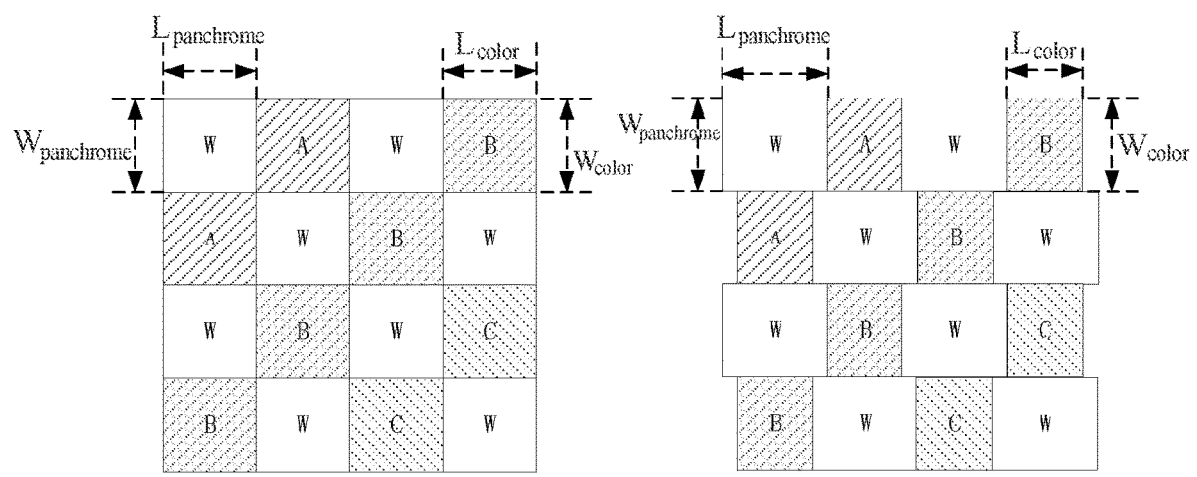
FIG. 8B is a schematic diagram of an arrangement of optical filters in the pixel array of FIG. 8A.
FIG. 8C is a schematic diagram of an arrangement of photoelectric conversion elements in the pixel array of FIG. 8A.
Figure 9A:
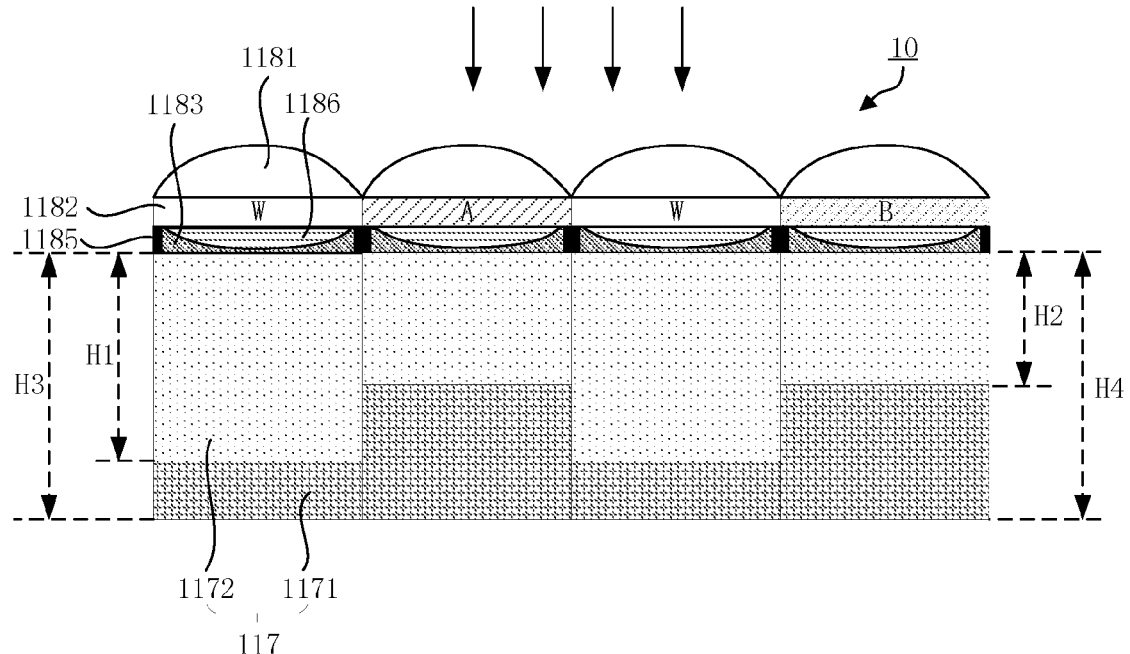
FIG. 9A is a schematic diagram of a partial cross-section of another pixel array in an embodiment of the present disclosure.
Figure 9B:
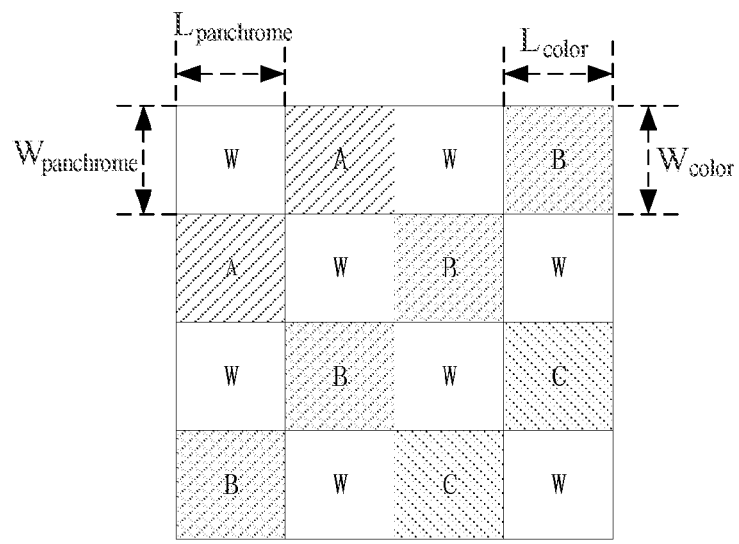
FIG. 9B is a schematic diagram of an arrangement of photoelectric conversion elements (or optical filters) in the pixel array of FIG. 9A.
Figure 10A:
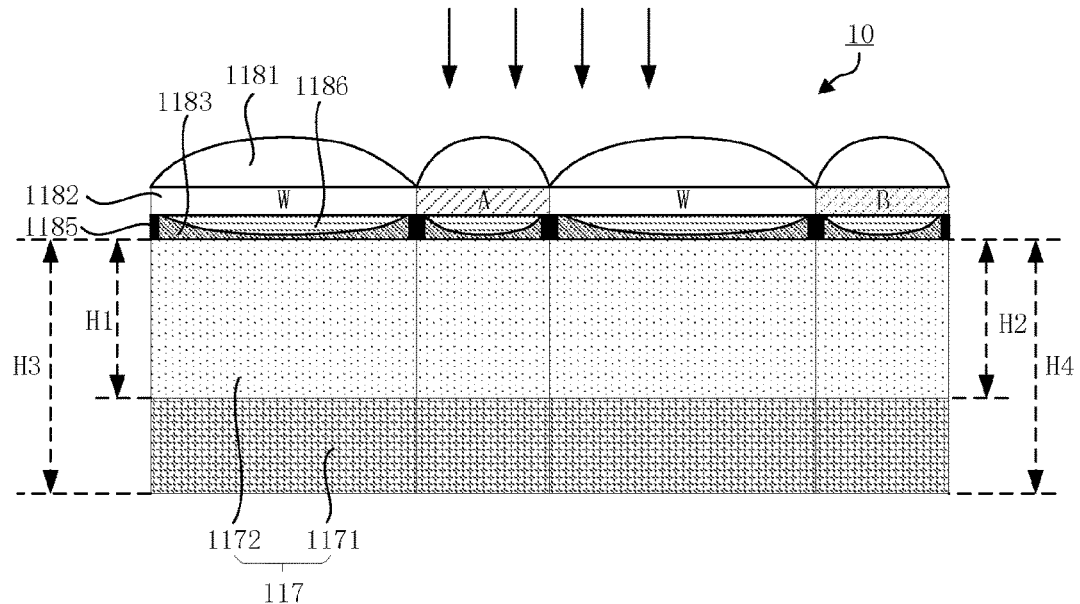
FIG. 10A is a schematic diagram of a partial cross-section of another pixel array in an embodiment of the present disclosure.
Figures 10B, 10C:
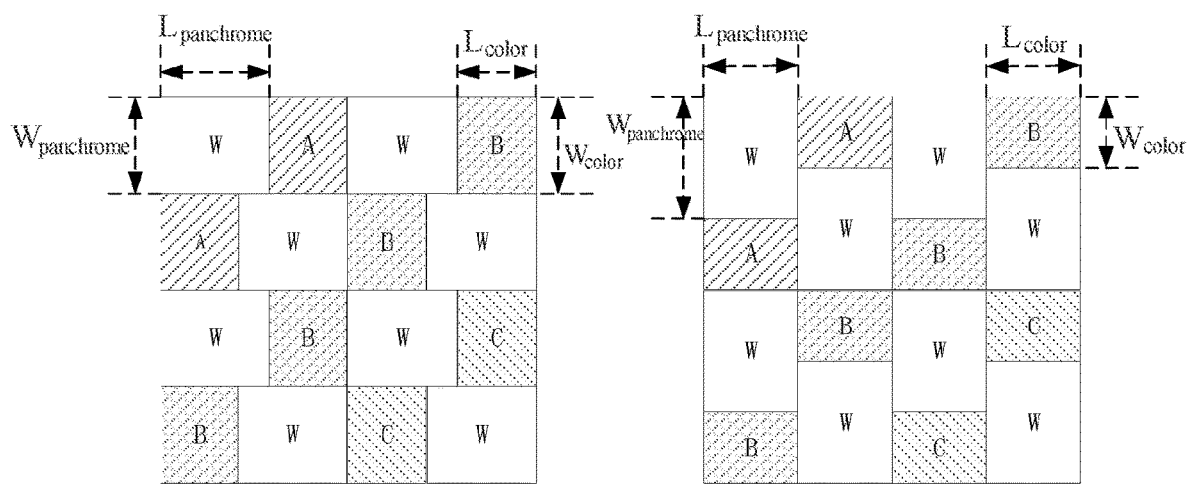
FIG. 10B is a schematic diagram of an arrangement of photoelectric conversion elements (or optical filters) in the pixel array of FIG. 10A.
FIG. 10C is a schematic diagram of another arrangement of photoelectric conversion elements (or optical filters) in the pixel array of FIG. 10A.
Figure 11A:
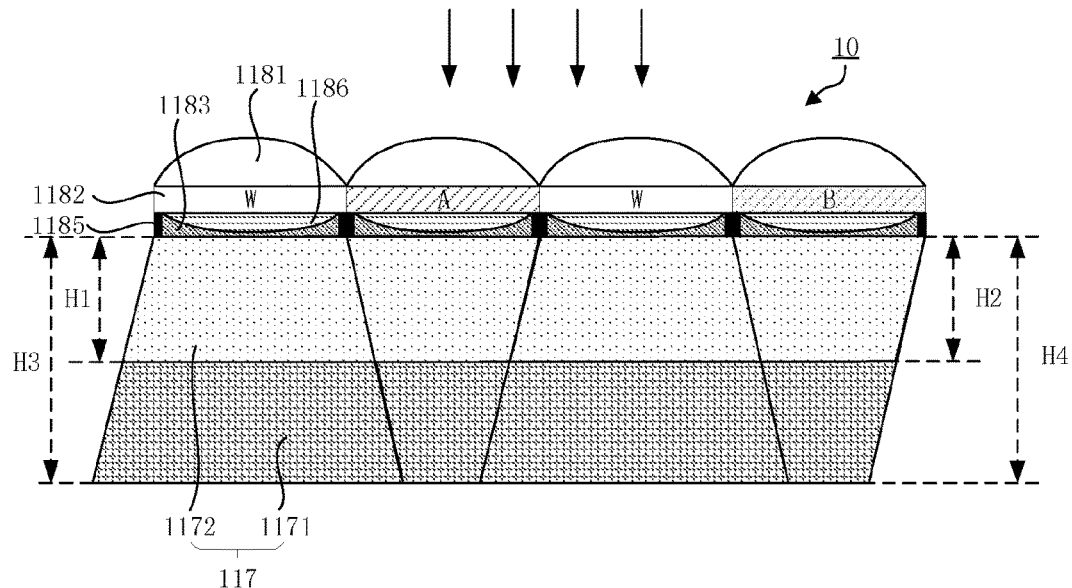
FIG. 11A is a schematic diagram of a partial cross-section of another pixel array in an embodiment of the present disclosure.
Figures 11B, 11C:
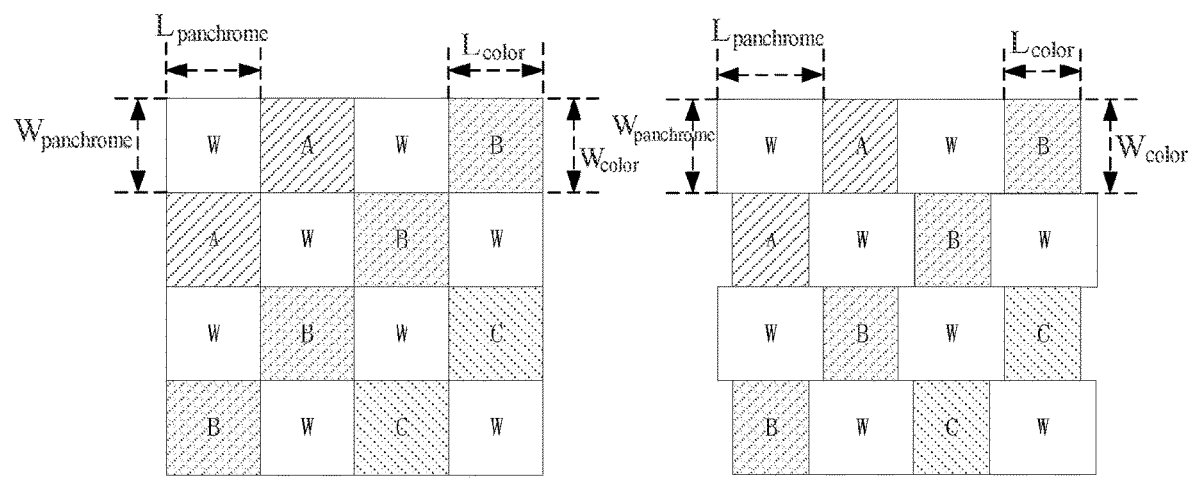
FIG. 11B is a schematic diagram of an arrangement of optical filters in the pixel array of FIG. 11A.
FIG. 11C is a schematic diagram of an arrangement of photoelectric conversion elements in the pixel array of FIG. 11A.
Figure 12A:
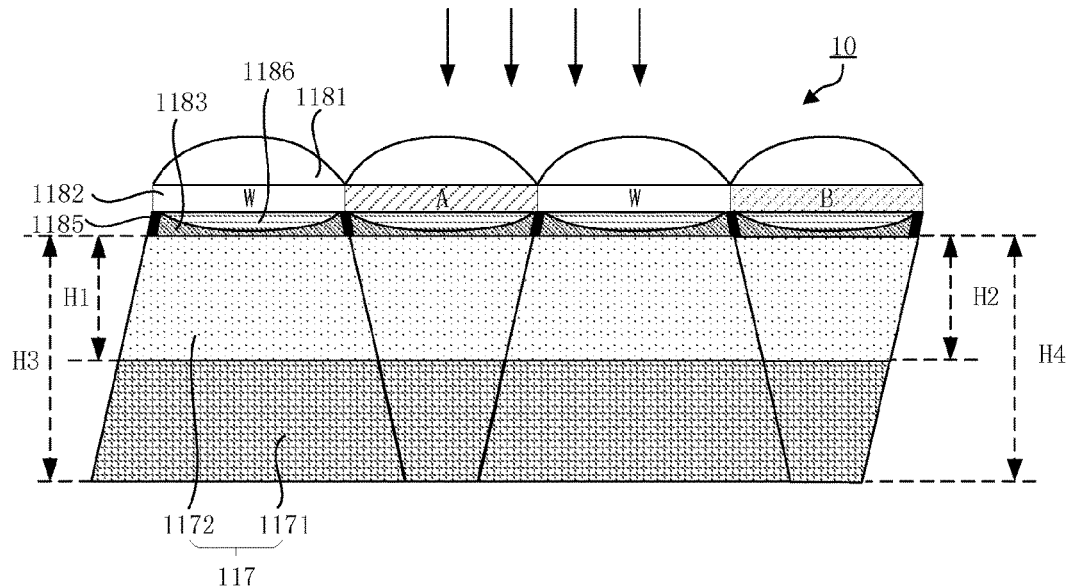
FIG. 12A is a schematic diagram of a partial cross-section of another pixel array in an embodiment of the present disclosure.
Figures 12B, 12C:
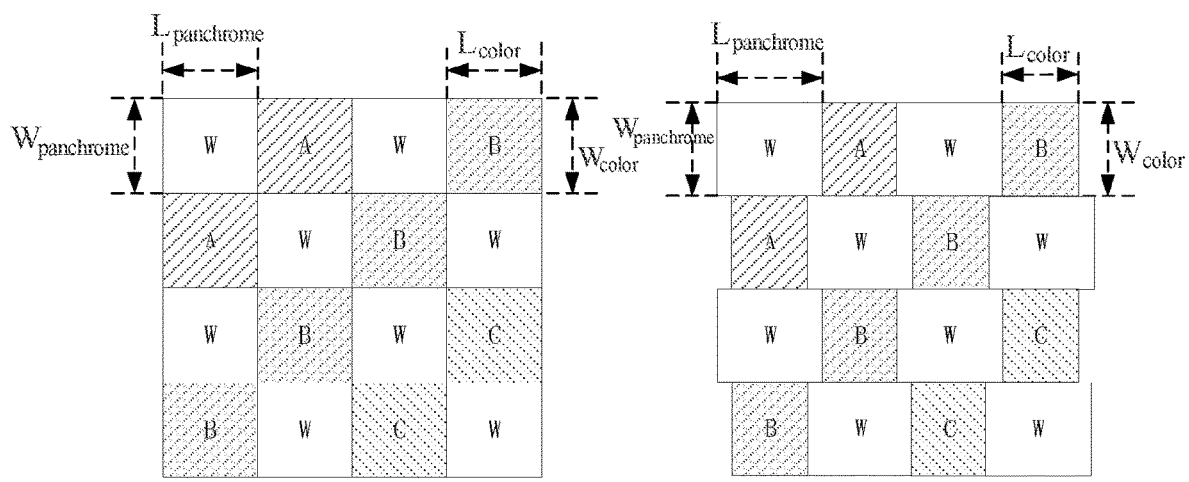
FIG. 12B is a schematic diagram of an arrangement of optical filters in the pixel array of FIG. 12A.
FIG. 12C is a schematic diagram of an arrangement of photoelectric conversion elements in the pixel array of FIG. 12A.
Figure 13A:
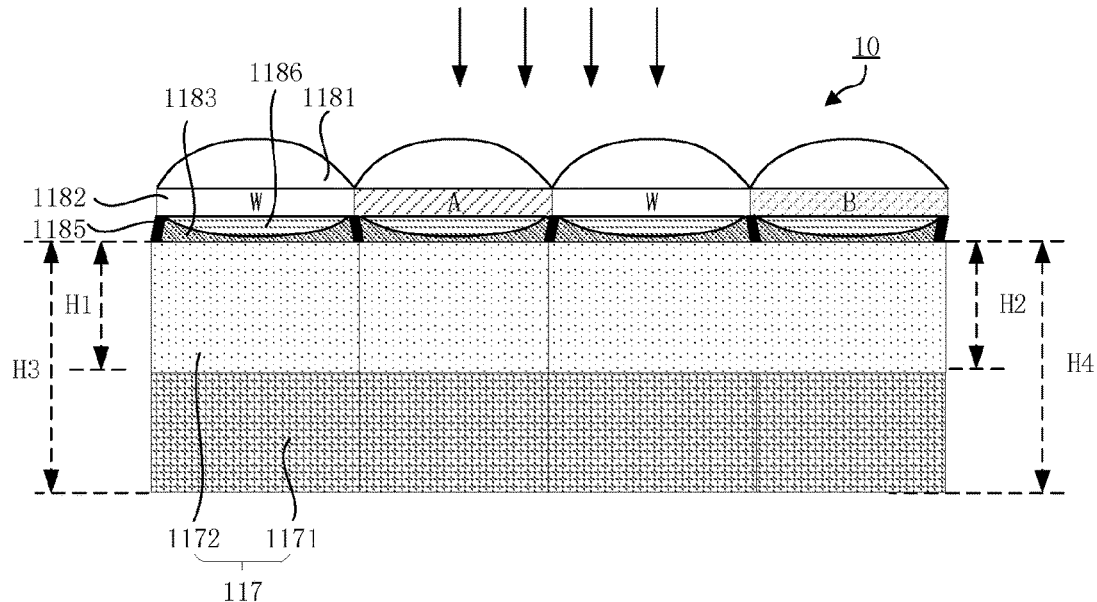
FIG. 13A is a schematic diagram of a partial cross-section of another pixel array in an embodiment of the present disclosure.
Figures 13B, 13C:
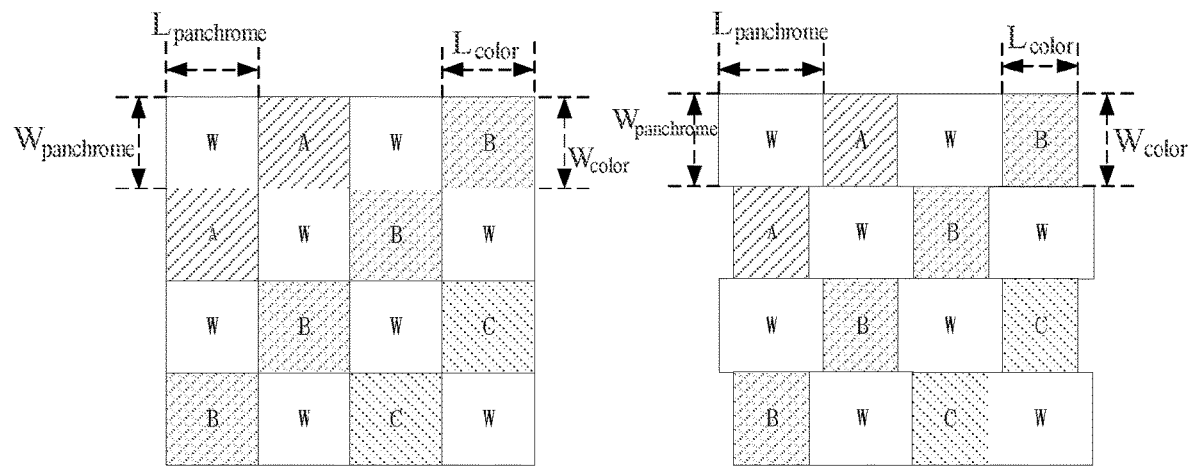
FIG. 13B is a schematic diagram of an arrangement of optical filters in the pixel array of FIG. 13A.
FIG. 13C is a schematic diagram of an arrangement of photoelectric conversion elements in the pixel array of FIG. 13A.

For example, FIGS. 8A to 8C are a schematic cross-sectional view of the pixel array 11 taken along the light-receiving direction, a schematic diagram of an arrangement of a plurality of optical filters 1182, and an arrangement of a plurality of photoelectric conversion elements 117, according to another embodiment of the present disclosure, respectively. As shown in FIG. 8A, in the light-receiving direction, dimensions of a plurality of cross-sections of the isolation layer 1183 of each panchromatic pixel (the same panchromatic pixel) gradually increase, dimensions of a plurality of cross-sections of the isolation layer 1183 of each color pixel (the same color pixel) gradually decrease, and the dimension of the smallest one of the cross-sections of the isolation layer 1183 of each of the panchromatic pixels is equal to the dimension of the largest one of the cross-sections of the isolation layer 1183 of each of the color pixels; in the light-receiving direction, the dimensions of the plurality of cross-sections of the n-well layer 1172 of each pixel are equal; the dimension of the cross-section of the n-well layer 1172 of the panchromatic pixel is larger than the dimension of the cross-section of the n-well layer 1172 of the color pixel; the depth H1 of the cross-section of the n-well layer 1172 of each of the panchromatic pixels is equal to the depth H2 of the cross-section of the n-well layer 1172 of each of the color pixels. As shown in FIG. 8B, although the dimension of the cross-section of the optical filter 1182 of each of the panchromatic pixels is equal to the dimension of the cross-section of the optical filter 1182 of each of the color pixels (i.e., the areas and the corresponding side lengths are both equal), as shown in FIG. 8C, in fact, the dimension of the cross-section of the n-well layer 1172 in the photoelectric conversion element 117 of the panchromatic pixel (the cross-section other than the minimum-dimension cross-section) is greater than the dimension of the cross-section of the n-well layer 1172 in the photoelectric conversion element 117 of the color pixel. In such a way, the volume of the n-well layer 1172 of each of the panchromatic pixels is greater than the volume of the n-well layer 1172 of each of the color pixels, and the panchromatic pixel has a larger full-well capacity than that of each of the color pixels.

In other embodiments, the depth H1 of the n-well layer 1172 of each of the panchromatic pixels in FIG. 8A may also be greater than the depth H2 of the n-well layer 1172 of each of the color pixels; the dimension of the smallest one of the cross-sections of the isolation layer 1183 of each of the panchromatic pixels in FIG. 8B may also be greater than the dimension of the largest one of the cross-sections of the isolation layer 1183 of each of the color pixels.

In the pixel array 11 in any one of the embodiments shown in FIGS. 4A to 8C, a depth H3 of the photoelectric conversion element 117 of each of the panchromatic pixels is equal to a depth H4 of the photoelectric conversion element 117 of each of the color pixels. Specifically, the depth H3 of the substrate 1171 of each of the panchromatic pixels is equal to the depth H4 of the substrate 1171 of each of the color pixels. When H3 and H4 are equal, a surface of the substrate 1171 of each of the panchromatic pixels away from the optical filter 1182 is located on the same horizontal plane as a surface of the substrate 1171 of each of the color pixels away from the optical filter 1182, so that the complexity of the design and manufacture of the readout circuit can be reduced.

Each pixel in any one of the embodiments shown in FIGS. 4A to 8C further includes a light-guiding layer 1184. The light-guiding layer 1184 is formed in the isolation layer 1183, and refractive index of the light-guiding layer 1184 is greater than refractive index of the isolation layer 1183. In a direction perpendicular to the light-receiving direction, the isolation layer 1183 of each pixel, the light-guiding layer 1184 of the pixel, and the isolation layer 1183 of the pixel are arranged in sequence. For example, along the direction perpendicular to the light-receiving direction, the isolation layer 1183 of the panchromatic pixel W, the light-guiding layer 1184 of the panchromatic pixel W, and the isolation layer 1183 of the panchromatic pixel W are arranged in sequence, the isolation layer 1183 of the color pixel A, the light-guiding layer 1184 of the color pixel A, and the isolation layer 1183 of the color pixel A are arranged in sequence, the isolation layer 1183 of the color pixel B, the light-guiding layer 1184 of the color pixel B, and the isolation layer 1183 of the color pixel B are arranged in sequence. The purpose of arranging the light-guiding layer 1184 in the isolation layer 1183 is to make light passing through the light optical filter 1182 totally reflected in a structure composed of the isolation layer 1183 and the light-guiding layer 1184, so as to function for concentrating the light and allowing more light to enter the corresponding photoelectric conversion element 117. The n-well layer 1172 in the photoelectric conversion element 117 can receive light passing through the light-guiding layer 1184 to convert the light into electric charges.

In one example, the refractive index at each position of the light-guiding layer 1184 is the same. This design method can simplify the design of the light-guiding layer and reduce the difficulty of manufacturing the pixel array 11. In another example, in the light-receiving direction of the image sensor 10, the refractive index of the light-guiding layer 1184 gradually increases. This design method can enhance light-condensing ability of the light-guiding layer 1184, so that more light can enter the photoelectric conversion element 117.

As shown in FIGS. 4A to 6C, in the light-receiving direction, the dimensions of the cross-sections of the isolation layer 1183 of each pixel are the same, and the dimensions of the cross-sections of the light-guiding layer 1184 of each pixel are also the same. This design method can simplify the manufacturing process of the light-guiding layer 1184. Certainly, in other embodiments, when the dimensions of the plurality of cross-sections of the isolation layer 1183 of each pixel are equal along the light-collecting direction, a structure of the light-guiding layer 1184 may also be that the dimensions of the cross-sections of the light-guiding layer 1184 of each pixel gradually decrease along the light-collecting direction. This design can enhance the light-condensing ability of the light-guiding layer 1184, so that more light can enter the photoelectric conversion element 117.

As shown in FIGS. 7A and 8A, in the light-receiving direction, the dimensions of the plurality of cross-sections of the isolation layer 1183 of each panchromatic pixel gradually increase, the dimensions of the plurality of cross-sections of the isolation layer 1183 of each color pixel gradually decrease, and the dimensions of the cross-sections of the light-guiding layer 1184 of each panchromatic pixel and the light-guiding layer 1184 of each color pixel gradually decrease. This design method can enhance the light-condensing ability of the light-guiding layer 1184, so that more light can enter the photoelectric conversion element 117. Certainly, in other embodiments, when the dimensions of the plurality of cross-sections of the isolation layer 1183 of each panchromatic pixel gradually increase and the dimension of the plurality of cross-sections of the isolation layer 1183 of each color pixel gradually decrease in the light-receiving direction, a structure of the light-guiding layer 1184 may also be that the dimensions of the plurality of cross-sections of the isolation layer 1183 of each pixel are equal in the light-receiving direction. This design method can simplify the manufacturing process of the light-guiding layer 1184.

The depth of the light-guiding layer 1184 is equal to the depth of the isolation layer 1183, so that the light-condensing ability of the light-guiding layer 1184 can be enhanced. Compared with a thickness of the isolation layer in an existing image sensor, a thickness of the isolation layer 1183 of the present disclosure is larger, for example, greater than a predetermined thickness, so that a longer optical path can be formed to improve the light-condensing effect of the structure composed of the light guide layer 1184 and the isolation layer 1183.

Each pixel in any one of the embodiments shown in FIGS. 4A to 8C also includes an optical isolation interlayer 1185. The optical isolation interlayer 1185 is disposed between the isolation layers 1183 of two adjacent pixels. For example, one optical isolation interlayer 1185 is provided between the isolation layer 1183 of the panchromatic pixel W and the isolation layer 1183 of the color pixel A, another optical isolation interlayer 1185 is provided between the isolation layer 1183 of the panchromatic pixel W and the isolation layer 1183 of the color pixel B between layers 1183, and the like. The optical isolation interlayer 1185 may be made of at least one of tungsten, titanium, aluminum, and copper. The optical isolation interlayer 1185 can prevent light incident to a pixel from entering another pixel adjacent to the pixel, and avoid causing noise to other pixels.

In any one of the embodiments shown in FIGS. 4A to 8C, the light-guiding layer 1184 in each pixel can be replaced with a light-condensing lens 1186. Specifically, as shown in FIGS. 9A to 13C, a structure of the image sensor 10 in FIG. 9A excepting the light-condensing lens 1186 is the same as the structure of the image sensor 10 in FIG. 4A; a structure of the image sensor 10 in FIG. 10A excepting the light-condensing lens 1186 is the same as the structure of the image sensor 10 in FIG. 5A; a structure of the image sensor 10 in FIG. 11A excepting the light-condensing lens 1186 is the same as the structure of the image sensor 10 in FIG. 6A; a structure of the image sensor 10 in FIG. 12A excepting the light-condensing lens 1186 is the same as the structure of the image sensor 10 in FIG. 7A; and a structure of the image sensor 10 in FIG. 13A excepting the light-condensing lens 1186 is the same as the structure of the image sensor 10 in FIG. 8A. Accordingly, the microlens 1181, the optical filter 1182, the isolation layer 1183, the optical isolation interlayer 1185, the photoelectric conversion element 117 (the substrate 1171 and the n-well layer 1172) in FIGS. 9A to 13C do not be described again.

As shown in FIGS. 9A to 13C, each panchromatic pixel and each color pixel includes a condensing lens 1186 disposed in the isolation layer 1183 of the respective pixel. The condensing lens 1186 can function to condense light, so that more light passing through the optical filter 1182 can enter the photoelectric conversion element 117. When each pixel is provided with the light-condensing lens 1186, the light-condensing lens 1186 with different curvature radii can be designed according to the needs of different pixels. For example, a curvature radius of the light-condensing lens 1186 for each of the color pixels is greater than a curvature radius of the light-condensing lens 1186 for each of the panchromatic pixels, so that the condensing ability of the light-condensing lens 1186 of each of the color pixels is higher than the condensing ability of the light-condensing lens 1186 of each of the panchromatic pixels, and the like.

In other embodiments, only some of the pixels may include the light-condensing lens 1186. For example, the light-condensing lens 1186 may not be provided in the panchromatic pixels, and the light-condensing lens 1186 may be provided in the color pixels. For example, in the embodiment shown in FIGS. 11A and 12A, in the light-receiving direction, the cross-sections of the n-well layer 1172 of each of the panchromatic pixels gradually increase, and the cross-sections of the n-well layer of each of the color pixels gradually decrease. Most of the light passing through the optical filter 1182 of each of the panchromatic pixels can enter the photoelectric conversion element 117 of the panchromatic pixel, while few of the light passing through the optical filter 1182 of each of the color pixels can enter the photoelectric conversion of the color pixel. At this time, the light-condensing lens 1186 may be provided only in the isolation layer 1183 of the color pixel, so that more light can enter the photoelectric conversion element 117 of the color pixel by utilizing the light light-condensing effect of the light-condensing lens 1186. Disposing the light-condensing lens 1186 in only some of the pixels can reduce the manufacturing cost of the image sensor 10.

When the light-condensing lens 1186 is disposed in the pixel, an anti-reflection film can be provided on a surface of each light-condensing lens 1186 opposite to the photoelectric conversion element 117, wherein the anti-reflection film can be used to reduce light interference to avoid the influence of light interference on imaging effect of the image sensor 10.

Figure 14:
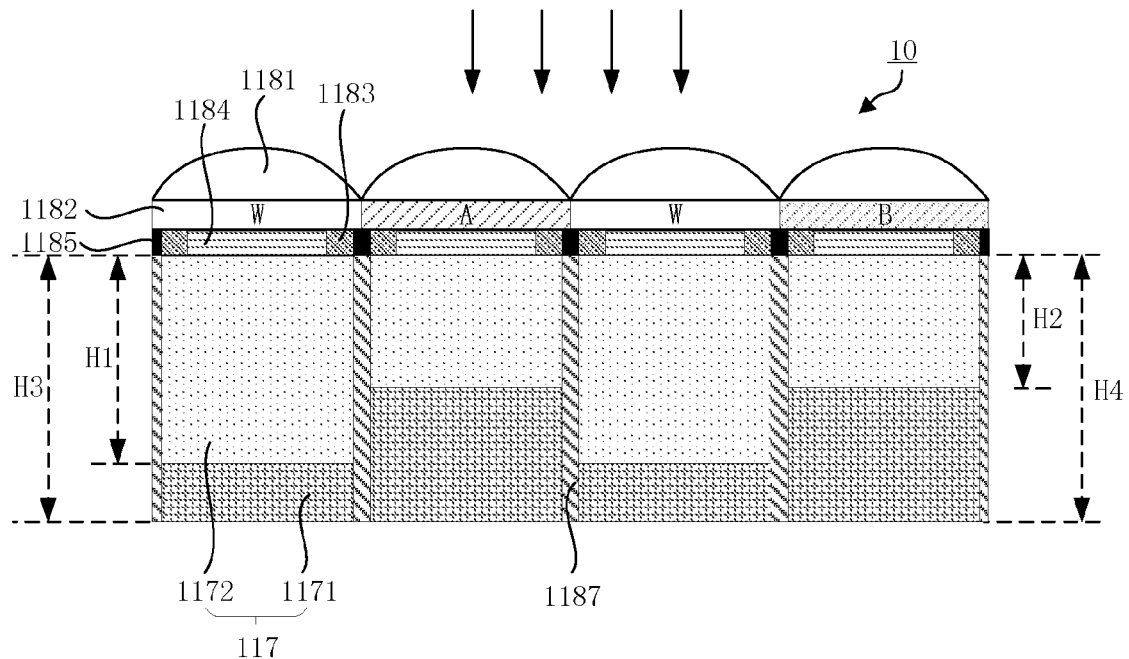
FIG. 14 is a schematic diagram of a partial cross-section of another pixel array in an embodiment of the present disclosure.
Figure 15:
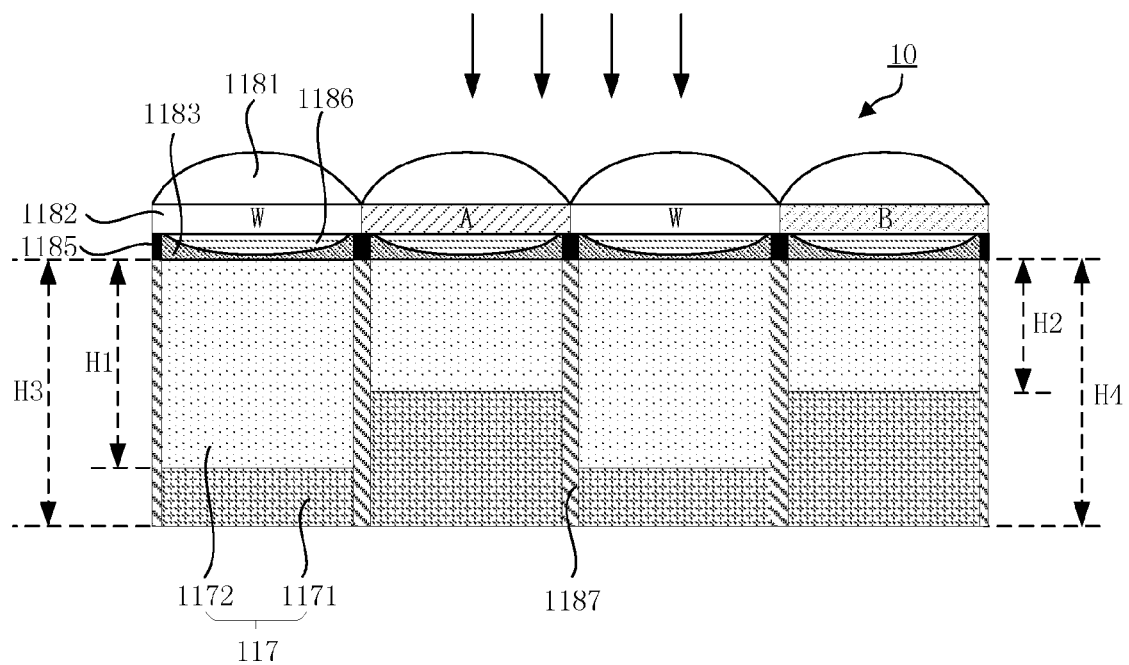
FIG. 15 is a schematic diagram of a partial cross-section of another pixel array in an embodiment of the present disclosure.

Referring to FIGS. 14 and 15, the image sensor 10 further includes a barrier layer 1187. The barrier layer 1187 may be provided between the photoelectric conversion elements 117 of two adjacent pixels. For example, one barrier layer 1187 is provided between the photoelectric conversion element 117 of the panchromatic pixel W and the photoelectric conversion element 117 of the color pixel A, and another barrier layer 1187 is provided between the photoelectric conversion element 117 of the panchromatic pixel W and the photoelectric conversion element 117 of the color pixel B, and the like. For example, the barrier layer 1187 may be in a form of deep trench isolation (DTI). The barrier layer 1187 can prevent the light entering the photoelectric conversion element 117 of a certain pixel from entering the photoelectric conversion elements 117 of other pixels adjacent to the pixel, and avoid causing noise to the photoelectric conversion elements 117 of other pixels.

In addition to configuring the full-well capacity of each of the panchromatic pixels to be greater than the full-well capacity of the color pixel as described above, in the embodiment of the present disclosure, different full-well capacities may also be set for the color pixels with different colors. Specifically, the full-well capacity corresponding to the sensitivity can be set according to the sensitivity of each of the color pixels (the pixel with shorter exposure time to reach saturation has a higher sensitivity). For example, as shown in FIG. 1, the sensitivity of the green pixel>the sensitivity of the red pixel>the sensitivity of the blue pixel, the full-well capacity of each of the color pixels can be set as: the full-well capacity of the green pixel>the full-well capacity of the red pixel>the full-well capacity of the blue pixel. The method of increasing the full-well capacity of each of the color pixels is similar to the method of increasing the full-well capacity of the panchromatic pixels. For example, one method may be: when a cross-sectional area of the n-well layer 1172 of each pixel is the same, that is, $S_W=S_G=S_R=S_B$, a relationship of the depth of the n-well layer 1172 of each pixel can be $H_W>H_G>H_R>H_B$; for another example, when the depth of the n-well layer 1172 of each pixel is the same, that is, $H_W=H_G=H_R=H_B$, a relationship of the cross-sectional area of the n-well layer 1172 of each pixel may be $S_W>S_G>S_R>S_B$, and other situations will not be repeated here. In such a way, different full-well capacities can be set according to different sensitivities, so that the exposure of each of the color pixels can be balanced, and the quality of the photographed image can be improved.

On the basis of configuring the full-well capacity of each of the panchromatic pixels to be larger than the full-well capacity of each of the color pixels, it is also possible to further balance the exposure of panchromatic pixels and color pixels by independently controlling the exposure time of panchromatic pixels and the exposure time of color pixels.

Figure 16:
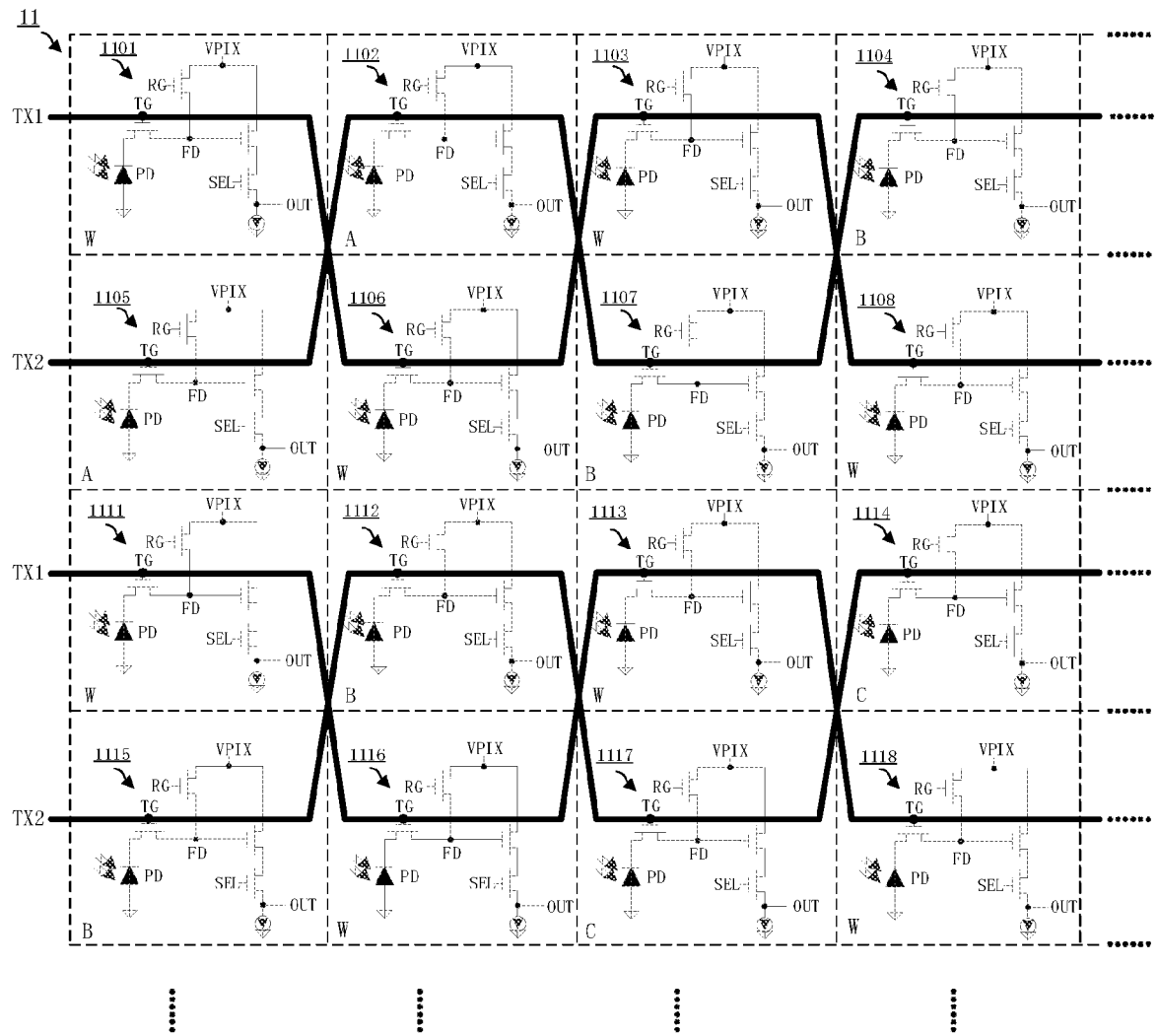
FIG. 16 is a schematic diagram of a connection of a pixel array and exposure control lines in an embodiment of the present disclosure.

FIG. 16 is a schematic diagram of a connection of a pixel array 11 and exposure control lines according to an embodiment of the present disclosure. The pixel array 11 is a two-dimensional pixel array. The two-dimensional pixel array includes a plurality of panchromatic pixels and a plurality of color pixels, wherein a spectral response of each of the color pixels is narrower than a spectral response of each of the panchromatic pixels. The pixels in the pixel array 11 are arranged as follows:

```
W A W B
A W B W
W B W C
B W C W
```

It should be noted that, for the convenience of illustration, FIG. 16 only shows some of the pixels in the pixel array 11, and other surrounding pixels and connecting lines are replaced by ellipsis " . . . ".

As shown in FIG. 16, the pixels 1101, 1103, 1106, 1108, 1111, 1113, 1116, and 1118 are panchromatic pixels W, the pixels 1102 and 1105 are first color pixels A (e.g., red pixels R), the pixels 1104 and 1107, 1112, and 1115 are second color pixels B (e.g., green pixels G), and the pixels 1114 and 1117 are third color pixels C (e.g., blue pixels Bu). It can be seen from FIG. 16 that the control terminals TG of the exposure control circuits in the panchromatic pixels W (pixels 1101, 1103, 1106, and 1108) are connected to a first-exposure control line TX1, and the control terminals TG of the exposure control circuits in the panchromatic pixels W (pixels 1111, 1113, 1116, and 1118) are connected to another first-exposure control line TX1; the control terminals TG of the exposure control circuits in the first color pixels A (pixels 1102 and 1105) and the second color pixel B (pixels 1104 and 1107) are connected to a second-exposure control line TX2, and the control terminals TG of the exposure control circuits in the second color pixel B (pixels 1112 and 1115) and the third color pixel C (pixels 1114 and 1117) are connected to another second-exposure control line TX2. Each first-exposure control line TX1 can control exposure duration of panchromatic pixels by using a first-exposure control signal; each second-exposure control line TX2 can control exposure duration of color pixels (e.g., the first color pixels A, the second-color pixels B, and the third-color pixels C) by using a second-exposure control signal. In such a way, independent control of the exposure duration of panchromatic pixels and color pixels can be implemented. For example, when the exposure of each of the panchromatic pixels ends, the color pixels continue to be exposed, so as to achieve an ideal imaging effect.

Please refer to FIGS. 2 and 16, the first-exposure control line TX1 and the second-exposure control line TX2 are connected to the vertical driving unit 12 in FIG. 2, and corresponding exposure control signals in the vertical driving unit 12 are transmitted to the control terminals TG of the exposure control circuits of the pixels in the pixel array 11.

It can be understood that, because there are a plurality of pixel row groups in the pixel array 11, the vertical driving unit 12 is connected to a plurality of first-exposure control lines TX1 and a plurality of second-exposure control lines TX2. The plurality of first-exposure control lines TX1 and the plurality of second-exposure control lines TX2 correspond to respective pixel row groups.

For example, a first first-exposure control line TX1 corresponds to the panchromatic pixels in first and second rows; a second first-exposure control line TX1 corresponds to the panchromatic pixels in third and fourth rows, by analogy, a third first-exposure control line TX1 corresponds to the panchromatic pixels in fifth and sixth rows; a fourth first-exposure control line TX1 corresponds to the panchromatic pixels in seventh and eighth rows, and other corresponding relationships between other first-exposure control lines TX1 and the panchromatic pixels will not be repeated. Timings of signals transmitted by different first-exposure control lines TX1 will also be different, and the timings of signals are configured by the vertical driving unit 12.

For example, a first second-exposure control line TX2 corresponds to the color pixels in the first and second rows; a second second-exposure control line TX2 corresponds to the color pixels in the third and fourth rows, by analogy, a third second-exposure control line TX2 corresponds to the color pixels in the fifth and sixth rows; a fourth second-exposure control line TX2 corresponds to the color pixels in the seventh and eighth rows, and other corresponding relationships between other second-exposure control lines TX2 and the panchromatic pixels will not be repeated. Timings of signals transmitted by different second-exposure control lines TX2 will also be different, and the timings of signals are configured by the vertical driving unit 12.

FIGS. 17 to 32 show examples of pixel arrangements in various image sensors 10 (shown in FIG. 2). Referring to FIGS. 2 and 17 to 32, the image sensor 10 includes a two-dimensional pixel array (i.e., the pixel array 11 shown in FIG. 16) composed of a plurality of color pixels (e.g., a plurality of first color pixels A, a plurality of second color pixels B, and a plurality of third color pixels C) and a plurality of panchromatic pixels W. A spectral response of each of the color pixels is narrower than a spectral response of each of the panchromatic pixels. A response spectrum of each of the color pixels is, for example, a part of a response spectrum of each of the panchromatic pixel W. The two-dimensional pixel array includes a minimum duplication unit (FIGS. 17 to 32 show examples of minimum duplication units of the pixel in various image sensors 10), wherein the two-dimensional pixel array consists of a plurality of minimum duplication units, and the minimum duplication units are duplicated and arranged in rows and columns. In the minimum duplication unit, the panchromatic pixels W are arranged in a first diagonal direction D1, and the color pixels are arranged in the second diagonal direction D2, wherein the first diagonal direction D1 is different from the second diagonal direction D2. The first-exposure time of each of at least two of the panchromatic pixels adjacent in the first diagonal direction D1 is controlled by the first-exposure signal, and the second-exposure time of each of at least two of the color pixels adjacent in the second diagonal direction D2 is controlled by the second-exposure signal, so as to realize the independent control of the exposure time of panchromatic pixels and the exposure time of color pixels. Each minimum duplication unit includes a plurality of sub-units, wherein each of the plurality of sub-units includes a plurality of monochromatic pixels (e.g., a plurality of first color pixels A, a plurality of second color pixels B, or a plurality of third color pixels C) and a plurality of panchromatic pixels W. For example, in conjunction with FIGS. 3 and 16, pixels 1101 to 1108 and pixels 1111 to 1118 form one of the minimum duplication units, wherein the pixels 1101, 1103, 1106, 1108, 1111, 1113, 1116, and 1118 are the panchromatic pixels, and the pixel 1102, 1104, 1105, 1107, 1112, 1114, 1115, and 1117 are the color pixels. Pixels 1101, 1102, 1105, and 1106 form one of the sub-units, wherein the pixels 1101 and 1106 are the panchromatic pixels, and the pixels 1102 and 1105 are the monochromatic pixels (i.e., the first color pixel A); the pixels 1103, 1104, 1107, and 1108 form one of the sub-units, wherein the pixels 1103 and 1108 are the panchromatic pixels, and the pixels 1104 and 1107 are the monochromatic pixels (i.e., the second color pixel B); the pixels 1111, 1112, 1115, and 1116 form one of the sub-units, wherein the pixels 1111 and 1116 are panchromatic pixels, and the pixels 1112 and 1115 are the monochromatic pixels (i.e., the second color pixel B); the pixels 1113, 1114, 1117, and 1118 form one of the sub-units, wherein the pixels 1113 and 1118 are the panchromatic pixels, and the pixels 1114 and 1117 are monochromatic pixels (e.g., the third-color pixel C).

For example, each of the minimum duplication units has the same number of pixels in rows and columns. For example, the minimum duplication unit includes, but is not limited to, the minimum duplication unit having 4 rows and 4 columns, 6 rows and 6 columns, 8 rows and 8 columns, and 10 rows and 10 columns. For example, each of the sub-units in each of the minimum duplication units has the same number of pixels in rows and columns. For example, the sub-unit includes, but is not limited to, the sub-unit having 2 rows and 2 columns, 3 rows and 3 columns, 4 rows and 4 columns, and 5 rows and 5 columns. This configuration helps to balance the resolution of the image in row and column directions and balance the color performance, improving the display effect.

Figure 17:
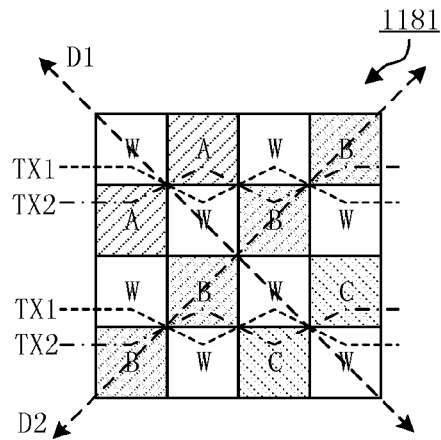
FIG. 17 is a schematic diagram of a pixel arrangement of a minimum duplication unit in an embodiment of the present disclosure.

For example, FIG. 17 is a schematic diagram of a pixel arrangement of a minimum duplication unit 1181 in an embodiment of the present disclosure, wherein the minimum duplication unit has 16 pixels in 4 rows and 4 columns, and the sub-unit has 4 pixels in 2 rows and 2 columns, and the arrangement is as follows:

W A W B
A W B W
W B W C
B W C W

In which, W represents one of the panchromatic pixels; A represents a first color pixel among the color pixels; B represents a second color pixel among the color pixels; C represents a third color pixel among the color pixels.

For example, as shown in FIG. 17, the panchromatic pixels W are arranged in the first diagonal direction D1 (i.e., a direction that connects an upper-left corner and a lower-right corner in FIG. 17), and the color pixels are arranged in the second diagonal direction D2 (e.g., a direction that connects a lower-left corner and an upper-right corner in FIG. 17), wherein the first diagonal direction D1 is different from the second diagonal direction D2. For example, the first diagonal and the second diagonal are perpendicular to each other. The first-exposure time of two of the panchromatic pixels W (e.g., two panchromatic pixels at positions of a first row and a first column, and a second row and a second column, from the upper-left corner) adjacent in the first diagonal direction D1 is controlled by the first exposure signal. The second-exposure time of at least two of the color pixels (e.g., two color pixels B at positions of a fourth row and the first column, and a third row and the second column, from the upper-left corner) adjacent in the second diagonal direction D2 is controlled by the second-exposure signal.

It should be noted that the first diagonal direction D1 and the second diagonal direction D2 are not limited to the diagonal, but also include directions parallel to the diagonal. For example, in FIG. 16, the panchromatic pixels 1101, 1106, 1113, and 1118 are arranged in the first diagonal direction D1, the panchromatic pixels 1103 and 1108 are also arranged in the first diagonal direction D1, and the panchromatic pixels 1111 and 1116 are also arranged in the first diagonal direction D1; the second color pixels 1104, 1107, 1112, and 1115 are arranged in the second diagonal direction D2, the first color pixels 1102 and 1105 are also arranged in the second diagonal direction D2, and the third color pixels 1114 and 1117 are also arranged in the second diagonal direction D2. Hereafter, explanations of the first diagonal direction D1 and the second diagonal direction D2 in FIGS. 18 to 32 below are the same as the explanations here. Herein, a "direction" is not a single orientation but can be understood as a concept of a "straight line" indicating an arrangement and can be bidirectional directions at both ends of the straight line.

It should be understood that the orientation or positional relationship here and hereinafter indicated by terms "upper," "lower," "left," "right," and the like is based on the orientation or positional relationship shown in the accompanying drawings and is only for convenience in the description of the present disclosure and simplify the description without indicating or implying that devices or elements referred to have to include a particular orientation, be constructed and operate in a particular orientation, and therefore should not be construed as a limitation to the present disclosure.

For example, as shown in FIG. 17, the panchromatic pixels in the first and second rows are connected together by a first-exposure control line TX1 formed in a shape of "W", so as to realize the independent control of the exposure time of each of the panchromatic pixels. The color pixels (A and B) in the first and second rows are connected together by a second-exposure control line TX2 formed in a shape of "W", so as to realize the independent control of the exposure time of each of the color pixels. The panchromatic pixels in the third and fourth rows are connected together by a first-exposure control line TX1 formed in a shape of "W", so as to realize the independent control of the exposure time of each of the panchromatic pixels. The color pixels (B and C) of the third and fourth rows are connected together by a second-exposure control line TX2 formed in a shape of "W", so as to realize the independent control of the exposure time of each of the color pixels. For example, the first-exposure signal is transmitted via the first-exposure control line TX1, and the second-exposure signal is transmitted via the second-exposure control line TX2. For example, the first-exposure control line TX1 is formed in the shape of "W" and is electrically connected to the control terminals of the exposure control circuits in the panchromatic pixels in two adjacent rows; the second-exposure control line TX2 is formed in the shape of "W" and is electrically connected to the control terminals of the exposure control circuits in the color pixels in two adjacent rows. A specific connection can be referred to as the description of relevant parts of FIGS. 3 and 16 regarding the connection and the pixel circuit.

It should be noted that the shape of "W" formed to the first-exposure control line TX1 and the second-exposure control line TX2 does not mean that physical wiring must be configured strictly according to the shape of "W" and can be done only the connection corresponding to the arrangement of the panchromatic pixels and color pixels. For example, the "W" type exposure control line configuration corresponds to the "W" type pixel arrangement. This configuration method is simple for wiring, and the resolution and color of the pixel arrangement have better effects, realizing the independent control of the exposure time of the panchromatic pixels and the exposure time of the color pixels at a low cost.

Figure 18:
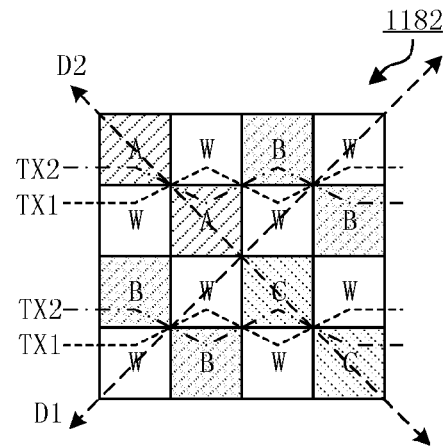
FIG. 18 is a schematic diagram of a pixel arrangement of another minimum duplication unit in an embodiment of the present disclosure.

For example, FIG. 18 is a schematic diagram of a pixel arrangement of another minimum duplication unit 1182 in an embodiment of the present disclosure. The minimum duplication unit has 16 pixels in 4 rows and 4 columns, and the sub-unit has 4 pixels in 2 rows and 2 columns, and the arrangement is as follows:

```
A W B W
W A W B
B W C W
W B W C
```

In which, W represents one of the panchromatic pixels; A represents a first color pixel among the color pixels; B represents a second color pixel among the color pixels; C represents a third color pixel among the color pixels.

For example, as shown in FIG. 18, the panchromatic pixels W are arranged in the first diagonal direction D1 (i.e., a direction that connects an upper-left corner and a lower-right corner in FIG. 18), and the color pixels are arranged in the second diagonal direction D2 (e.g., a direction that connects a lower-left corner and an upper-right corner in FIG. 18). For example, the first diagonal and the second diagonal are perpendicular to each other. The first-exposure time of two of the panchromatic pixels W (e.g., two panchromatic pixels at positions of a first row and a first column, and a second row and a second column, from the upper-left corner) adjacent in the first diagonal direction D1 is controlled by the first exposure signal. The second-exposure time of at least two of the color pixels (e.g., two color pixels A at positions of a fourth row and the first column, and a third row and the second column, from the upper-left corner) adjacent in the second diagonal direction is controlled by the second-exposure signal.

For example, as shown in FIG. 18, the panchromatic pixels in the first and second rows are connected together by a first-exposure control line TX1 formed in a shape of "W", so as to realize the independent control of the exposure time of each of the panchromatic pixels. The color pixels (A and B) in the first and second rows are connected together by a second-exposure control line TX2 formed in a shape of "W", so as to realize the independent control of the exposure time of each of the color pixels. The panchromatic pixels in the third and fourth rows are connected together by a first-exposure control line TX1 formed in a shape of "W", so as to realize the independent control of the exposure time of each of the panchromatic pixels. The color pixels (B and C) of the third and fourth rows are connected together by a second-exposure control line TX2 formed in a shape of "W", so as to realize the independent control of the exposure time of each of the color pixels.

Figure 19:
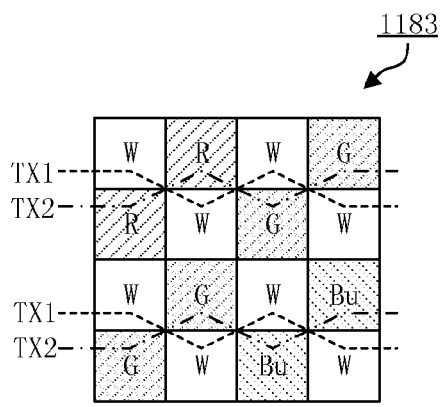
FIG. 19 is a schematic diagram of a pixel arrangement of another minimum duplication unit in an embodiment of the present disclosure.
Figure 20:
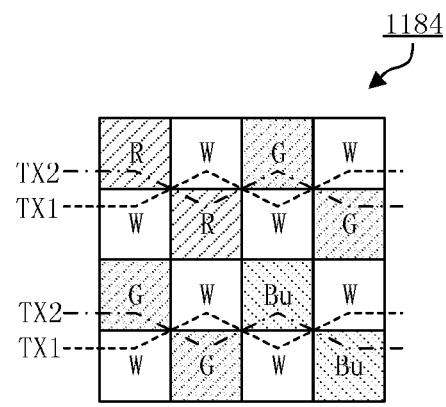
FIG. 20 is a schematic diagram of a pixel arrangement of another minimum duplication unit in an embodiment of the present disclosure.

For example, FIG. 19 is a schematic diagram of a pixel arrangement of another minimum duplication unit 1183 in an embodiment of the present disclosure. FIG. 20 is a schematic diagram of another minimum duplication unit 1184 pixel arrangement in an embodiment of the present disclosure. In the embodiments of FIGS. 19 and 20, corresponding to the arrangements of FIGS. 17 and 18 respectively, the first color pixel A is a red pixel R; the second color pixel B is a green pixel G; a third color pixel C is blue color pixel Bu.

It should be noted that, in some embodiments, a response band of the panchromatic pixel W is a visible light band (e.g., 400 nm to 760 nm). For example, the panchromatic pixel W is provided with an infrared optical filter to filter out infrared light. In some embodiments, the response band of the panchromatic pixel W is a visible light band and a near-infrared band (e.g., 400 nm to 1000 nm), matching a response band of the photoelectric conversion element 117 (e.g., photodiode, PD) in the image sensor 10. For example, the panchromatic pixel W may not be provided with an optical filter, and the response band of the panchromatic pixel W is determined by the response band of the photodiode, i.e., both match each other. The embodiments of the present disclosure include, but are not limited to, the above-mentioned band ranges.

Figure 21:
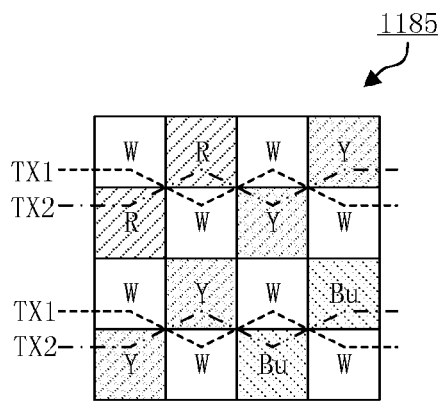
FIG. 21 is a schematic diagram of a pixel arrangement of another minimum duplication unit in an embodiment of the present disclosure.
Figure 22:
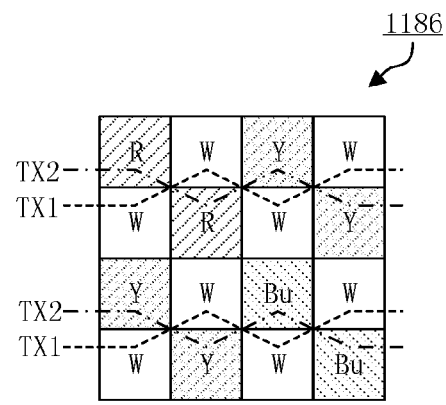
FIG. 22 is a schematic diagram of a pixel arrangement of another minimum duplication unit in an embodiment of the present disclosure.

For example, FIG. 21 is a schematic diagram of a pixel arrangement of another minimum duplication unit 1185 in an embodiment of the present disclosure. FIG. 22 is a schematic diagram of a pixel arrangement of another minimum duplication unit 1186 in an embodiment of the present disclosure. In the embodiments of FIGS. 21 and 22, corresponding to the arrangements of FIGS. 17 and 18 respectively, the first color pixel A is a red pixel R; the second color pixel B is a yellow pixel Y; the third color pixel C is a blue color pixel Bu.

Figure 23:
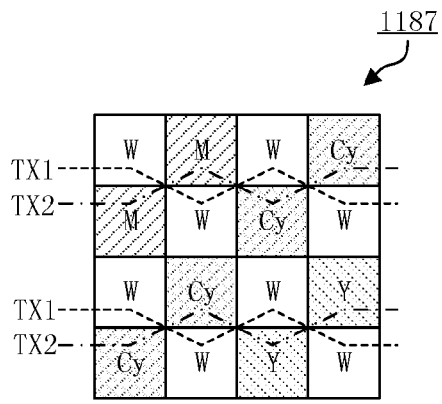
FIG. 23 is a schematic diagram of a pixel arrangement of another minimum duplication unit in an embodiment of the present disclosure.
Figure 24:
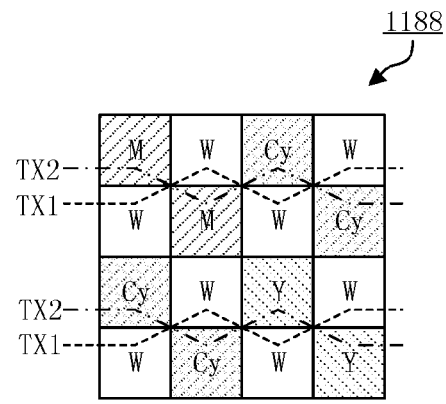
FIG. 24 is a schematic diagram of a pixel arrangement of another minimum duplication unit in an embodiment of the present disclosure.

For example, FIG. 23 is a schematic diagram of a pixel arrangement of another minimum duplication unit 1187 in an embodiment of the present disclosure. FIG. 24 is a schematic diagram of a pixel arrangement of another minimum duplication unit 1188 in an embodiment of the present disclosure. In the embodiments of FIGS. 23 and 24, corresponding to the arrangements of FIGS. 17 and 18 respectively, the first color pixel A is a magenta pixel M; the second color pixel B is a cyan pixel Cy; the third color pixel C is a yellow pixel Y.

Figure 25:
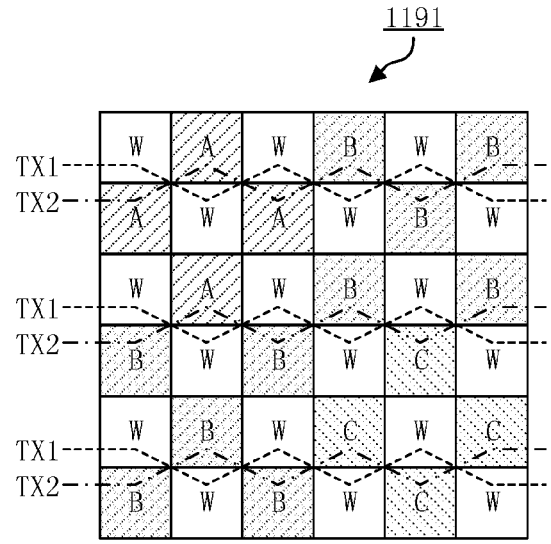
FIG. 25 is a schematic diagram of a pixel arrangement of another minimum duplication unit in an embodiment of the present disclosure.

For example, FIG. 25 is a schematic diagram of a pixel arrangement of another minimum duplication unit 1191 in an embodiment of the present disclosure. The minimum duplication unit has 36 pixels in 6 rows and 6 columns, and the sub-unit has 9 pixels in 3 rows and 3 columns. The arrangement is as follows:

```
W A W B W B
A W A W B W
W A W B W B
B W B W C W
W B W C W C
B W B W C W
```

In which, W represents one of the panchromatic pixels; A represents a first color pixel among the color pixels; B represents a second color pixel among the color pixels; C represents a third color pixel among the color pixels.

For example, as shown in FIG. 25, the panchromatic pixels in the first and second rows are connected together by a first-exposure control line TX1 formed in a shape of "W", so as to realize the independent control of the exposure time of each of the panchromatic pixels. The color pixels (A and B) in the first and second rows are connected together by a second-exposure control line TX2 formed in a shape of "W", so as to realize the independent control of the exposure time of each of the color pixels. The panchromatic pixels in the third and fourth rows are connected together by a first-exposure control line TX1 formed in a shape of "W", so as to realize the independent control of the exposure time of each of the panchromatic pixels. The color pixels (A, B, and C) in the third and fourth rows are connected together by a second-exposure control line TX2 formed in a shape of "W", so as to realize the independent control of the exposure time of each of the color pixels. The panchromatic pixels in the fifth row and the sixth row are connected together by a first-exposure control line TX1 formed in a shape of "W", so as to realize the independent control of the exposure time of each of the panchromatic pixels. The color pixels (B and C)

of the fifth and sixth rows are connected together by a second-exposure control line TX2 formed in a shape of "W", so as to realize the independent control of the exposure time of each of the color pixels.

Figure 26:
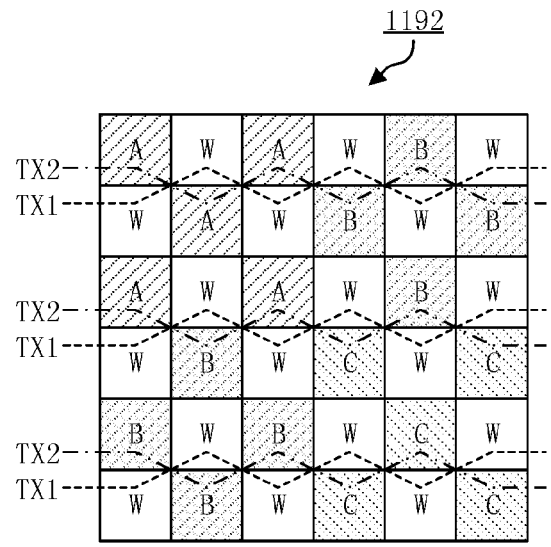
FIG. 26 is a schematic diagram of a pixel arrangement of another minimum duplication unit in an embodiment of the present disclosure.

For example, FIG. 26 is a schematic diagram of a pixel arrangement of another minimum duplication unit 1192 in an embodiment of the present disclosure. The minimum duplication unit has 36 pixels in 6 rows and 6 columns, and the sub-unit has 9 pixels in 3 rows and 3 columns. The arrangement is as follows:

| | | | | | |
|---|---|---|---|---|---|
| A | W | A | W | B | W |
| W | A | W | B | W | B |
| A | W | A | W | B | W |
| W | B | W | C | W | C |
| B | W | B | W | C | W |
| W | B | W | C | W | C |

In which, W represents one of the panchromatic pixels; A represents a first color pixel among the color pixels; B represents a second color pixel among the color pixels; C represents a third color pixel among the color pixels.

For example, as shown in FIG. 26, the panchromatic pixels in the first and second rows are connected together by a first-exposure control line TX1 formed in a shape of "W", so as to realize the independent control of the exposure time of each of the panchromatic pixels. The color pixels (A and B) in the first and second rows are connected together by a second-exposure control line TX2 formed in a shape of "W", so as to realize the independent control of the exposure time of each of the color pixels. The panchromatic pixels in the third and fourth rows are connected together by a first-exposure control line TX1 formed in a shape of "W", so as to realize the independent control of the exposure time of each of the panchromatic pixels. The color pixels (A, B, and C) in the third and fourth rows are connected together by a second-exposure control line TX2 formed in a shape of "W", so as to realize the independent control of the exposure time of each of the color pixels. The panchromatic pixels in the fifth row and the sixth row are connected together by a first-exposure control line TX1 formed in a shape of "W", so as to realize the independent control of the exposure time of each of the panchromatic pixels. The color pixels (B and C) of the fifth and sixth rows are connected together by a second-exposure control line TX2 formed in a shape of "W", so as to realize the independent control of the exposure time of each of the color pixels.

Figure 27:
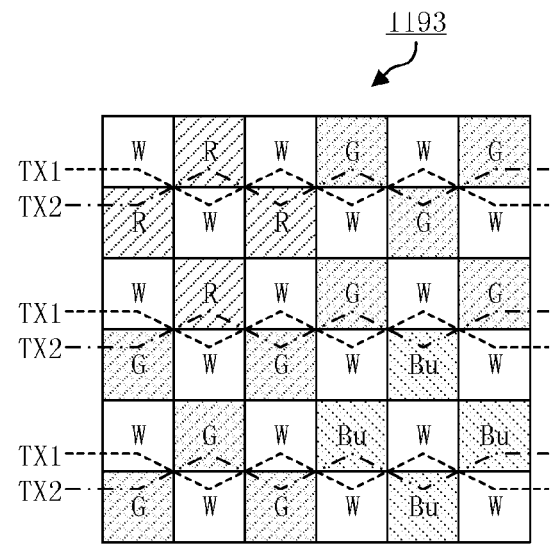
FIG. 27 is a schematic diagram of a pixel arrangement of another minimum duplication unit in an embodiment of the present disclosure.
Figure 28:
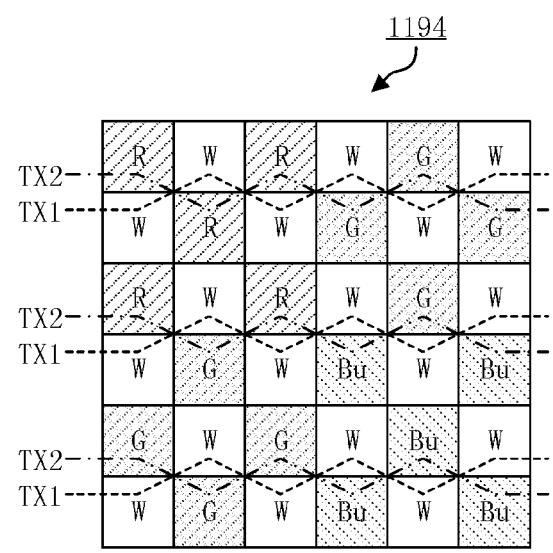
FIG. 28 is a schematic diagram of a pixel arrangement of another minimum duplication unit in an embodiment of the present disclosure.

For example, FIG. 27 is a schematic diagram of a pixel arrangement of another minimum duplication unit 1193 in an embodiment of the present disclosure. FIG. 28 is a schematic diagram of a pixel arrangement of another minimum duplication unit 1194 in an embodiment of the present disclosure. In the embodiments of FIGS. 27 and 28, corresponding to the arrangements of FIGS. 25 and 26 respectively, the first color pixel A is a red pixel R; the second color pixel B is a green pixel G; the third color pixel C is a blue pixel Bu.

For example, in other embodiments, the first color pixel A is a red pixel R; the second color pixel B is a yellow pixel Y; the third color pixel C is a blue pixel Bu. For example, in other embodiments, the first color pixel A is a magenta pixel M; the second color pixel B is a cyan pixel Cy; the third color pixel C is a yellow pixel Y. Embodiments of the present disclosure include but are not limited to the description here. Please refer to the above description for the specific connection of the circuit, which will not be repeated here.

Figures 29, 30:
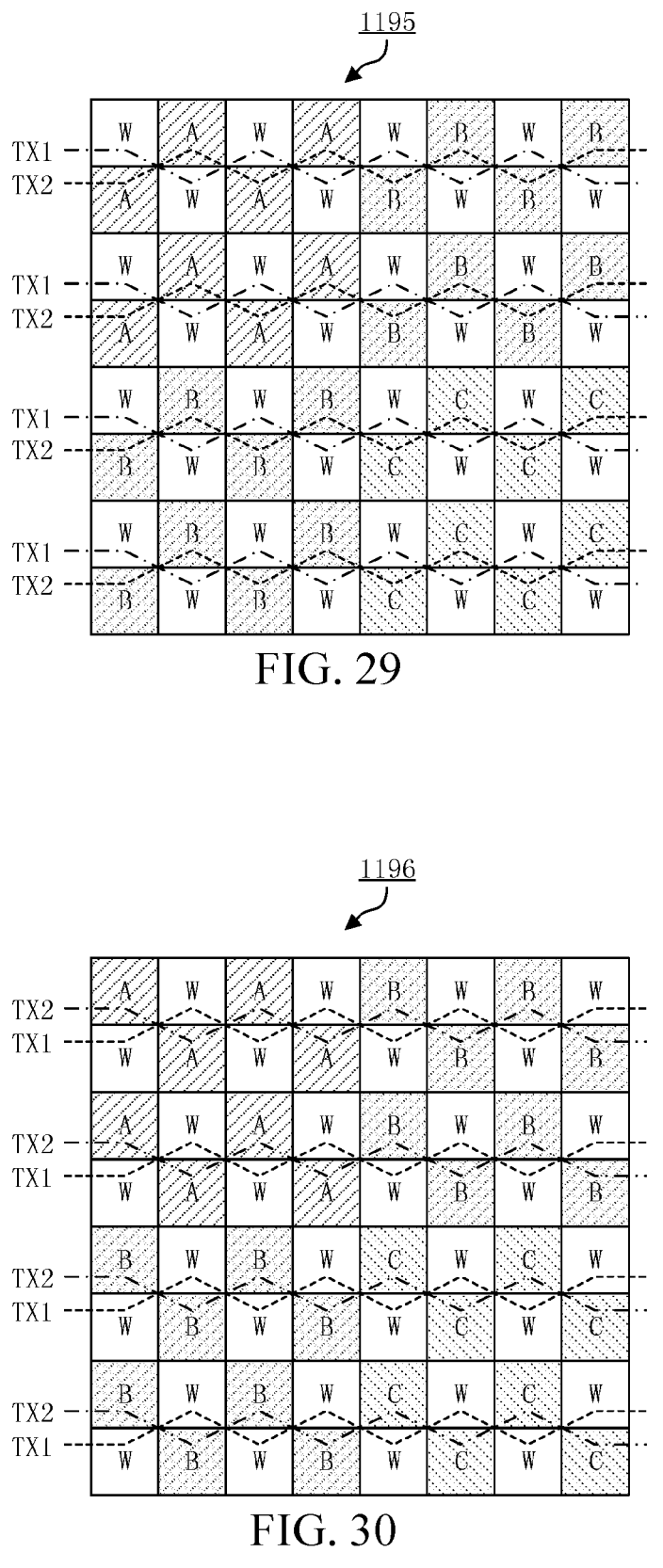

For example, FIG. 29 is a schematic diagram of a pixel arrangement of another minimum duplication unit 1195 in an embodiment of the present disclosure. The minimum duplication unit has 64 pixels in 8 rows and 8 columns, and the sub-unit has 16 pixels in 4 rows and 4 columns. The arrangement is as follows:

| | | | | | | | |
|---|---|---|---|---|---|---|---|
| W | A | W | A | W | B | W | B |
| A | W | A | W | B | W | B | W |
| W | A | W | A | W | B | W | B |
| A | W | A | W | B | W | B | W |
| W | B | W | B | W | C | W | C |
| B | W | B | W | C | W | C | W |
| W | B | W | B | W | C | W | C |
| B | W | B | W | C | W | C | W |

In which, W represents one of the panchromatic pixels; A represents a first color pixel among the color pixels; B represents a second color pixel among the color pixels; C represents a third color pixel among the color pixels.

For example, as shown in FIG. 29, the panchromatic pixels in the first and second rows are connected together by a first-exposure control line TX1 formed in a shape of "W", so as to realize the independent control of the exposure time of each of the panchromatic pixels. The color pixels (A and B) in the first and second rows are connected together by a second-exposure control line TX2 formed in a shape of "W", so as to realize the independent control of the exposure time of each of the color pixels. The panchromatic pixels in the third and fourth rows are connected together by a first-exposure control line TX1 formed in a shape of "W", so as to realize the independent control of the exposure time of each of the panchromatic pixels. The color pixels (A and B) of the third and fourth rows are connected together by a second-exposure control line TX2 formed in a shape of "W", so as to realize the independent control of the exposure time of each of the color pixels. The panchromatic pixels in the fifth row and the sixth row are connected together by a first-exposure control line TX1 formed in a shape of "W", so as to realize the independent control of the exposure time of each of the panchromatic pixels. The color pixels (B and C) of the fifth and sixth rows are connected together by a second-exposure control line TX2 formed in a shape of "W", so as to realize the independent control of the exposure time of each of the color pixels. The panchromatic pixels in the seventh and eighth rows are connected together by a first-exposure control line TX1 formed in a shape of "W", so as to realize the independent control of the exposure time of each of the panchromatic pixels. The color pixels (B and C) of the seventh and eighth row are connected together by a second-exposure control line TX2 formed in a shape of "W", so as to realize the independent control of the exposure time of each of the color pixels.

For example, FIG. 30 is a schematic diagram of a pixel arrangement of another minimum duplication unit 1196 in an embodiment of the present disclosure. The minimum duplication unit has 64 pixels in 8 rows and 8 columns, and the sub-unit has 16 pixels in 4 rows and 4 columns. The arrangement is as follows:

| | | | | | | | |
|---|---|---|---|---|---|---|---|
| A | W | A | W | B | W | B | W |
| W | A | W | A | W | B | W | B |
| A | W | A | W | B | W | B | W |
| W | A | W | A | W | B | W | B |
| B | W | B | W | C | W | C | W |
| W | B | W | B | W | C | W | C |

| | | | | | | | |
|---|---|---|---|---|---|---|---|
| B | W | B | W | C | W | C | W |
| W | B | W | B | W | C | W | C |

In which, W represents one of the panchromatic pixels; A represents a first color pixel among the color pixels; B represents a second color pixel among the color pixels; C represents a third color pixel among the color pixels.

For example, as shown in FIG. 30, the panchromatic pixels in the first and second rows are connected together by a first-exposure control line TX1 formed in a shape of "W", so as to realize the independent control of the exposure time of each of the panchromatic pixels. The color pixels (A and B) in the first and second rows are connected together by a second-exposure control line TX2 formed in a shape of "W", so as to realize the independent control of the exposure time of each of the color pixels. The panchromatic pixels in the third and fourth rows are connected together by a first-exposure control line TX1 formed in a shape of "W", so as to realize the independent control of the exposure time of each of the panchromatic pixels. The color pixels (A and B) of the third and fourth rows are connected together by a second-exposure control line TX2 formed in a shape of "W", so as to realize the independent control of the exposure time of each of the color pixels. The panchromatic pixels in the fifth row and the sixth row are connected together by a first-exposure control line TX1 formed in a shape of "W", so as to realize the independent control of the exposure time of each of the panchromatic pixels. The color pixels (B and C) of the fifth and sixth rows are connected together by a second-exposure control line TX2 formed in a shape of "W", so as to realize the independent control of the exposure time of each of the color pixels. The panchromatic pixels in the seventh and eighth rows are connected together by a first-exposure control line TX1 formed in a shape of "W", so as to realize the independent control of the exposure time of each of the panchromatic pixels. The color pixels (B and C) of the seventh and eighth row are connected together by a second-exposure control line TX2 formed in a shape of "W", so as to realize the independent control of the exposure time of each of the color pixels.

Figure 31:
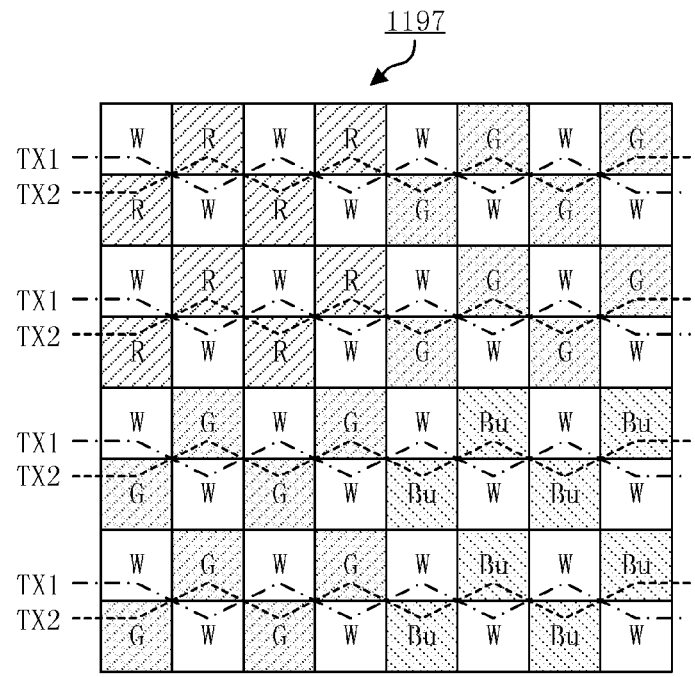
FIG. 31 is a schematic diagram of a pixel arrangement of another minimum duplication unit in an embodiment of the present disclosure.
Figure 32:
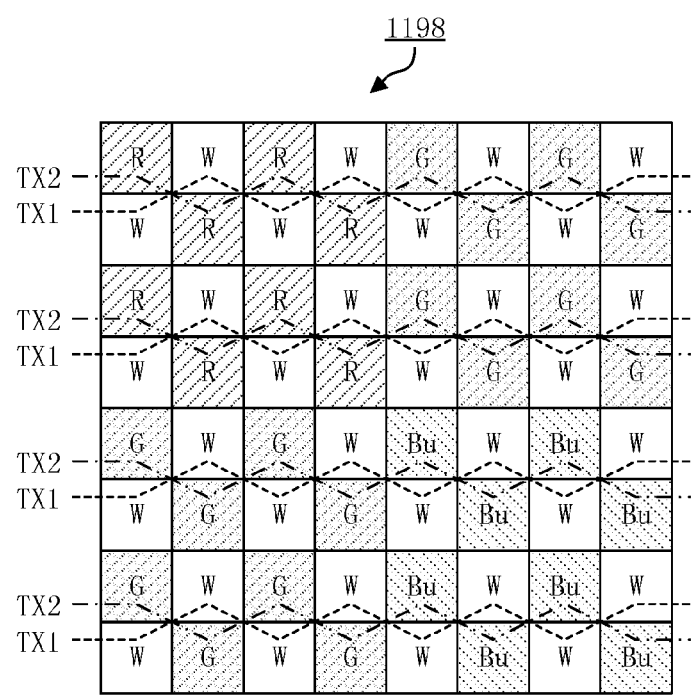
FIG. 32 is a schematic diagram of a pixel arrangement of another minimum duplication unit in an embodiment of the present disclosure.

For example, FIG. 31 is a schematic diagram of a pixel arrangement of another minimum duplication unit 1197 in an embodiment of the present disclosure. FIG. 32 is a schematic diagram of a pixel arrangement of another minimum duplication unit 1198 in an embodiment of the present disclosure. In the embodiments of FIGS. 31 and 32, corresponding to the arrangements in FIGS. 29 and 30 respectively, the first color pixel A is a red pixel R; the second color pixel B is a green pixel G; the third color pixel C is a blue pixel Bu.

For example, in other embodiments, the first color pixel A is a red pixel R; the second color pixel B is a yellow pixel Y; the third color pixel C is a blue pixel Bu. For example, the first color pixel A is a magenta pixel M; the second color pixel B is a cyan pixel Cy; the third color pixel C is a yellow pixel Y. Embodiments of the present disclosure include but are not limited to the description here. Please refer to the above description for the specific connection of the circuit, which will not be repeated here.

It can be seen from the above embodiments, as shown in FIGS. 17 to 32, the image sensor 10 (shown in FIG. 2) includes a plurality of color pixels and a plurality of panchromatic pixels W arranged in a matrix, wherein the color pixels and the panchromatic pixels are arranged and spaced apart in both row and column directions.

For example, the panchromatic pixel, the color pixel, the panchromatic pixel, the color pixel, . . . , and the like are alternately arranged in the row direction.

For example, the panchromatic pixel, the color pixel, the panchromatic pixel, the color pixel, . . . , and the like are alternately arranged in the column direction.

Please combine with FIG. 16, the first-exposure control line TX1 is electrically connected to the control terminals TG (e.g., the gate of the transfer transistor 112) of the exposure control circuits 116 in the panchromatic pixels W in the (2n−1)th and 2n-th rows; the second-exposure control line TX2 is electrically connected to the control terminals TG (e.g., the gate of the transfer transistor 112) of the exposure control circuits 116 in the color pixels in the (2n−1)th and 2n-th rows; wherein n is a natural number greater than or equal to 1.

For example, when n=1, the first-exposure control line TX1 is electrically connected to the control terminals TG of the exposure control circuits 116 in the panchromatic pixels W in the first and second rows; the second-exposure control line TX2 is electrically connected to the control terminals TG of the exposure control circuits 116 in the color pixels in the first and second row. When n=2, the first-exposure control line TX1 is electrically connected to the control terminals TG of the exposure control circuits 116 in the panchromatic pixels W in the third and fourth rows; the second-exposure control line TX2 is electrically connected to the control terminals TG of the exposure control circuits 116 in the color pixels in the third and fourth rows. By analogy, the descriptions will not be repeated here.

In some embodiments, the first-exposure time is less than the second-exposure time. The first-exposure time may be determined according to the n-well layer 1172 (shown in FIG. 4A) of each of the panchromatic pixels, and the second-exposure time may be determined according to the n-well layer 1172 (shown in FIG. 4A) of each of the color pixels.

Referring to FIG. 33, the present disclosure provides a camera assembly 40. The camera assembly 40 includes an image sensor 10, a processing chip 20, and a lens 30, described in any one of the above embodiments. The image sensor 10 is electrically connected to the processing chip 20. The lens 30 is provided on an optical path of the image sensor 10. The processing chip 20 may be encapsulated with the image sensor 10 and the lens 30, in a housing of the same camera assembly 40; alternatively, the image sensor 10 and the lens 30 may be encapsulated in the housing, and the processing chip 20 is provided outside the housing.

Figure 34:
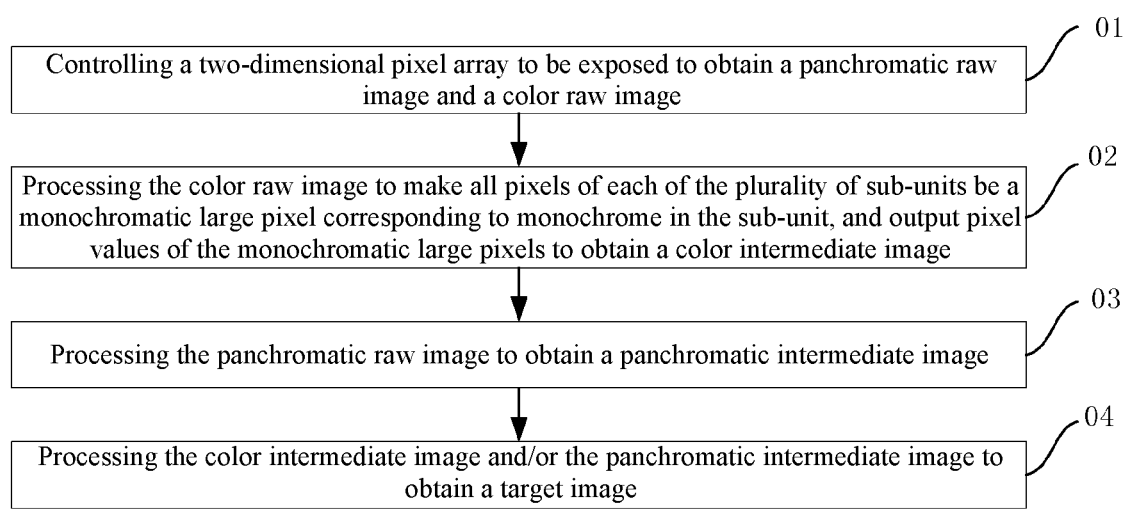
FIG. 34 is a schematic flowchart of an image acquisition method of some embodiments of the present disclosure.

The present application also provides an image acquisition method that can be applied to the camera assembly 40 of FIG. 33. As shown in FIG. 34, the image acquisition method includes:

01: controlling a two-dimensional pixel array to be exposed to obtain a panchromatic raw image and a color raw image;

02: processing the color raw image to make all pixels of each of the plurality of sub-units be a monochromatic large pixel corresponding to monochrome in the sub-unit, and output pixel values of the monochromatic large pixels to obtain a color intermediate image;

03: processing the panchromatic raw image to obtain a panchromatic intermediate image; and 04: processing the color intermediate image and/or the panchromatic intermediate image to obtain a target image.

Referring to FIGS. 2 and 33, the image acquisition method of the present disclosure can be implemented by the camera assembly 40. Step 01 may be implemented by the image sensor 10. Step 02, step 03, and step 04 may be implemented by the processing chip 20. Namely, the image sensor 10 can be exposed to obtain a panchromatic raw image and a color raw image. The processing chip 20 can be used to process the color raw image to make all pixels of each of the plurality of sub-units be a monochromatic large pixel corresponding to monochrome in the sub-unit, and output pixel values of the monochromatic large pixels to obtain a color intermediate image. The processing chip 20 may also be used to process the panchromatic raw image to obtain a panchromatic intermediate image and process the color intermediate image and/or the panchromatic intermediate image to obtain a target image.

Figure 35:
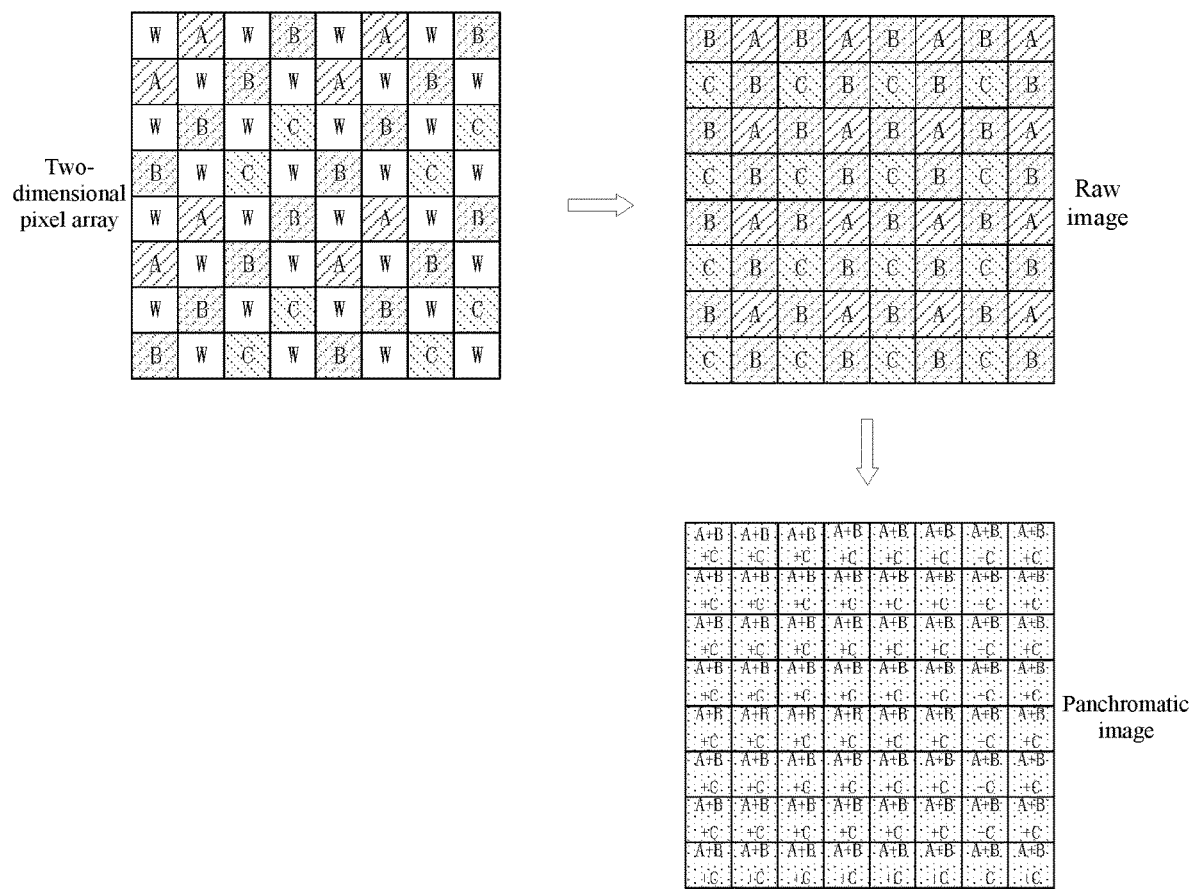
FIG. 35 is a schematic diagram of a principle of an image acquisition method in the related art.

Please refer to FIG. 35, in the related art, if a pixel array of an image sensor includes both panchromatic pixels and color pixels, when the image sensor is operating, the image sensor will make a pixel value of each panchromatic pixel be fitted to pixel values of other color pixels, in the pixel array, thereby outputting a raw image that includes only the color pixels. Specifically, taking pixels A as red pixels R, pixels B as green pixels G, and pixels C as blue pixels Bu as an example, after the column processing unit in the image sensor reads out pixel values of a plurality of red pixels R, pixel values of a plurality of green pixels G, pixel values of a plurality of blue pixels Bu, and pixel values of a plurality of panchromatic pixels W, the image sensor will first make the pixel value of each panchromatic pixel W be fitted to the red pixel R, the green pixel G, and the blue pixel Bu adjacent to the panchromatic pixel. Then, an image arranged in a non-Bayer array is converted into a raw image arranged in a Bayer array to be outputted for the processing chip to perform subsequent processing on the raw image, such as performing interpolation processing on the raw image to obtain a panchromatic image (the pixel value of each pixel in the panchromatic image is composed of three components of red, green, and blue), and the like. In such a processing method, the image sensor needs to execute a more complex algorithm, and the amount of calculation is relatively large. In addition, because a Qualcomm platform does not support the processing of images arranged in the non-Bayer array, it may be necessary to add additional hardware in the image sensor (such as an additional processing chip) to perform the process of converting the image arranged in the non-Bayer array into the raw image arranged in the Bayer array.

The image acquisition method and camera assembly 40 of the present disclosure can reduce the computation amount of the image sensor and avoid adding additional hardware in the image sensor.

Figure 36:
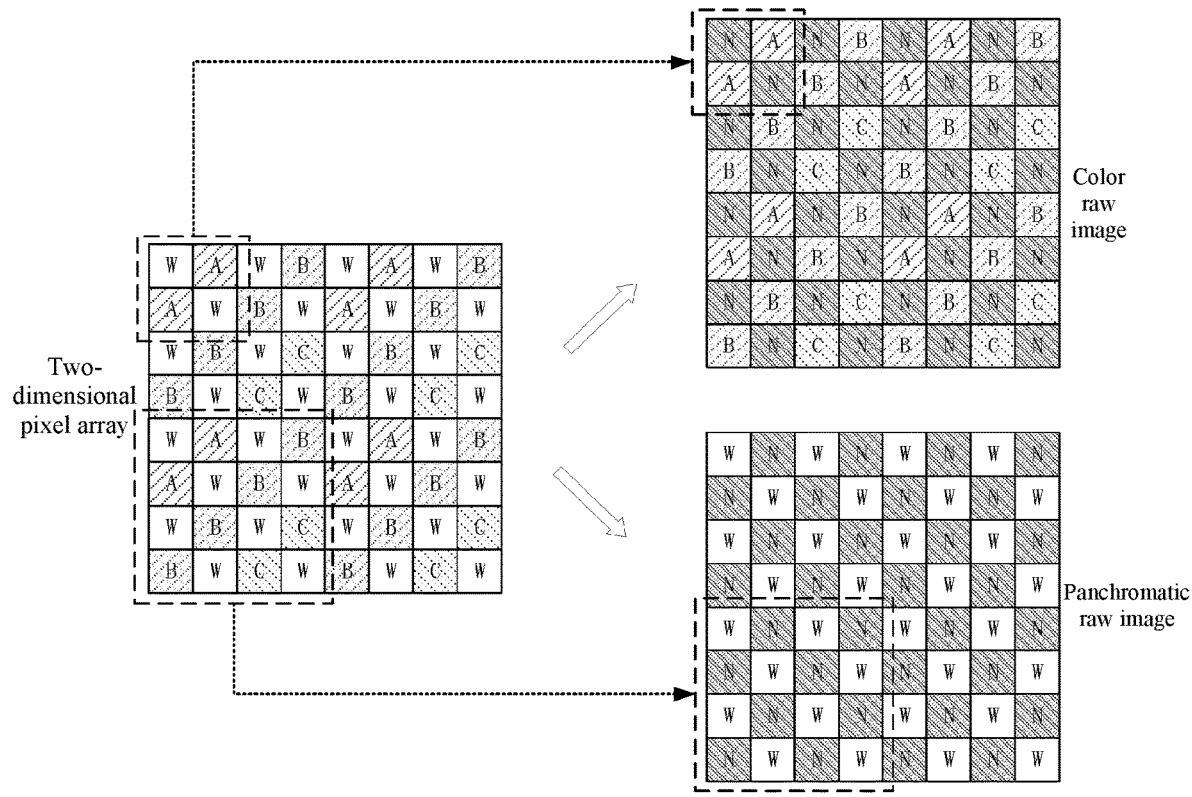
FIG. 36 is a schematic diagram of a principle of an optical image acquisition method in an embodiment of the present disclosure.

Specifically, please refer to FIGS. 2 and 36, when a user requests to photograph a picture, the vertical driving unit 12 in the image sensor 10 will control the panchromatic pixels and color pixels in the two-dimensional pixel array to be exposed, and the column processing unit 14 will read out the pixel value of each panchromatic pixel and the pixel value of each color pixel. The image sensor 10 does not perform an operation of fitting the pixel value of the panchromatic pixel to the pixel values of the color pixels, but directly outputs a panchromatic raw image according to the pixel values of the panchromatic pixels, and directly outputs a color raw image according to the pixel values of the color pixels.

As shown in FIG. 36, the panchromatic raw image includes a plurality of panchromatic pixels W and a plurality of empty pixels N (NULL), wherein the empty pixels are neither panchromatic pixels nor color pixels. In addition, a position where each of the empty pixels locates in the panchromatic raw image can be regarded as having no pixels at that position, or pixel values of the empty pixels may be regarded as zero. Comparing the two-dimensional pixel array with the panchromatic raw image, for each of the plurality of sub-units in the two-dimensional pixel array, the sub-unit includes two panchromatic pixels W and two color pixels (a color pixel A, a color pixel B, or a color pixel C). The panchromatic raw image also has one sub-unit corresponding to each of the plurality of sub-units in the two-dimensional pixel array. The sub-unit of the panchromatic raw image includes two panchromatic pixels W and two empty pixels N. Positions where the two empty pixels N locate correspond to positions where the two color pixels locate in the sub-unit of the two-dimensional pixel array.

Similarly, the color raw image includes a plurality of color pixels and a plurality of empty pixels N, wherein the empty pixels are neither panchromatic pixels nor color pixels. In addition, a position where each of the empty pixels locates in the color raw image can be regarded as having no pixels at that position, or pixel values of the empty pixels may be regarded as zero. Comparing the two-dimensional pixel array with the color raw image, for each of the plurality of sub-units in the two-dimensional pixel array, the sub-unit includes two panchromatic pixels W and two color pixels. The color raw image also has one sub-unit corresponding to each of the plurality of sub-units in the two-dimensional pixel array. The sub-unit of the color raw image includes two color pixels and two empty pixels N. Positions where the two empty pixels N locate correspond to positions where the two panchromatic pixels locate in the sub-unit of the two-dimensional pixel array.

Figure 37:
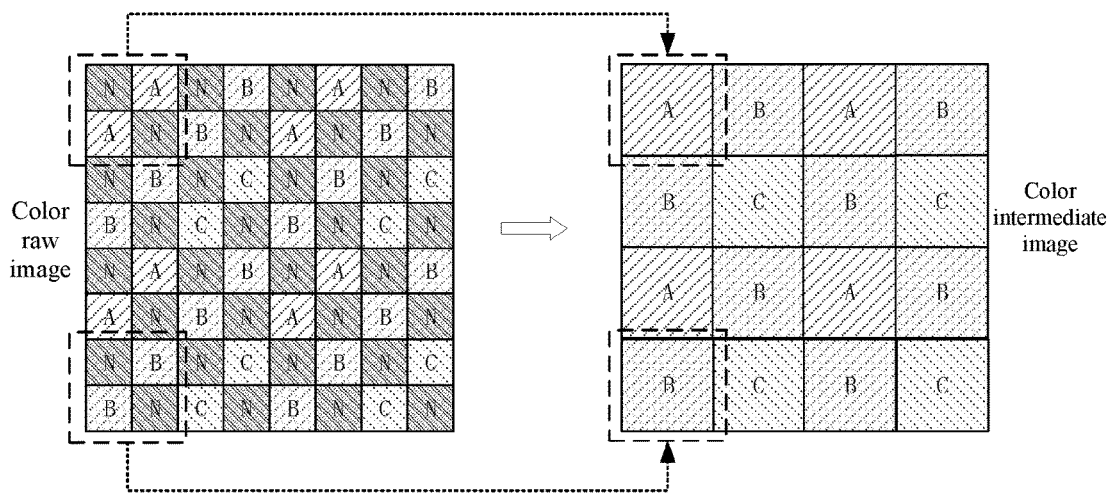
FIG. 37 is a schematic diagram of another principle of an optical image acquisition method in an embodiment of the present disclosure.

After the processing chip 20 receives the panchromatic raw image and the color raw image outputted by the image sensor 10, the processing chip 20 can further process the panchromatic raw image to obtain a panchromatic intermediate image and further process the color raw image to obtain a color intermediate image. For example, the color raw image may be converted into the color intermediate image in a manner shown in FIG. 37. As shown in FIG. 37, the color raw image includes a plurality of sub-units, wherein each sub-unit includes a plurality of empty pixels N and a plurality of monochromatic color pixels (also called monochromatic pixels). Specifically, some sub-units include two empty pixels N and two monochromatic pixels A, some sub-units include two empty pixels N and two monochromatic pixels B, and some sub-units include two empty pixels N and two monochromatic pixels C. The processing chip 20 can regard all pixels in the sub-unit including the empty pixels N and the monochromatic pixels A as a monochromatic large pixel A corresponding to the monochromatic pixels A in the sub-unit, regard all pixels in the sub-unit including the empty pixels N and the monochromatic pixels B as a monochromatic large pixels B corresponding to the monochromatic pixels B in the sub-unit, and regard all pixels in the sub-unit including the empty pixels N and the monochromatic pixels C as a monochromatic large pixel C in the sub-unit. Thus, the processing chip 20 can form a color intermediate image according to the plurality of monochromatic large pixels A, the plurality of monochromatic large pixels B, and the plurality of monochromatic large pixels C. If the color raw image including the plurality of empty pixels N is regarded as an image having a second resolution, the color intermediate image obtained by a method shown in FIG. 37 is an image having a first resolution, wherein the first resolution is smaller than the second resolution. After the processing chip 20 obtains the panchromatic intermediate image and the color intermediate image, the panchromatic intermediate image and/or the color intermediate image can be further processed to obtain a target image. Specifically, the processing chip 20 may only process the panchromatic intermediate image to obtain the target image; the processing chip 20 may also only process the color intermediate image to obtain the target image; the processing chip 20 may also process the panchromatic intermediate image and the color intermediate image simultaneously to obtain the target image. The processing chip 20 can determine a processing mode of the two intermediate images according to actual requirements.

In the image acquisition method of the embodiment of the present disclosure, the image sensor 10 can directly output the panchromatic raw image and the color raw image, and the subsequent processing for the panchromatic raw image and the color raw image is performed by the processing chip 20, and the image sensor 10 does not need to perform the operation of fitting the pixel values of the panchromatic pixel W to the pixel values of the color pixels to reduce the computation amount of the image sensor 10. In addition, there is no need to add new hardware in the image sensor 10 to support the image sensor 10 to perform image processing. The design of the image sensor 10 can be simplified.

In some embodiments, step 01 for controlling the two-dimensional pixel array to be exposed to obtain the panchromatic raw image and the color raw image can be implemented in various ways.

Figure 38:
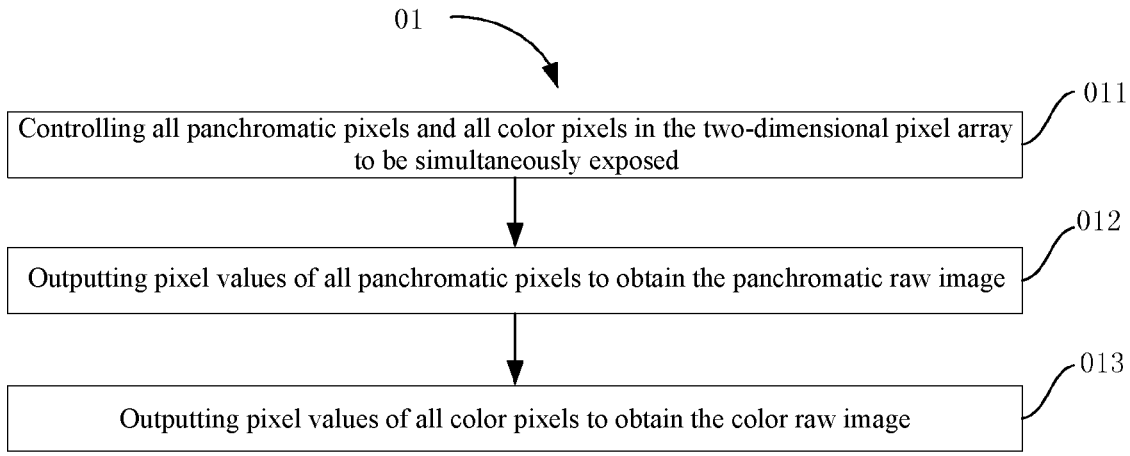
FIGS. 38 to 41 are schematic flowcharts of image acquisition methods according to some embodiments of the present disclosure.

Referring to FIG. 38, in one example, step 01 includes:
  011: controlling all panchromatic pixels and all color pixels in the two-dimensional pixel array to be simultaneously exposed;
  012: outputting pixel values of all panchromatic pixels to obtain the panchromatic raw image; and
  013: outputting pixel values of all color pixels to obtain the color raw image.

Referring to FIG. 33, step 011, step 012, and step 013 can all be implemented by the image sensor 10. Namely, all panchromatic pixels and all color pixels in image sensor 10 are simultaneously exposed. The image sensor 10 may output pixel values of all panchromatic pixels to obtain a panchromatic raw image, and may also output pixel values of all color pixels to obtain a color raw image.

Please refer to FIGS. 2 and 16, the panchromatic pixels and the color pixels can be exposed at the same time, wherein the exposure time of each of the panchromatic pixels can be less than or equal to the exposure time of each of the color pixels. Specifically, when the first-exposure time of the panchromatic pixel is equal to the second-exposure time of the color pixel, an exposure-starting moment and an exposure-stopping moment of the panchromatic pixel are the same as an exposure-starting moment and an exposure-stopping moment of the color pixel, respectively. When the first-exposure time is less than the second-exposure time, the exposure-starting moment of the panchromatic pixel is later than or equal to the exposure-starting moment of the color pixel, and the exposure-stopping moment of the panchromatic pixel is earlier than the exposure-stopping moment of the color pixel. Alternatively, when the first-exposure time is less than the second-exposure time, the exposure-starting moment of the panchromatic pixel is later than the exposure-starting moment of the color pixel, and the exposure-stopping moment of the panchromatic pixel is earlier than or equal to the exposure-stopping moment of the color pixel. After the panchromatic pixels and the color pixels are exposed completely, the image sensor 10 outputs the pixel values of all of the panchromatic pixels to obtain the panchromatic raw image and outputs the pixel values of all of the color pixels to obtain the color raw image. The panchromatic raw image may be output earlier than the color raw image; alternatively, the color raw image may be output earlier than the panchromatic raw image; alternatively, the panchromatic raw image and the color raw image may be output simultaneously. The output order of the above two images is not limited to the description here. Simultaneous exposure of panchromatic pixels and color pixels can reduce acquisition time of the panchromatic raw image and the color raw image to speed up an acquisition process of the panchromatic raw image and the color raw image. The simultaneous exposure of panchromatic pixels and color pixels has great advantages in modes that require high image output speed such as snapshot and continuous shooting.

Figure 39:
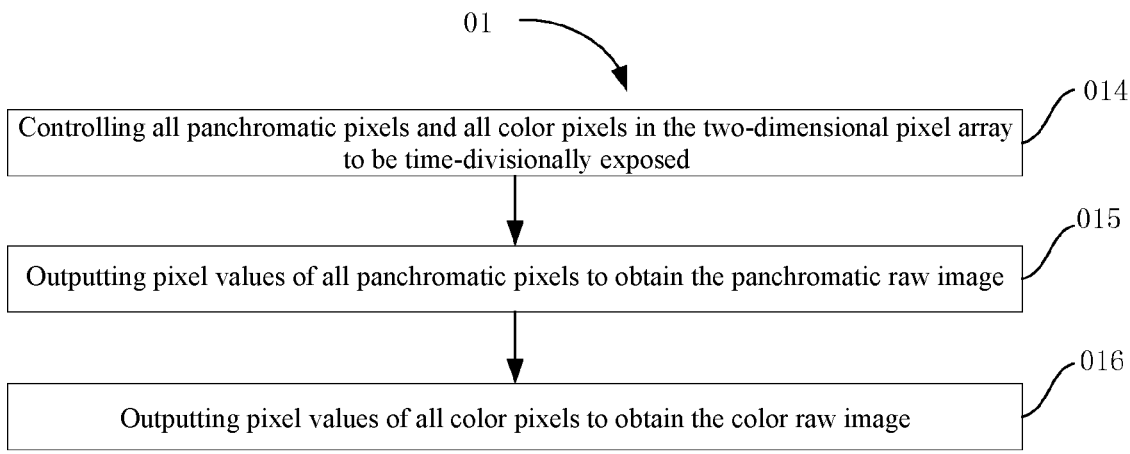

Referring to FIG. 39, in another example, step 01 includes:
  014: controlling all panchromatic pixels and all color pixels in the two-dimensional pixel array to be time-divisionally exposed;
  015: outputting pixel values of all panchromatic pixels to obtain the panchromatic raw image; and
  016: outputting pixel values of all color pixels to obtain the color raw image.

Referring to FIG. 33, all of step 014, step 015, and step 016 may be implemented by the image sensor 10. Namely, all of the panchromatic pixels and all of the color pixels in image sensor 10 are time-divisionally exposured. The image sensor 10 may output pixel values of all of the panchromatic pixels to obtain the panchromatic raw image, and may also output pixel values of all of the color pixels to obtain the color raw image.

Specifically, the panchromatic pixels and the color pixels may be time-divisionally exposed, wherein the exposure time of each of the panchromatic pixels may be less than or equal to the exposure time of each of the color pixels. Specifically, regardless of whether the first-exposure time and the second-exposure time are equal, time-divisional exposure of all panchromatic pixels and all color pixels may be as follows: (1) all of the panchromatic pixels are exposed for the first-exposure time first, and after all of the panchromatic pixels are exposed completely, all of the color pixels are then exposed for the second-exposure time; (2) all of the color pixels are exposed for the second-exposure time first, and after all of the color pixels are exposed completely, all of the panchromatic pixels are then exposed for the second-exposure time. After the panchromatic pixels and the color pixels are exposed completely, the image sensor 10 outputs the pixel values of all of the panchromatic pixels to obtain the panchromatic raw image and outputs the pixel values of all of the color pixels to obtain the color raw image. The output modes of the panchromatic raw image and the color raw image may be: (1) when the panchromatic pixels are exposed earlier than the color pixels, the image sensor 10 may output the panchromatic raw image during the exposure of the color pixels or may output the panchromatic raw image and the color raw image in sequence after the color pixels are exposed completely; (2) when the color pixels are exposed earlier than the panchromatic pixels, the image sensor 10 may output the color raw image during the exposure of the panchromatic pixels or may output the color raw image and the panchromatic raw image in sequence after the panchromatic pixels are exposed completely; (3) regardless of which one of the panchromatic pixels and the color pixels is preferentially exposed, the image sensor 10 can output the panchromatic raw image and color raw image simultaneously after all of the pixels are exposed. In this example, the control logic of the time-division exposure of panchromatic pixels and color pixels is relatively simple.

The image sensor 10 can simultaneously have the functions of controlling simultaneous exposure of panchromatic pixels and color pixels and controlling time-divisional exposure of panchromatic pixels and color pixels, as shown in FIGS. 38 and 39. Which one exposure mode used by the image sensor 10 for capturing images can be independently selected according to actual needs. For example, in a mode of snapshot, continuous shooting, and the like, simultaneous exposure can be used to meet the needs of quick image output; in an ordinary photographing mode, time-divisional exposure can be used to simplify control logic, and the like.

In the two examples shown in FIGS. 38 and 39, the exposure order of the panchromatic pixels and the color pixels can be controlled by the control unit 13 in the image sensor 10.

In the two examples shown in FIGS. 38 and 39, the exposure time of each of the panchromatic pixels can be controlled by the first-exposure signal, and the exposure time of each of the color pixels can be controlled by the second-exposure signal.

Specifically, in conjunction with FIG. 16, as an example, the image sensor 10 may use the first-exposure signal to control at least two of the panchromatic pixels adjacent in the first diagonal direction to be exposed for the first-exposure time, and use the second-exposure signal to control at least two of the color pixels adjacent in the second diagonal direction to be exposed for the second-exposure time, wherein the first-exposure time may be less than or equal to the second-exposure time. Specifically, the vertical driving unit 12 in the image sensor 10 transmits a first-exposure signal via the first-exposure control line TX1 to control at least two of the panchromatic pixels adjacent in the first diagonal direction to be exposed for the first-exposure time, and the vertical driving unit 12 transmits a second-exposure signal via the second-exposure control line TX2 to control at least two of the panchromatic pixels adjacent in the second diagonal direction to be exposed for the second-exposure time. After all of the panchromatic pixels and all of the color pixels are exposed, as shown in FIG. 36, the image sensor 10 does not perform a process of fitting the pixel values of the panchromatic pixels to the pixel values of the color pixels, but directly outputs a panchromatic raw image and a color raw image.

Please refer to FIGS. 2 and 17, as another example, the image sensor 10 can use the first-exposure signal to control the panchromatic pixels in the (2n−1)th and the (2n)th rows to be exposed for the first-exposure time, and use the second-exposure signal to control the color pixels in the (2n−1)th and the (2n)th rows to be exposed for the second-exposure time, wherein the first-exposure time may be less than or equal to the second-exposure time. Specifically, the first-exposure control line TX1 in the image sensor 10 is connected to the control terminals TG of all of the panchromatic pixels in (2n−1)th and 2n-th rows, and the second-exposure control line TX2 is connected to the control terminals TG of all of the color pixels in (2n−1)th and 2n-th rows. The vertical driving unit 12 transmits the first-exposure signal via the first-exposure control line TX1 to control the panchromatic pixels in the (2n−1)th and the 2n-th rows to be exposed for the first-exposure time, and transmits the second-exposure signal via the second-exposure control line TX2 to control the color pixels in the (2n−1)th and the 2n-th rows to be exposed for the second-exposure time. After all of the panchromatic pixels and all of the color pixels are exposed completely, as shown in FIG. 36, the image sensor 10 does not perform the process of fitting the pixel values of panchromatic pixels to the pixel values of the color pixels, but directly outputs a panchromatic raw image and a color raw image.

In some embodiments, the processing chip 20 may determine a relative relationship between the first-exposure time and the second-exposure time according to ambient luminance. For example, the image sensor 10 may control the panchromatic pixels to be exposed and output one panchromatic raw image, and the processing chip 20 analyzes the pixel values of the panchromatic pixels in the panchromatic raw image to determine the ambient luminance. When the ambient luminance is less than or equal to a luminance threshold, the image sensor 10 controls the panchromatic pixels to be exposed for the first-exposure time equal to the second-exposure time. When the ambient luminance is greater than the luminance threshold, the image sensor 10 controls the panchromatic pixels to be exposed for the first-exposure time less than the second-exposure time. When the ambient luminance is greater than the luminance threshold, the relative relationship between the first-exposure time and the second-exposure time can be determined according to a luminance difference between the ambient luminance and the luminance threshold. For example, the greater the luminance difference, the smaller the ratio of the first exposure time to the second exposure time. For example, when the luminance difference is within a first range [a, b), the ratio of the first-exposure time to the second-exposure time is V1:V2; when the luminance difference is within the second range [b, c), the ratio of the first-exposure time to the second-exposure time is V1:V3; when the luminance difference is greater than or equal to c, the ratio of the first-exposure time to the second-exposure time is V1:V4, where V1<V2<V3<V4.

Figure 40:
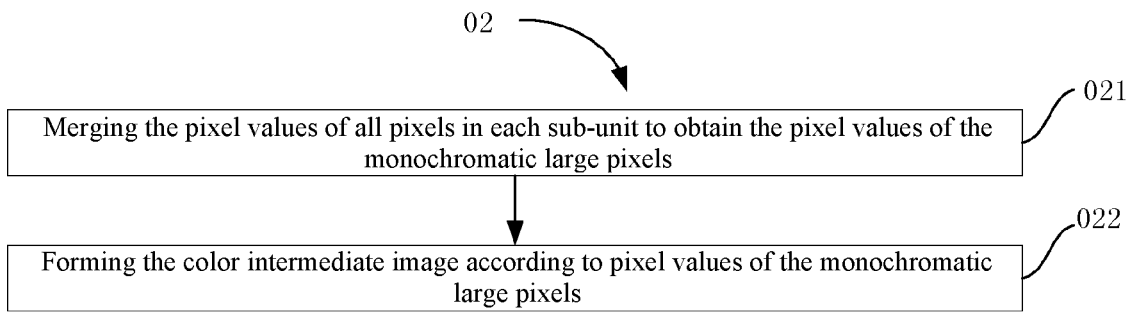

Referring to FIG. 40, in some embodiments, step 02 includes:
  021: merging the pixel values of all pixels in each sub-unit to obtain the pixel values of the monochromatic large pixels; and
  022: forming the color intermediate image according to pixel values of the monochromatic large pixels, wherein the color intermediate image has a first resolution.

Referring to FIG. 33, in some embodiments, both steps 021 and 022 may be implemented by the processing chip 20. In other words, the processing chip 20 can be used to merge the pixel values of all of the pixels in each of the plurality of sub-units to obtain the pixel values of the monochromatic large pixels and form a color intermediate image according to the pixel values of the plurality of monochromatic large pixels, wherein the image has the first resolution. The color intermediate image has the first resolution.

Specifically, as shown in FIG. 37, for a monochromatic large pixel A, the processing chip 20 may add the pixel values of all of the pixels in the sub-unit including the empty pixels N and the monochromatic pixels A, and use an addition result as the pixel value of the monochromatic large pixel A corresponding to the sub-unit, wherein the pixel values of the empty pixels N can be regarded as zero, which is the same below; the processing chip 20 may add the pixel values of all of the pixels in the sub-unit including the empty pixels N and the monochromatic pixels B, and use an addition result as the pixel value of the monochromatic large pixel B corresponding to the sub-unit; the processing chip 20 may add the pixel values of all of the pixels in the sub-unit including the empty pixels N and the monochromatic pixels C, and use an addition result as the pixel value of the monochromatic large pixel C corresponding to the sub-unit. In such a way, the processing chip 20 can obtain the pixel values of the plurality of monochromatic large pixels A, the pixel values of the plurality of monochromatic large pixels B, and the pixel values of the plurality of monochromatic large pixels C. The processing chip 20 then forms one color intermediate image according to the pixel values of the plurality of monochromatic large pixels A, the pixel values of the plurality of monochromatic large pixels B, and the pixel values of the plurality of monochromatic large pixels C. As shown in FIG. 37, when monochrome A is red R, monochrome B is green G, and monochrome C is blue Bu, the color intermediate image is the image arranged in the Bayer array. Certainly, the method in which the processing chip 20 obtains the color intermediate image is not limited to the description here.

Figure 41:
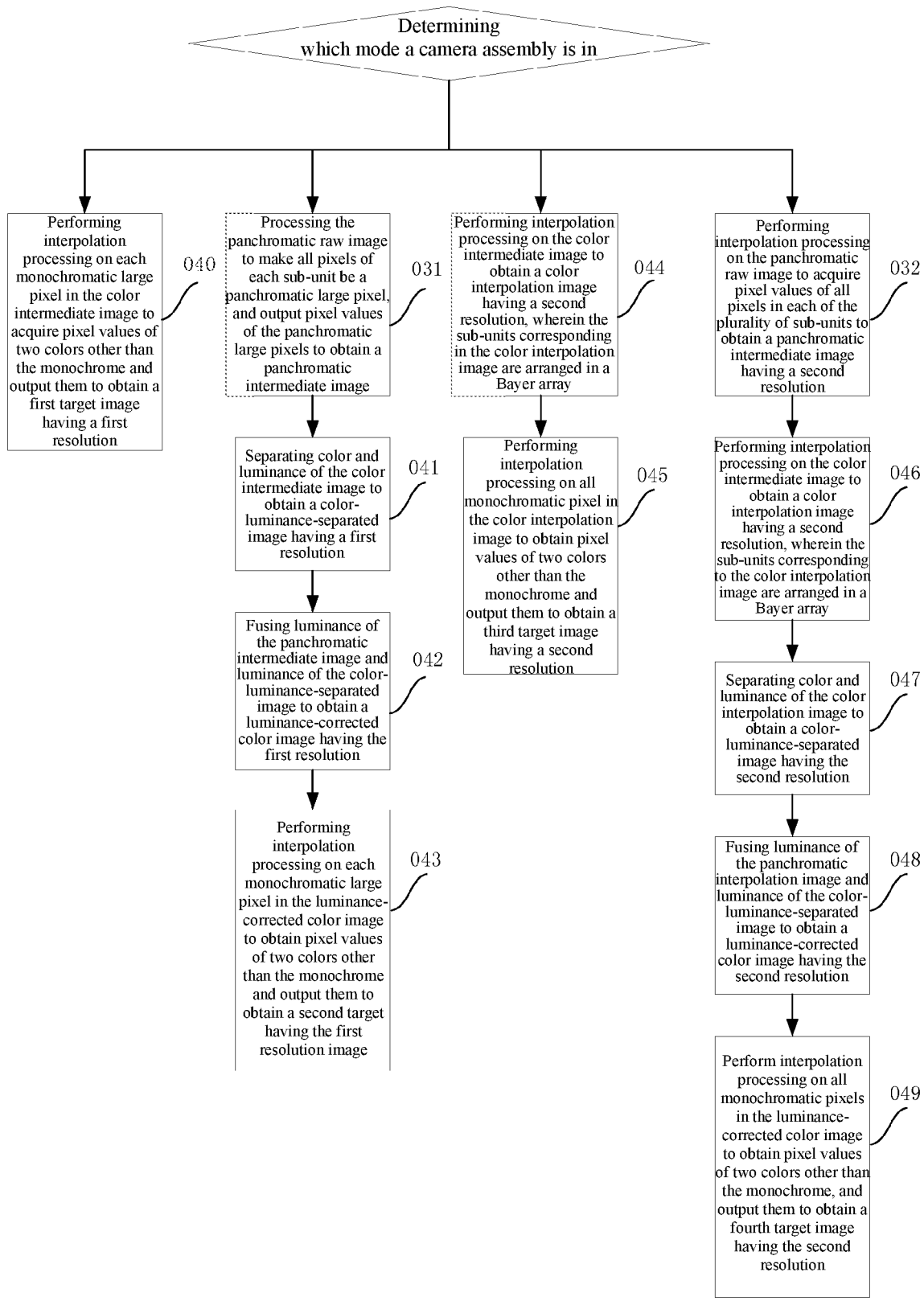

In some embodiments, referring to FIGS. 33 and 41, when the camera assembly 40 is in different modes, different modes correspond to different target images. The processing chip 20 first determines which mode the camera assembly 40 is in, and then performs corresponding processing on the color intermediate image and/or the panchromatic intermediate image according to the mode in which the camera assembly 40 is in to obtain a target image corresponding to the mode. The target image includes at least four types of target images: a first target image, a second target image, a third target image, and a fourth target image. The modes in which the camera assembly 40 is in include at least: (1) the mode is a preview mode, and the target image in the preview mode can be the first target image or the second target image; (2) the mode is an imaging mode, and the target image in the imaging mode can be the second target image, the third target image, or the fourth target image; (3) the mode is both the preview mode and a low-power-consumption mode, and the target image is the first target image; (4) the mode is both the preview mode and a non-low-power-consumption mode, and the target image is the second target image; (5) the mode is both the imaging mode and the low-power-consumption mode, and the target image is the second target image or the third target image; (6) the mode is both the imaging mode and the non-low-power-consumption mode, and the target image is the fourth target image.

Referring to FIG. 41, in one example, when the target image is the first target image, step 04 includes:
- 040: performing interpolation processing on each monochromatic large pixel in the color intermediate image to acquire pixel values of two colors other than the monochrome and output them to obtain a first target image having a first resolution.

Referring to FIG. 33, step 040 may be implemented by the processing chip 20. In other words, the processing chip 20 can be used to perform interpolation processing on each monochromatic large pixel in the color intermediate image to obtain the pixel values of the two colors other than the monochrome and output them to obtain the first target image having the first resolution.

Figure 42:
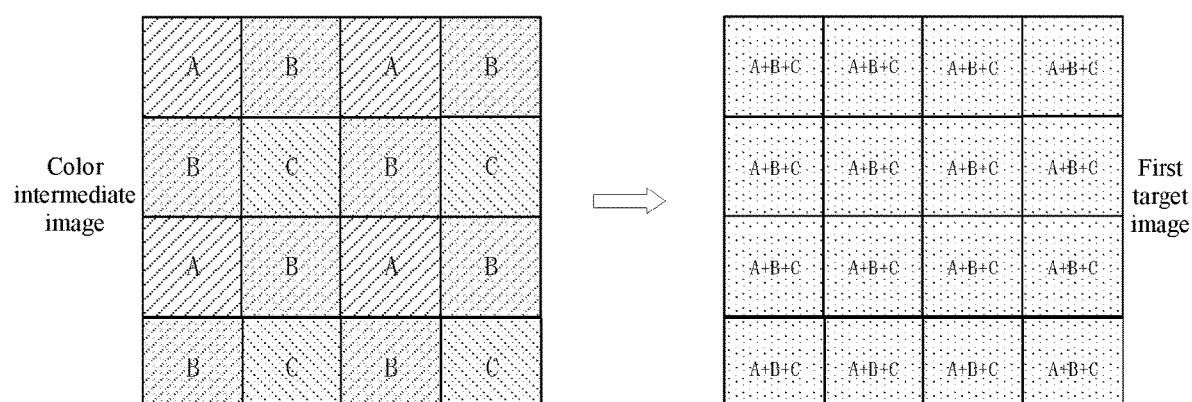
FIG. 42 is a schematic diagram of another optical image acquisition method in the embodiment of the present disclosure.

Specifically, in conjunction with FIG. 42, assuming that the monochromatic large pixel A is the red pixel R, the monochromatic large pixel B is the green pixel G, and the monochromatic large pixel C is the blue pixel Bu, then the color intermediate image is arranged in the Bayer array, and the processing chip 20 needs to perform demosaicing (i.e., interpolation processing) on the color intermediate image, so that the pixel value of each monochromatic large pixel has three components of R, G, and B at the same time. For example, linear interpolation may be used to calculate the pixel values of the two colors other than the monochrome of the monochromatic large pixel. Taking a monochromatic large pixel $C_{2,2}$ ("$C_{2,2}$" means the pixel C in the second row and second column, from the upper left corner) as an example, the monochromatic large pixel $C_{2,2}$ only has the pixel value $P(C_{2,2})$ of the component of color C, it is also necessary to calculate the pixel value $P(A_{2,2})$ of color A and the pixel value $P(B_{2,2})$ of color B at the position of monochromatic large pixel C, then $P(A_{2,2})=\alpha_1 \cdot P(A_{3,1}) + \alpha_2 P(A_{3,3}) + \alpha_3 \cdot P(A_{1,3}) + \alpha 4 \cdot P(A_{1,1})$, $P(B_{2,2}) = \beta_1 \cdot P(B_{1,2}) + \beta_2 \cdot P(B_{2,1}) + \beta_3 \cdot P(B_{2,3}) + \beta_4 \cdot P(B_{3,2})$, wherein $\alpha_1 \sim \alpha_4$ and $\beta_1 \sim \beta_4$ are interpolation coefficients, $\alpha_1+\alpha_2+\alpha_3+\alpha_4=1$, and $\beta_1+\beta_2+\beta_3+\beta_4=1$. The above calculation methods of $P(A_{2,2})$ and $P(B_{2,2})$ are only an example. $P(A_{2,2})$ and $P(B_{2,2})$ can also be calculated by other interpolation methods other than linear interpolation methods, which are not limited to the description here.

After the processing chip 20 calculates the pixel values of the three components of each monochromatic large pixel, it can calculate a final pixel value corresponding to the monochromatic large pixel according to the three pixel values, that is, A+B+C. It needs to be explained that, A+B+C here does not mean directly adding three pixels to obtain the final pixel value of the monochromatic large pixel, but only means that the monochromatic large pixel includes three color components of A, B, and C. The processing chip 20 may form one first target image according to the final pixel values of the plurality of monochromatic large pixels. Because the color intermediate image has the first resolution, the first target image is obtained by interpolation processing of the color intermediate image, and the processing chip 20 does not perform interpolation processing on the color intermediate image. Therefore, the resolution of the first target image is also the first resolution. The processing algorithm in which the processing chip 20 processes the color intermediate image to obtain the first target image is relatively simple, and the processing speed is relatively fast. The camera assembly 40 uses the first target image as a preview image when the mode is both the preview mode and the low-power-consumption mode, which can not only meet the demand for image output speed in the preview mode, but also save the power consumption of the camera assembly 40.

Please refer to FIG. 41 again, in another example, when the target image is the second target image, step 03 includes:
- 031: processing the panchromatic raw image to make all pixels of each sub-unit be a panchromatic large pixel, and output pixel values of the panchromatic large pixels to obtain a panchromatic intermediate image, wherein the panchromatic intermediate image has the first resolution;

Step 04 includes:
- 041: separating color and luminance of the color intermediate image to obtain a color-luminance-separated image having a first resolution;
- 042: fusing luminance of the panchromatic intermediate image and luminance of the color-luminance-separated image to obtain a luminance-corrected color image having the first resolution; and
- 043: performing interpolation processing on each monochromatic large pixel in the luminance-corrected color image to obtain pixel values of two colors other than the monochrome and output them to obtain a second target having the first resolution image.

Referring to FIG. 33, step 031, step 041, step 042, and step 043 can be implemented by the processing chip 20. In other words, the processing chip 20 can be used to process the panchromatic raw image to make all pixels of each of the plurality of sub-units be a panchromatic large pixel, and output pixel values of the panchromatic large pixels to obtain the panchromatic intermediate image, wherein the panchromatic intermediate image has the first resolution. The processing chip 20 can also be used to separate color and luminance of the color intermediate image to obtain the color-luminance-separated image having the first resolution, fuse luminance of the panchromatic intermediate image and luminance of the color-luminance-separated image to obtain the luminance-corrected color image having the first resolution, and perform interpolation processing on each of the monochromatic large pixels in the luminance-corrected color image to obtain pixel values of two colors other than the monochrome and output them to obtain the second target having the first resolution image.

Figure 43:
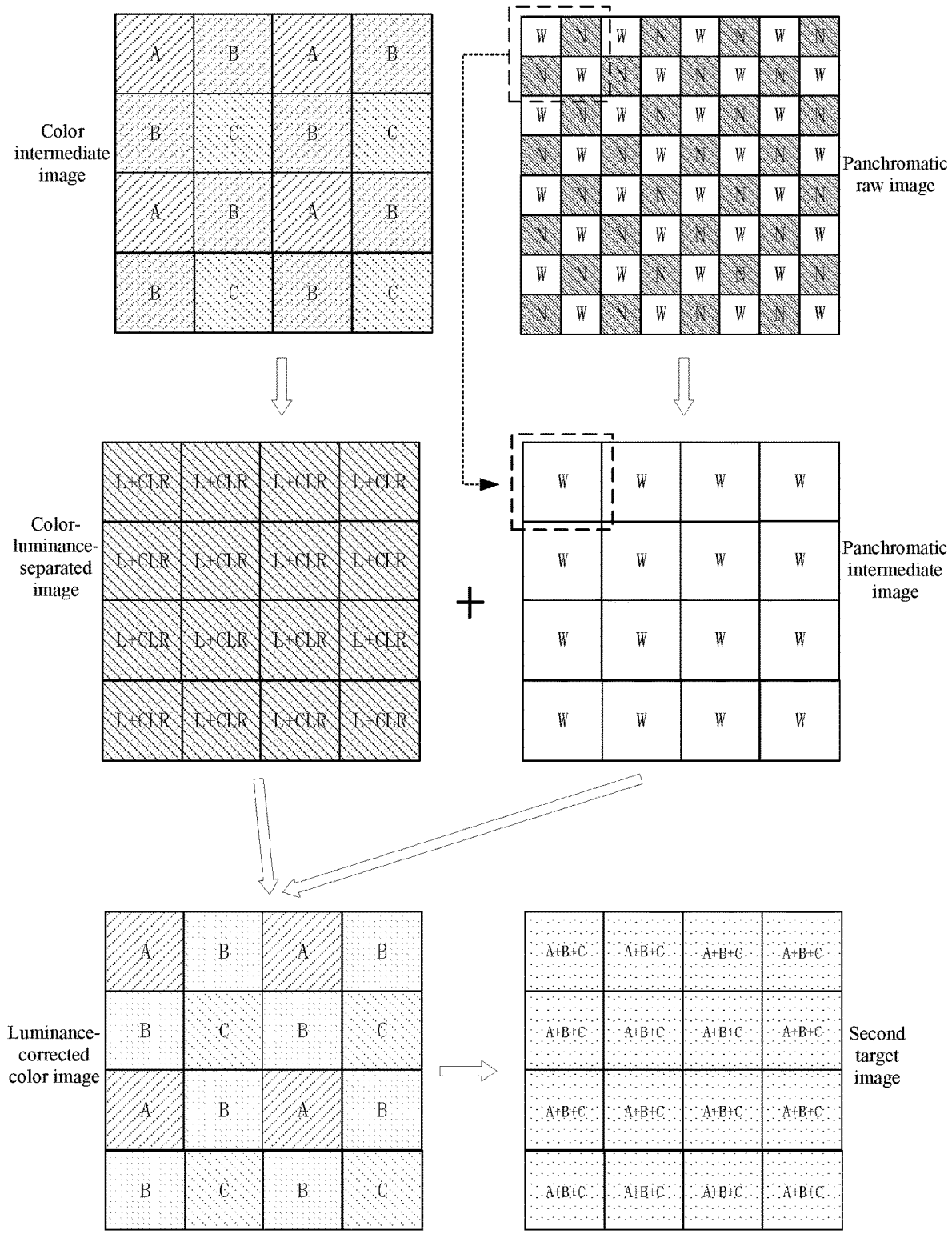
FIG. 43 is a schematic diagram of another optical image acquisition method in the embodiment of the present disclosure.

Specifically, the panchromatic raw image can be converted into a panchromatic intermediate image in a manner shown in FIG. 43. As shown in FIG. 43, the panchromatic raw image includes a plurality of sub-units, wherein each of the plurality of sub-units includes two null pixels N and two panchromatic pixels W. The processing chip 20 may regard all of the pixels in each sub-unit including the empty pixels N and the panchromatic pixels W as the panchromatic large pixel W corresponding to the sub-unit. In such a way, the processing chip 20 can form one panchromatic intermediate image according to the plurality of panchromatic large pixels W. If the panchromatic raw image including the plurality of empty pixels N is regarded as an image having the second resolution, the panchromatic intermediate image obtained by a method shown in FIG. 43 is an image having the first resolution, wherein the first resolution is smaller than the second resolution.

As an example, the processing chip 20 may use all of the pixels of each sub-unit in the panchromatic raw image as the panchromatic large pixels W corresponding to the sub-unit in the following manner: the processing chip 20 first merges the pixel values of all of the pixels in each sub-unit to obtain the pixel values of the panchromatic large pixels W, and then form the panchromatic intermediate image according to the pixel values of the panchromatic large pixels W. Specifically, for each panchromatic large pixel, the processing chip 20 may add all pixel values in the sub-unit including the null pixels N and the panchromatic pixels W, and use the addition result as the pixel value of the panchromatic large pixel W corresponding to the sub-unit, wherein the pixel values of the empty pixels N can be regarded as zero. In such a way, the processing chip 20 can obtain the pixel values of a plurality of panchromatic large pixels W.

After the processing chip 20 obtains the panchromatic intermediate image and the color intermediate image, it can perform fusing processing on the panchromatic intermediate image and the color intermediate image to obtain the second target image.

For example, as shown in FIG. 43, the processing chip 20 first separates the color and luminance of the color intermediate image to obtain a color-luminance-separated image. In the color-luminance-separated image shown in FIG. 43, L represents the luminance, and CLR represents the color. Specifically, assuming that the monochromatic pixel A is the red pixel R, the monochromatic pixel B is the green pixel G, and the monochromatic pixel C is the blue pixel Bu, then: (1) the processing chip 20 can convert the color intermediate image in the RGB space into the color-luminance-separated image in YCrCb space, wherein Y among YCrCb is the luminance L in the color-luminance-separated image, and Cr and Cb among YCrCb are the color CLR in the color-luminance-separated image; (2) the processing chip 20 can also convert the color intermediate image in a form of RGB to the color-luminance-separated image in Lab space, wherein L among Lab is the luminance L in the color-luminance-separated image, and a and b among Lab are the color CLR in the color-luminance-separated image. It should be noted that L+CLR in the color-luminance-separated image shown in FIG. 43 does not mean that the pixel value of each pixel is formed by adding L and CLR, but only means that the pixel value of each pixel is formed by L and CLR.

Subsequently, the processing chip 20 fuses the luminance of the color-luminance-separated image and the luminance of the panchromatic intermediate image. For example, the pixel value of each panchromatic pixel W in the panchromatic intermediate image is the luminance value of each panchromatic pixel. The processing chip 20 can add the L of each pixel in the color-brightness-separated image and the W of the panchromatic pixel at a corresponding position in the panchromatic intermediate image to obtain a pixel value after luminance correction. The processing chip 20 forms a luminance-corrected color-luminance-separated image according to a plurality of luminance-corrected pixel values and then converts the luminance-corrected color-luminance-separated image into a luminance-corrected color image by using color space conversion.

When the monochromatic large pixel A is the red pixel R, the monochromatic large pixel B is the green pixel G, and the monochromatic large pixel C is the blue pixel Bu, the luminance-corrected color image is an image arranged in the Bayer array. The processing chip 20 needs to perform interpolation processing on the luminance-corrected color image, so that the pixel value of each monochromatic large pixel whose luminance has been corrected has three components of R, G, and B at the same time. The processing chip 20 may perform interpolation processing on the luminance-corrected color image to obtain the second target image. For example, a linear interpolation method may be used to obtain the second target image. The linear interpolation process is similar to the interpolation process in the aforementioned step 040, which is not repeated again.

Because the luminance-corrected color image has the first resolution, the second target image is obtained from the luminance-corrected color image through interpolation processing. The processing chip 20 does not perform interpolation processing on the luminance-corrected color image. Therefore, the resolution of the second target image is also the first resolution. Because the second target image is obtained by fusing the luminance of the color intermediate image and the luminance of the panchromatic intermediate image, the second target image has a better imaging effect. When the mode is both the preview mode and the non-low-power-consumption, the second target image is used as the preview image, so that the preview effect of the preview image can be improved. When the mode is both the imaging mode and the low-power-consumption mode, the second target image is used as the image provided to the user. Because the second target image is obtained without interpolation processing, it can reduce the dimension of the camera assembly 40 to a certain extent. The power consumption can meet the use requirements in the low-power-consumption mode. Meanwhile, the luminance of the second target image is brighter, which can meet the user's requirement for the luminance of the target image.

Please refer to FIG. 41 again, in another example, when the target image is the third target image, step 04 includes:

044: performing interpolation processing on the color intermediate image to obtain a color interpolation image having a second resolution, wherein the sub-units corresponding in the color interpolation image are arranged in a Bayer array, and the second resolution is greater than the first resolution; and 045: performing interpolation processing on all monochromatic pixel in the color interpolation image to obtain pixel values of two colors other than the monochrome and output them to obtain a third target image having a second resolution.

Referring to FIG. 33, both steps 044 and 045 may be implemented by the processing chip 20. In other words, the processing chip 20 can be used to perform interpolation processing on the color intermediate image to obtain the color interpolation image having the second resolution, wherein the sub-units corresponding in the color interpolation image are arranged in the Bayer array, and the second resolution is greater than the first resolution. The processing chip 20 can also be used to perform interpolation processing on all of the monochromatic pixels in the color interpolation image to obtain pixel values of two colors other than the monochrome and output them to obtain the third target image having the second resolution.

Figure 44:
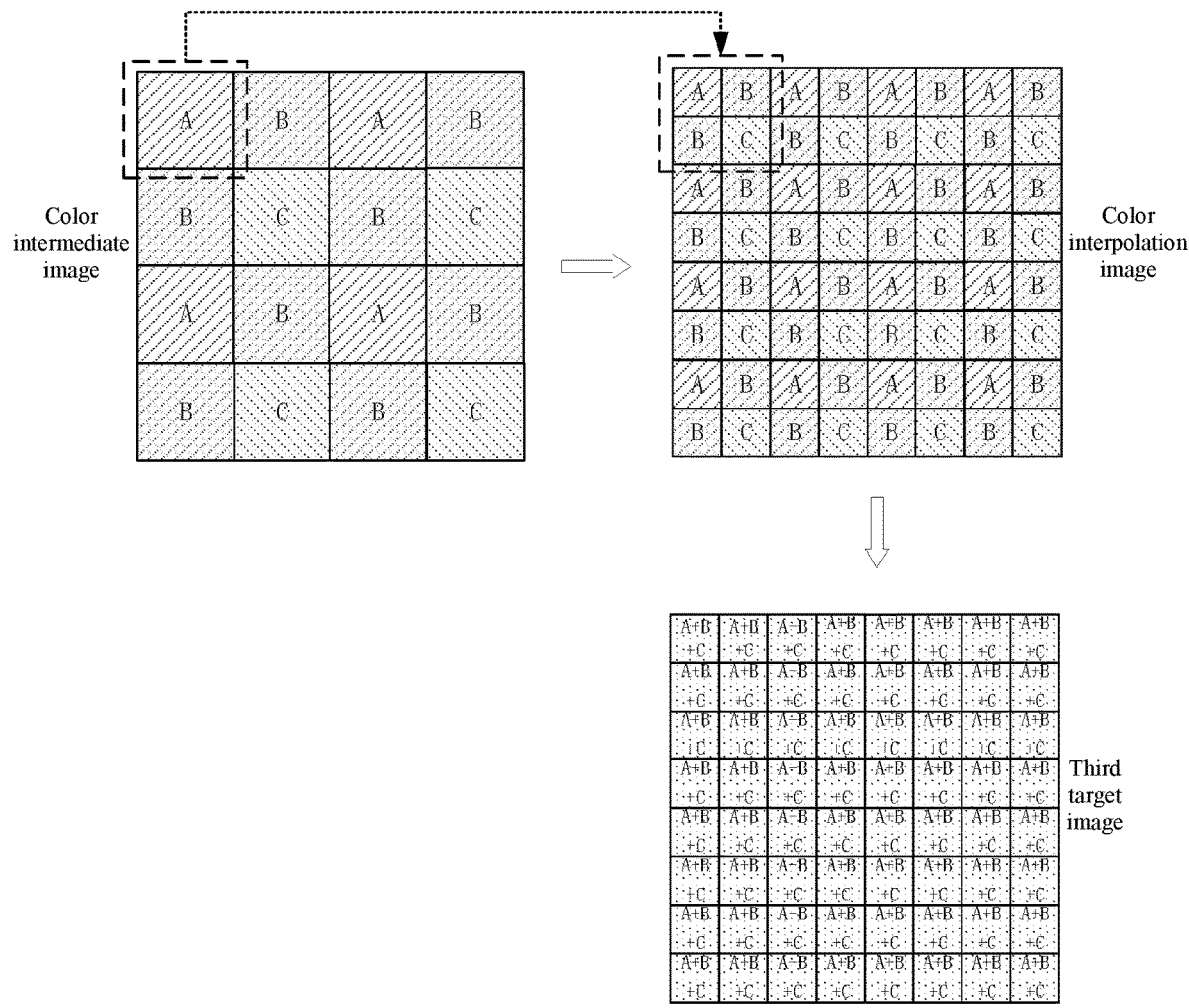
FIG. 44 is a schematic diagram of another optical image acquisition method in the embodiment of the present disclosure.

Specifically, referring to FIG. 44, the processing chip 20 splits each monochromatic large pixel in the color intermediate image into four color pixels, wherein the four color pixels form one sub-unit in the color interpolation image, each sub-unit includes three color pixels, which are one color pixel A, two color pixels B, and one color pixel C, respectively. When the color pixel A is the red pixel R, the color pixel B is the green pixel G, and the color pixel C is the blue pixel Bu, the color pixels in each sub-unit are arranged in the Bayer array. Therefore, the color interpolation image including the plurality of sub-units is an image arranged in the Bayer array. The processing chip 20 can perform interpolation processing on the color interpolation image to obtain the third target image. For example, a linear interpolation method can be used to obtain the second target image. The linear interpolation process is similar to the interpolation process in the aforementioned step 040, which is not repeated again. The third target image is an image obtained through interpolation processing, wherein a resolution of the third target image (i.e., the second resolution) is greater than a resolution of the color intermediate image (i.e., the first resolution). When the mode is both the preview mode and the non-low-power-consumption mode, a clearer preview image can be obtained by using the third target image as the preview image. When the mode is both the imaging mode and the low-power-consumption mode, the third target image is used as the image provided to the user. Because the third target does not need to be fused with the panchromatic intermediate image in the process of forming the third target. The power consumption of the camera assembly 40 can be reduced to a certain extent. Meanwhile, the user's requirement for the definition of the photographed image can be met.

Please refer to FIG. 41 again, in another example, when the target image is the fourth target image, step 03 includes:

032: performing interpolation processing on the panchromatic raw image to acquire pixel values of all pixels in each of the plurality of sub-units to obtain a panchromatic intermediate image having a second resolution;

Step 04 includes:

046: performing interpolation processing on the color intermediate image to obtain a color interpolation image having a second resolution, wherein the sub-units corresponding to the color interpolation image are arranged in a Bayer array, and the second resolution is greater than the first resolution;

047: separating color and luminance of the color interpolation image to obtain a color-luminance-separated image having the second resolution;

048: fusing luminance of the panchromatic interpolation image and luminance of the color-luminance-separated image to obtain a luminance-corrected color image having the second resolution; and 049: perform interpolation processing on all monochromatic pixels in the luminance-corrected color image to obtain pixel values of two colors other than the monochrome, and output them to obtain a fourth target image having the second resolution.

Referring to FIG. 33, step 032, step 046, step 047, step 048, and step 049 can be implemented by the processing chip 20. In other words, the processing chip 20 can be used to perform interpolation processing on the panchromatic raw image to acquire pixel values of all pixels in each of the plurality of sub-units to obtain the panchromatic intermediate image having the second resolution. The processing chip 20 can also be used to perform interpolation processing on the color intermediate image to obtain the color interpolation image having a second resolution, the sub-units corresponding to the color interpolation image are arranged in the Bayer array, and the second resolution is greater than the first resolution. The processing chip 20 can also be used to separate color and luminance of the color interpolation image to obtain the color-luminance-separated image having the second resolution, fuse the luminance of the panchromatic interpolation image and the luminance of the color-luminance-separated image to obtain the luminance-corrected color image having the second resolution, and perform interpolation processing on all of the monochromatic pixels in the luminance-corrected color image to obtain pixel values of two colors other than the monochrome and output them to obtain the fourth target image having the second resolution.

Specifically, the processing chip 20 first performs interpolation processing on the panchromatic raw image having the first resolution to obtain the panchromatic intermediate image having the second resolution. Please refer to FIG. 46, the panchromatic raw image includes a plurality of sub-units, and each of the plurality of sub-units includes two empty pixels N and two panchromatic pixels W. The processing chip 20 needs to replace each empty pixel N in each of the plurality of sub-units with the panchromatic pixel. color pixel W and calculate the pixel value of each panchromatic pixel W located at the position of the empty pixel N after replacement. For each empty pixel N, the processing chip 20 replaces the empty pixel N with the panchromatic pixel W and determines the pixel value of the replaced panchromatic pixel W according to the pixel values of the remaining panchromatic pixels W adjacent to the replaced panchromatic pixel W. Taking the empty pixels $N_{1,8}$ in the panchromatic raw image shown in FIG. 46 ("empty pixel $N_{1,8}$" is the empty pixel N in the first row and the eighth column, from the upper left, which is the same below) as an example, the empty pixel $N_{1,8}$ is replaced with the panchromatic pixel $W_{1,8}$, and the pixels adjacent to the panchromatic pixel $W_{1,8}$ are the panchromatic pixel $W_{1,7}$ and the panchromatic pixel $W_{2,8}$ in the panchromatic raw image. As an example, an average value of the pixel values of the panchromatic pixel $W_{1,7}$ and the pixel values of the panchromatic pixel $W_{2,8}$ may be taken as the pixel value of the panchromatic pixel $W_{1,8}$. Taking the empty pixel $N_{2,3}$ in the panchromatic raw image shown in FIG. 46 as an example, the empty pixel $N_{2,3}$ is replaced with the panchromatic pixel $W_{2,3}$, and the panchromatic pixels adjacent to the panchromatic pixel $W_{2,3}$ are the panchromatic pixels $W_{1,3}$, the panchromatic pixels $W_{2,2}$, the panchromatic pixels $W_{2,4}$, and the panchromatic pixels $W_{3,3}$ in the panchromatic raw image. As an example, the processing chip 20 uses the average value of the pixel value of the panchromatic pixel $W_{1,3}$, the pixel value of the color pixel $W_{2,2}$, the pixel value of the panchromatic pixel $W_{2,4}$, and the pixel value of the panchromatic pixel $W_{3,3}$ as the pixel value of the replaced panchromatic pixel $W_{2,3}$.

After the processing chip 20 obtains the panchromatic intermediate image and the color intermediate image, it can perform fusion processing on the panchromatic intermediate image and the color intermediate image to obtain the fourth target image.

Figure 45:
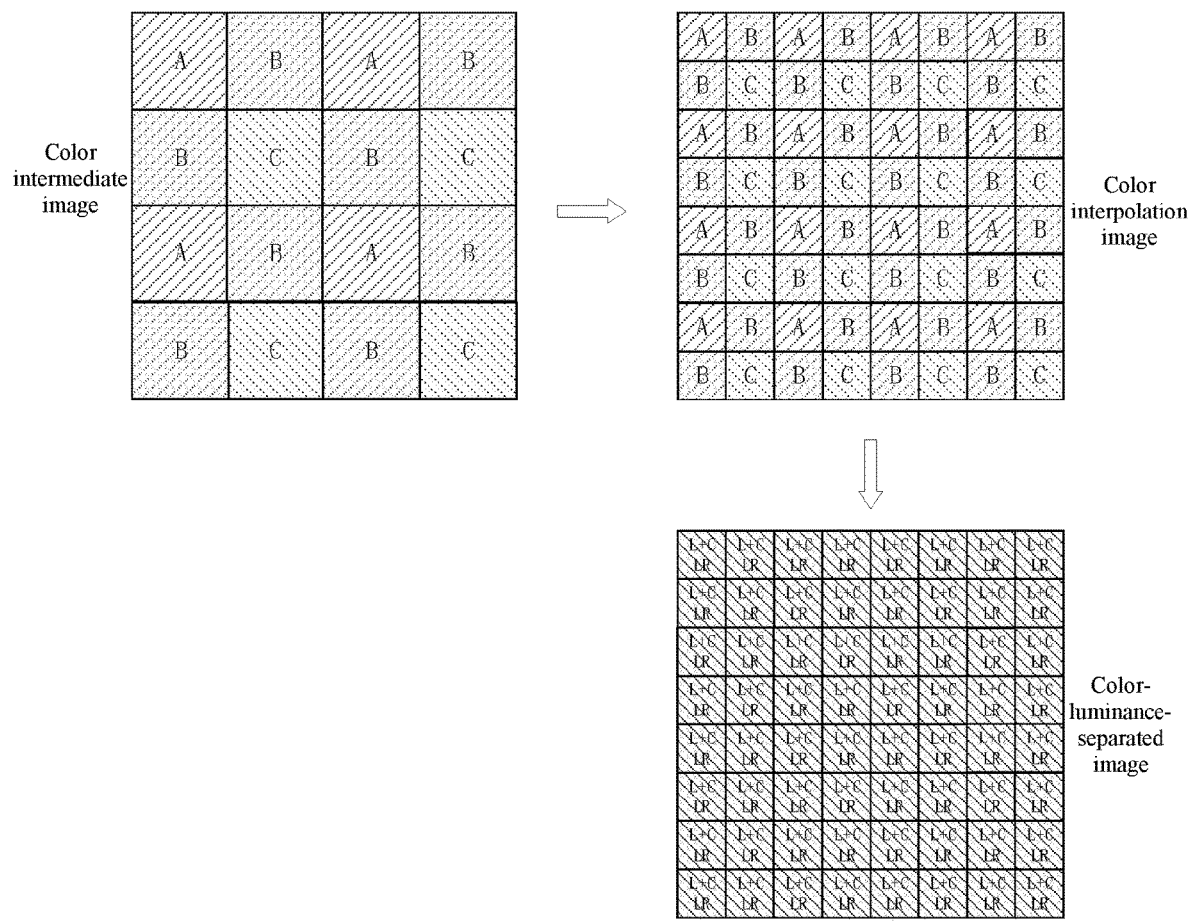
FIG. 45 is a schematic diagram of another optical image acquisition method in the embodiment of the present disclosure.

First, the processing chip 20 may perform interpolation processing on the color intermediate image having the first resolution to obtain the color interpolation image having the second resolution, as shown in FIG. 45. A specific interpolation method is similar to the interpolation method in step 045, which is not repeated here.

Subsequently, as shown in FIG. 45, the processing chip 20 can separate color and luminance of the color interpolation image to obtain a color-luminance-separated image. In the the color-luminance-separated image shown in FIG. 45, L represents luminance, and CLR represents color. Specifically, assuming that the monochromatic pixel A is the red pixel R, the monochromatic pixel B is the green pixel G, and the monochromatic pixel C is the blue pixel Bu, then: (1) the processing chip 20 can convert the color intermediate image in the RGB space into the color-luminance-separated image in YCrCb space, wherein Y among YCrCb is the luminance L in the color-luminance-separated image, and Cr and Cb among YCrCb are the color CLR in the color-luminance-separated image; (2) the processing chip 20 can also convert the color intermediate image in a form of RGB to the color-luminance-separated image in Lab space, wherein L among Lab is the luminance L in the color-luminance-separated image, and a and b among Lab are the color CLR in the color-luminance-separated image. It should be noted that L+CLR in the color-luminance-separated image shown in FIG. 43 does not mean that the pixel value of each pixel is formed by adding L and CLR, but only means that the pixel value of each pixel is formed by L and CLR.

Figure 46:
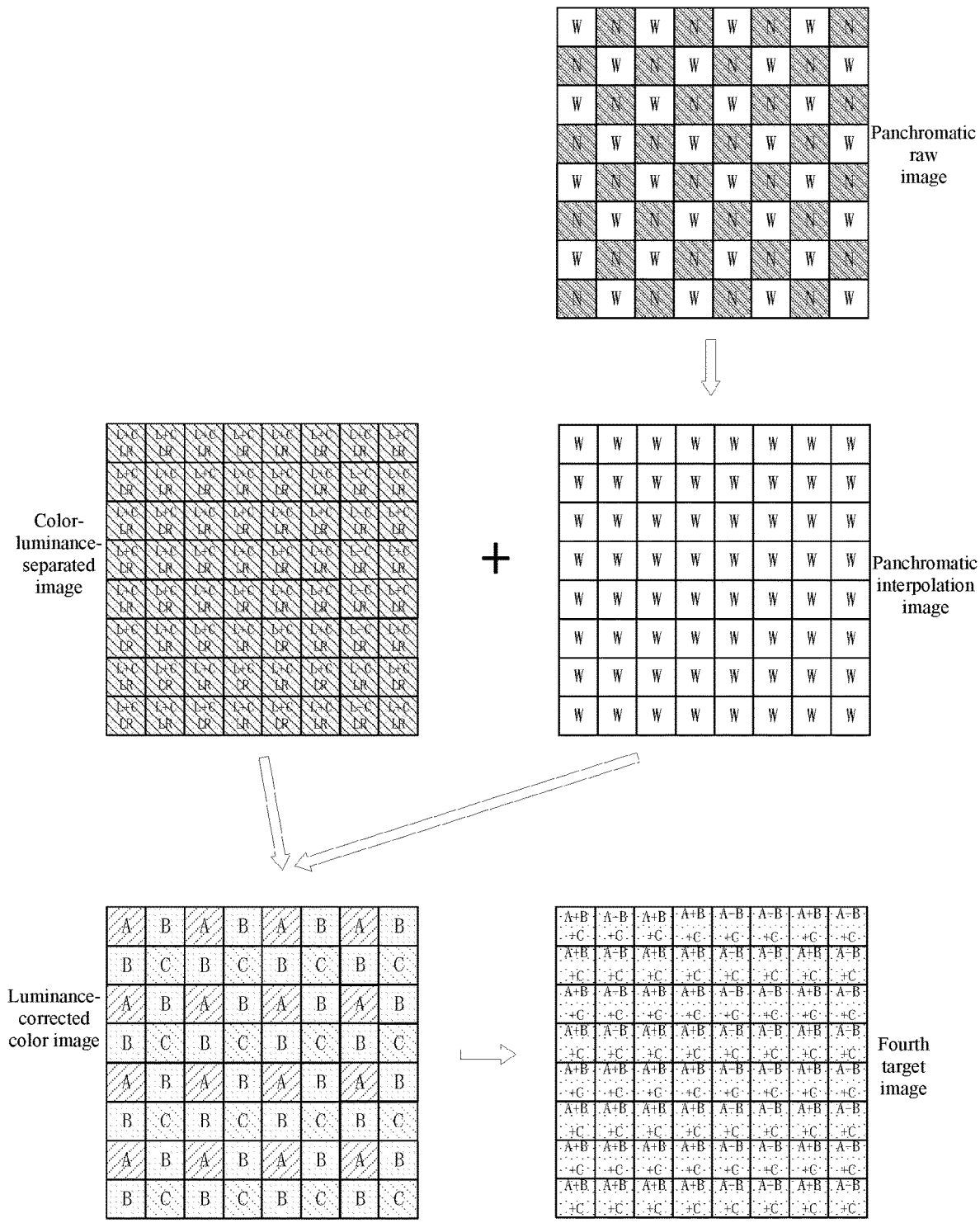
FIG. 46 is a schematic diagram of another optical image acquisition method in the embodiment of the present disclosure.

Subsequently, as shown in FIG. 46, the processing chip 20 may fuse the luminance of the panchromatic interpolation image and the luminance of the color-luminance-separated image. For example, the pixel value of each panchromatic pixel W in the panchromatic intermediate image is the luminance value of each panchromatic pixel. The processing chip 20 can add the L of each pixel in the color-brightness-separated image and the W of the panchromatic pixel at a corresponding position in the panchromatic intermediate image to obtain a pixel value after luminance correction. The processing chip 20 forms a luminance-corrected color-luminance-separated image according to the plurality of luminance-corrected pixel values, and then converts the luminance-corrected color-luminance-separated image into the luminance-corrected color image, wherein the luminance-corrected color image has the second resolution.

When the color pixel A is the red pixel R, the color pixel B is the green pixel G, and the color pixel C is the blue pixel Bu, the luminance-corrected color image is an image arranged in the Bayer array. The processing chip 20 needs to perform interpolation processing on the luminance-corrected color image, so that the pixel value of each monochromatic large pixel whose luminance has been corrected has three components of R, G, and B at the same time. The processing chip 20 can perform interpolation processing on the luminance-corrected color image to obtain the fourth target image. For example, a linear interpolation method can be used to obtain the fourth target image. The linear interpolation process is similar to the interpolation process in the aforementioned step 40, which is not repeated again.

Because the fourth target image is obtained by fusing the luminance of the color intermediate image and the luminance of the panchromatic intermediate image, the fourth target image has a larger resolution, so that the fourth target image has better luminance and definition. When the mode is both the imaging mode and the non-low-power-consumption mode, the fourth target image is used as the image provided to the user, which can meet the user's quality requirements for the photographed image.

In some embodiments, the image acquisition method may further include acquiring ambient luminance. This step may be implemented by the processing chip 20, and a specific implementation method is as described above, which is not be repeated here. When the ambient luminance is greater than the luminance threshold, the first target image or the third target image can be used as the target image; when the ambient luminance is less than or equal to the luminance threshold, the second target image or the fourth target image can be used as the target image. It can be understood that when the ambient luminance is relatively bright, the luminance of the first target image and the second target image obtained only from the color intermediate image is sufficient to meet the user's luminance requirements for the target image, and it is not necessary to fuse the luminance of the panchromatic intermediate image to improve the luminance of the target image. In such a way, not only the computation amount of the processing chip 20 can be reduced, but also the power consumption of the camera assembly 40 can be reduced. When the ambient luminance is low, the luminance of the first target image and the second target image obtained only from the color intermediate image may not meet the user's luminance requirements for the target image. Using the second target image or the fourth target image obtained by fusing the brightness of the panchromatic intermediate image as the target image can improve the luminance of the target image.

Please refer to FIG. 47, the present disclosure also provides a mobile terminal 90. The mobile terminal 90 may be a mobile phone, a tablet computer, a laptop computer, a smart wearable device (such as a smart watch, a smart bracelet, a smart glasses, a smart helmet, etc.), a head-mounted display device, a virtual reality device, and the like, which are not limited to the description here.

The mobile terminal 90 includes an image sensor 50, a processor 60, a memory 70, and a housing 80, wherein the image sensor 50, the processor 60, and the memory 70 are installed in the housing 80. The image sensor 50 is connected to the processor 60, wherein the image sensor 50 may be the image sensor 10 (shown in FIG. 33) described in any one of the foregoing embodiments. The processor 60 can perform the same functions as the processing chip 20 in the camera assembly 40 (shown in FIG. 33), in other words, the processor 60 can implement the functions that can be implemented by the processing chip 20 described in any one of the above embodiments. The memory 70 is connected to the processor 60, and the memory 70 can store data obtained after processing by the processor 60, such as target images and the like. The processor 60 and the image sensor 50 may be mounted on the same substrate, in which the image sensor 50 and the processor 60 may be regarded as a camera assembly 40. Certainly, the processor 60 may also be mounted on a different substrate from the image sensor 50.

In the mobile terminal 90 of the present disclosure, the image sensor 50 can directly output the panchromatic raw image and the color raw image, the subsequent processing for the panchromatic raw image and the color raw image is performed by the processor 60, and the image sensor 50 does not need to perform the operation of fitting the pixel values of the panchromatic pixels W to the pixel values of the color pixels. The computation amount of the image sensor 50 is reduced, and there is no need to add new hardware in the image sensor 50 to support the image sensor 50 to perform image processing, which can simplify the design of the image sensor 50.

In the description of this specification, reference to a description of the terms "one embodiment," "some embodiments," "exemplary embodiment," "example," "specific example," or "some examples," is referred to incorporate particular features, structures, materials, or characteristics described in implementations or examples included in at least one embodiment or example of the present disclosure. In this specification, schematic representations of the above terms do not necessarily refer to the same embodiment or example. Furthermore, the particular features, structures, materials, or characteristics described may be combined in any suitable manner in any one or more embodiments or examples. Furthermore, those skilled in the art may combine and composite the different embodiments or examples and the features of the different embodiments or examples described in this specification, without conflicting with each other.

Description of any process or method in the flowcharts or otherwise described herein may be understood to represent a module, segment, or portion of code including one or more executable instructions for implementing a specified logical function or step of the process, and the scope of the preferred embodiments of the present disclosure includes alternative implementations in which the functions may be performed out of the order shown or discussed, including performing the functions substantially concurrently or in the reverse order depending upon the functions involved, which should be understood by those skilled in the art to which the embodiments of the present disclosure belong.

Although the embodiments of the present disclosure have been shown and described above, it should be understood that the above embodiments are exemplary and should not be construed as limitations to the present disclosure. Those of ordinary skill in the art can make changes, modifications, substitutions, and alterations to the above-described embodiments within the scope of the present disclosure.

What is claimed is:

1. An image sensor, wherein the image sensor comprises: panchromatic pixels; and color pixels, wherein a spectral response of each of the color pixels is narrower than a spectral response of each of the panchromatic pixels, and a full-well capacity of each of the panchromatic pixels is greater than a full-well capacity of each of the color pixels;

wherein each pixel comprises a photoelectric conversion element, and each of the photoelectric conversion elements comprises a substrate and an n-well layer formed in the substrate, and wherein in a light-receiving direction of the image sensor, dimensions of cross-sections of the n-well layer of each of the panchromatic pixels gradually increase, dimensions of the cross-sections of the n-well layer of each of the color pixels gradually decrease, and the dimension of the smallest one of the cross-sections of the n-well layer of each of the panchromatic pixels is greater than or equal to the dimension of the largest one of the cross-sections of the n-well layer of each of the color pixels.

2. The image sensor as claimed in claim 1, wherein a depth of the photoelectric conversion element of each of the panchromatic pixels is equal to a depth of the photoelectric conversion element of each of the color pixels.

3. The image sensor as claimed in claim 1, wherein each of the pixels comprises a microlens, an optical filter, and an isolation layer, wherein in a light-receiving direction of the image sensor, the microlens, the optical filter, the isolation layer, and the photoelectric conversion element are arranged in sequence;

wherein dimensions of a plurality of cross-sections of the isolation layer of each of the panchromatic pixels gradually increase, and the dimensions of the cross-sections of the isolation layer of each of the color pixels gradually decrease, in the light-receiving direction.

4. The image sensor as claimed in claim 1, wherein that the panchromatic pixels and the color pixels form a two-dimensional pixel array, and the two-dimensional pixel array comprises minimum duplication units, wherein in each of the minimum duplication units, the panchromatic pixels are arranged in a first diagonal direction, the color pixels are arranged in a second diagonal direction, and the first diagonal direction is different from the second diagonal direction;

first-exposure time of each of at least two of the panchromatic pixels adjacent in the first diagonal direction is controlled by a first-exposure signal, and second-exposure time of each of at least two of the color pixels adjacent in the second diagonal direction is controlled by a second-exposure signal.

5. The image sensor of claim 4, wherein the first-exposure time is less than the second-exposure time.

6. The image sensor of claim 4, wherein the image sensor further comprises:

a first-exposure control line electrically connected to control terminals of exposure control circuits in at least two of the panchromatic pixels adjacent in the first diagonal direction; and a second-exposure control line electrically connected to control terminals of exposure control circuits in at least two of the color pixels adjacent in the second diagonal direction;

wherein the first-exposure signal is transmitted via the first-exposure control line, and the second-exposure signal is transmitted via the second-exposure control line.

7. A camera assembly, wherein the camera assembly comprises an image sensor comprising:

panchromatic pixels; and color pixels, wherein a spectral response of each of the color pixels is narrower than a spectral response of each of the panchromatic pixels, and a full-well capacity of each of the panchromatic pixels is greater than a full-well capacity of each of the color pixels;

wherein the panchromatic pixels and the color pixels form a two-dimensional pixel array comprising minimum duplication units, each of the minimum duplication units comprises a plurality of sub-units, and each of the plurality of sub-units comprises a plurality of monochromatic pixels and a plurality of panchromatic pixels, and the image sensor is configured to be exposed to obtain a panchromatic raw image and a color raw image; the camera assembly further comprises a processing chip configured to:

process the color raw image to make all pixels of each of the plurality of sub-units be a monochromatic large pixel corresponding to monochrome in the sub-unit, and output pixel values of the monochromatic large pixels to obtain a color intermediate image;

process the panchromatic raw image to obtain a panchromatic intermediate image; and process the color intermediate image and/or the panchromatic intermediate image to obtain a target image.

8. The camera assembly of claim 7, wherein all of the panchromatic pixels and all of the color pixels in the image sensor are simultaneously exposed or time-divisionally exposed;

the image sensor outputs pixel values of all of the panchromatic pixels to obtain the panchromatic raw image and outputs pixel values of all of the color pixels to obtain the color raw image.

9. The camera assembly as claimed in claim 7, wherein each pixel comprises a photoelectric conversion element, and each of the photoelectric conversion elements comprises a substrate and an n-well layer formed in the substrate.

10. The camera assembly as claimed in claim 9, wherein a dimension of a cross-section of the n-well layer of each of the panchromatic pixels is equal to a dimension of a cross-section of the n-well layer of each of the color pixels; and a depth of the n-well layer of each of the panchromatic pixels is greater than a depth of the n-well layer of each of the color pixels.

11. A mobile terminal, wherein the mobile terminal comprises:

a housing; and an image sensor installed in the housing, wherein the image sensor comprises:

panchromatic pixels; and color pixels, wherein a spectral response of each of the color pixels is narrower than a spectral response of each of the panchromatic pixels, and a full-well capacity of each of the panchromatic pixels is greater than a full-well capacity of each of the color pixels;

wherein the panchromatic pixels and the color pixels form a two-dimensional pixel array comprising minimum duplication units, each of the minimum duplication units comprises a plurality of sub-units, and each of the plurality of sub-units comprises a plurality of monochromatic pixels and a plurality of panchromatic pixels, and the image sensor is configured to be exposed to obtain a panchromatic raw image and a color raw image; the mobile terminal further comprises a processor configured to:

process the color raw image to make all pixels of each of the plurality of sub-units be a monochromatic large pixel corresponding to monochrome in the sub-unit, and output pixel values of the monochromatic large pixels to obtain a color intermediate image;

process the panchromatic raw image to obtain a panchromatic intermediate image; and process the color intermediate image and/or the panchromatic intermediate image to obtain a target image.

12. The mobile terminal of claim 11, wherein all of the panchromatic pixels and all of the color pixels in the image sensor are simultaneously exposed or time-divisionally exposed;

the image sensor outputs pixel values of all of the panchromatic pixels to obtain the panchromatic raw image and outputs pixel values of all of the color pixels to obtain the color raw image.

13. The mobile terminal as claimed in claim 11, wherein each pixel comprises a photoelectric conversion element, and each of the photoelectric conversion elements comprises a substrate and an n-well layer formed in the substrate.

* * * * *